United States Patent
Kawashima et al.

(10) Patent No.: US 9,958,576 B2
(45) Date of Patent: May 1, 2018

(54) NEAR INFRARED RAY ABSORBENT COMPOSITION, NEAR INFRARED RAY CUT FILTER, MANUFACTURING METHOD OF NEAR INFRARED RAY CUT FILTER, SOLID IMAGE PICKUP ELEMENT, CAMERA MODULE

(71) Applicant: FUJIFILM Corporation, Tokyo (JP)

(72) Inventors: Takashi Kawashima, Haibara-gun (JP); Keisuke Arimura, Haibara-gun (JP)

(73) Assignee: FUJIFILM Corporation, Tokyo (JP)

(*) Notice: Subject to any disclaimer, the term of this patent is extended or adjusted under 35 U.S.C. 154(b) by 0 days. days.

(21) Appl. No.: 15/389,546

(22) Filed: Dec. 23, 2016

(65) Prior Publication Data

US 2017/0102483 A1    Apr. 13, 2017

Related U.S. Application Data

(63) Continuation of application No. PCT/JP2015/068642, filed on Jun. 29, 2015.

(30) Foreign Application Priority Data

Jun. 30, 2014 (JP) ................. 2014-134257

(51) Int. Cl.
*G02B 1/04* (2006.01)
*G02B 5/22* (2006.01)
(Continued)

(52) U.S. Cl.
CPC .................. *G02B 1/04* (2013.01); *C08K 5/56* (2013.01); *G02B 5/208* (2013.01); *G02B 5/22* (2013.01);
(Continued)

(58) Field of Classification Search
CPC . G02B 1/04; G02B 5/22; G02B 5/208; G02B 5/281; G02B 5/201; G02B 3/0012;
(Continued)

(56) References Cited

U.S. PATENT DOCUMENTS 6,255,031 B1 * 7/2001 Yao .................. B32B 17/10018
430/270.1
7,084,472 B2    8/2006 Fukuyoshi et al.
(Continued)

FOREIGN PATENT DOCUMENTS

JP    2005-044573 A    2/2005
JP    2006-010759 A    1/2006
(Continued)

OTHER PUBLICATIONS

International Search Report of PCT/JP2015/068642, dated Sep. 15, 2015. [PCT/ISA/210].
(Continued)

*Primary Examiner* — Pritham Prabhakher
(74) *Attorney, Agent, or Firm* — Sughrue Mion, PLLC

(57) ABSTRACT

Provided are a near infrared ray absorbent composition which can form a cured film having excellent heat resistance while maintaining high near infrared ray shielding properties, and a near infrared ray cut filter, a manufacturing method of a near infrared ray cut filter, a solid image pickup element, and a camera module using the near infrared ray absorbent composition. The near infrared ray absorbent composition contains a compound having a partial structure represented by M-X, and a near infrared ray absorbent compound, and a content of the compound having a partial structure represented by M-X is greater than or equal to 15 mass % with respect to a total solid content of the near infrared ray absorbent composition. Here, M is an atom selected from Si, Ti, Zr, and Al, X is one type selected from a hydroxy group, an alkoxy group, an acyloxy group, a phosphoryloxy group, a sulfonyloxy group, an amino group, an oxime group, and $O=C(R^a)(R^b)$, $R^a$ and $R^b$ each independently represent a monovalent organic group, and in a case in which X is $O=C(R^a)(R^b)$, X is bonded to M by an unshared electron pair of an oxygen atom of a carbonyl group.

10 Claims, 2 Drawing Sheets

(51) Int. Cl.
*C08K 5/56* (2006.01)
*G02B 5/20* (2006.01)
*H04N 5/238* (2006.01)
*H01L 27/146* (2006.01)
*H04N 5/225* (2006.01)

(52) U.S. Cl.
CPC .. *H01L 27/14618* (2013.01); *H01L 27/14625* (2013.01); *H04N 5/2257* (2013.01); *H04N 5/238* (2013.01)

(58) Field of Classification Search
CPC .... G02B 3/0056; G02B 3/0018; H04N 5/238; H04N 5/2257; H04N 5/335; C08K 5/56; H01L 27/14625; H01L 27/14618; H01L 27/14621; H01L 27/14627; H01L 27/14685; C08L 25/06; C08L 33/26; C08L 33/08; C08L 33/10
USPC .......................................................... 348/342
See application file for complete search history.

(56) References Cited

U.S. PATENT DOCUMENTS

| | | | |
|---|---|---|---|
| 9,570,490 B2* | 2/2017 | Kakiuchi | G02B 5/208 |
| 9,664,830 B2* | 5/2017 | Hasegawa | G02B 5/281 |
| 2004/0185588 A1 | 9/2004 | Fukuyoshi et al. | |
| 2007/0293606 A1* | 12/2007 | Yamada | C08G 64/0208 |
| | | | 524/88 |
| 2008/0230123 A1* | 9/2008 | Mitsui | C09B 23/0066 |
| | | | 136/263 |
| 2008/0308149 A1* | 12/2008 | Nomura | C07D 209/12 |
| | | | 136/256 |
| 2012/0199727 A1* | 8/2012 | Kubota | G03F 7/105 |
| | | | 250/214.1 |
| 2013/0015547 A1* | 1/2013 | Hamano | H01L 27/14643 |
| | | | 257/436 |
| 2013/0295496 A1* | 11/2013 | Tanaka | G03G 5/0525 |
| | | | 430/56 |
| 2014/0055652 A1 | 2/2014 | Hasegawa et al. | |
| 2015/0031067 A1* | 1/2015 | Pang | G01N 33/84 |
| | | | 435/29 |

FOREIGN PATENT DOCUMENTS

| | | |
|---|---|---|
| JP | 2008-091535 A | 4/2008 |
| JP | 2013-019991 A | 1/2013 |
| JP | 2013-253224 A | 12/2013 |
| JP | 2014-063144 A | 4/2014 |
| WO | 2004/006336 A1 | 1/2004 |
| WO | 2013/168824 A1 | 11/2013 |

OTHER PUBLICATIONS

Written Opinion of the International Searching Authority for PCT/JP2015/068642 dated Sep. 15, 2015.
International Preliminary Report on Patentability issued from the International Bureau in counterpart International Application No. PCT/JP2015/068642, dated Jan. 12, 2017.
Office Action dated Sep. 26, 2017 from the Japanese Patent Office in counterpart Japanese Application No. 2016-531357.

* cited by examiner

NEAR INFRARED RAY ABSORBENT COMPOSITION, NEAR INFRARED RAY CUT FILTER, MANUFACTURING METHOD OF NEAR INFRARED RAY CUT FILTER, SOLID IMAGE PICKUP ELEMENT, CAMERA MODULE

CROSS-REFERENCE TO RELATED APPLICATIONS

This application is a Continuation of PCT International Application No. PCT/JP2015/068642 filed on Jun. 29, 2015, which claims priority under 35 U.S.C § 119(a) to Japanese Patent Application No. 2014-134257 filed on Jun. 30, 2014. Each of the above application(s) is hereby expressly incorporated by reference, in its entirety, into the present application.

BACKGROUND OF THE INVENTION

1. Field of the Invention

The present invention relates to a near infrared ray absorbent composition, a near infrared ray cut filter, a manufacturing method of a near infrared ray cut filter, a solid image pickup element, and a camera module.

2. Description of the Related Art

A CCD image sensor or a CMOS image sensor which is a solid image pickup element is used in a video camera, a digital still camera, a mobile phone with a camera function, and the like. In order to use a silicon photodiode having sensitivity with respect to a near infrared ray in a light receiving section of the solid image pickup element, it is necessary to perform visual sensitivity correction, and there are many cases of using a near infrared ray cut filter.

In JP2014-63144A, a near infrared ray absorbent composition is disclosed in which a content of a near infrared ray absorption dye is 0.2 to 10 parts by mass, and contents of a silane coupling agent and/or an oligomer thereof are 0.1 to 30 parts by mass, with respect to 100 parts by mass of a transparent resin.

In JP2013-19991A, a near infrared ray absorbent composition is disclosed in which a near infrared ray absorption dye formed of a diimmonium salt, a silane coupling agent, and a pressure sensitive adhesive are contained.

SUMMARY OF THE INVENTION

However, in the near infrared ray absorbent composition disclosed JP2014-63144A and JP2013-19991A, heat resistance was insufficient.

The present invention has been made in order to solve such a problem, and an object of present invention is to provide a near infrared ray absorbent composition which can form a cured film having excellent heat resistance while maintaining high near infrared ray shielding properties, and a near infrared ray cut filter, a manufacturing method of a near infrared ray cut filter, a solid image pickup element, and a camera module using the near infrared ray absorbent composition.

As a result of intensive studies of the present inventors, it has been found that a near infrared ray absorbent composition containing a compound having a partial structure represented by M-X and a near infrared ray absorbent compound can form a film having excellent heat resistance and high near infrared ray shielding properties, and thus, the present invention has been completed. The present invention provides the followings.

<1> A near infrared ray absorbent composition, containing: a compound having a partial structure represented by M-X; and a near infrared ray absorbent compound, in which a content of the compound having a partial structure represented by M-X is greater than or equal to 15 mass % with respect to a total solid content of the near infrared ray absorbent composition, and here, M is an atom selected from Si, Ti, Zr, and Al, X is one type selected from a hydroxy group, an alkoxy group, an acyloxy group, a phosphoryloxy group, a sulfonyloxy group, an amino group, an oxime group, and O=C($R^a$)($R^b$), $R^a$ and $R^b$ each independently represent a monovalent organic group, and in a case in which X is O=C($R^a$)($R^b$), X is bonded to M by an unshared electron pair of an oxygen atom of a carbonyl group.

<2> The near infrared ray absorbent composition according to <1>, in which in the compound having a partial structure represented by M-X, M is Si.

<3> The near infrared ray absorbent composition according to <1> or <2>, in which in the compound having a partial structure represented by M-X, X is an alkoxy group.

<4> The near infrared ray absorbent composition according to any one of <1> to <3>, in which the compound having a partial structure represented by M-X is an acrylic resin, an acrylamide resin, or a styrene resin.

<5> The near infrared ray absorbent composition according to any one of <1> to <4>, in which a weight-average molecular weight of the compound having a partial structure represented by M-X is 500 to 300,000.

<6> The near infrared ray absorbent composition according to any one of <1> to <5>, in which the near infrared ray absorbent compound is a copper compound.

<7> A near infrared ray cut filter obtained by using the near infrared ray absorbent composition according to any one of <1> to <6>.

<8> A manufacturing method of a near infrared ray cut filter, comprising: applying the near infrared ray absorbent composition according to any one of <1> to <6> on a solid image pickup element on a light receiving side.

<9> A solid image pickup element, comprising: a near infrared ray cut filter obtained by using the near infrared ray absorbent composition according to any one of <1> to <6>.

<10> A camera module, comprising: a solid image pickup element; and a near infrared ray cut filter disposed on the solid image pickup element on a light receiving side, in which the near infrared ray cut filter is the near infrared ray cut filter according to <7>.

According to the present invention, it is possible to provide a near infrared ray absorbent composition which can form a cured film having excellent heat resistance while maintaining high near infrared ray shielding properties. Further, it is also possible to improve moisture resistance. In addition, it is possible to provide a near infrared ray cut filter, a manufacturing method of a near infrared ray cut filter, a solid image pickup element, and a camera module using such a near infrared ray absorbent composition.

DESCRIPTION OF THE PREFERRED EMBODIMENTS

Figure 1:
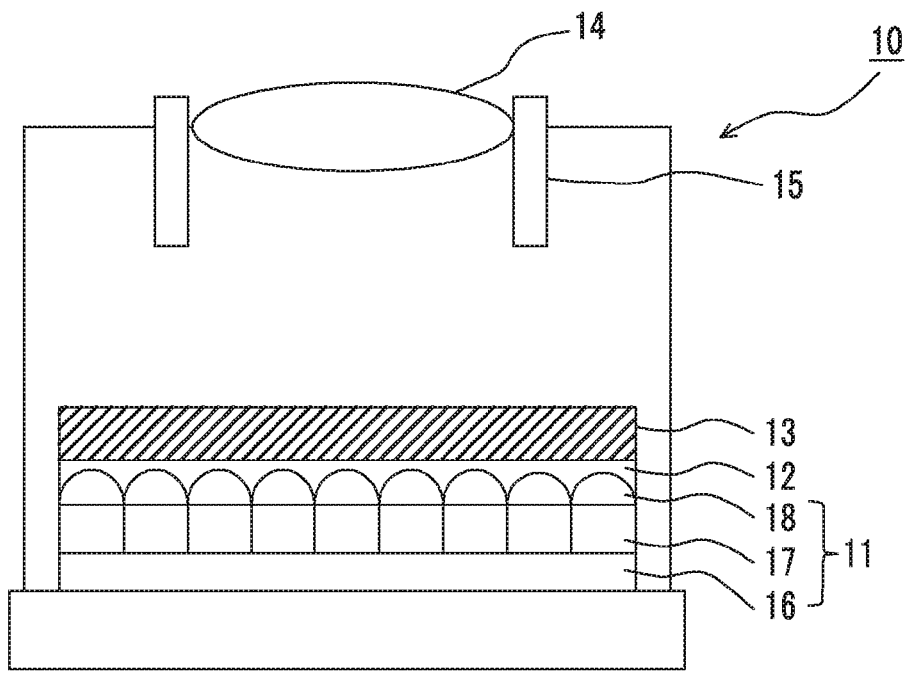
FIG. 1 is a schematic sectional view illustrating a configuration of a camera module according to an embodiment of the present invention, which includes a near infrared ray cut filter.

Hereinafter, the contents of the present invention will be described in detail. Further, herein, "to" is used as the meaning which includes numerical values before and after "to" as the lower limit value and the upper limit value.

Herein, "(meth)acrylate" indicates acrylate and methacrylate, "(meth)acryl" indicates acryl and methacryl, and "(meth)acryloyl" indicates acryloyl and methacryloyl.

Herein, in the description of a group (an atomic group), a description not indicating substitution and non-substitution includes a group (an atomic group) having a substituent along with a group (an atomic group) not having a substituent.

Herein, in Chemical Formula, Me indicates a methyl group, Et indicates an ethyl group, Pr indicates a propyl group, Bu indicates a butyl group, and Ph indicates a phenyl group.

Herein, a near infrared ray indicates light (an electromagnetic wave) in a wavelength range of 700 to 2,500 nm.

Herein, the total solid content indicates the total mass of components obtained by removing a solvent from the total composition of a composition.

Herein, a solid content indicates a solid content at 25° C.

Herein, a weight-average molecular weight is defined as a value in terms of polystyrene of GPC measurement. Herein, a weight-average molecular weight (Mw) and a number average molecular weight (Mn), for example, can be obtained by using HLC-8220 (manufactured by TOSOH CORPORATION), by using TSKgel Super AWM-H (manufactured by TOSOH CORPORATION, 6.0 mmID×15.0 cm) as a column, and by using a solution of lithium bromide NMP (N-methyl pyrrolidinone) of 10 mmol/L as an eluant.

<Near Infrared Ray Absorbent Composition>

A near infrared ray absorbent composition of the present invention contains a compound having a partial structure represented by M-X, and a near infrared ray absorbent compound.

By using the near infrared ray absorbent composition of the present invention, it is possible to obtain a cured film (a near infrared ray cut filter) having excellent heat resistance while maintaining high near infrared ray shielding properties.

The reason of obtaining such an effect is not certain, but is assumed as follows.

A cured material obtained by the compound having a partial structure represented by M-X is crosslinked by a strong chemical bond, and thus, has excellent heat resistance. In addition, the cured material has a mutual interaction with respect to the near infrared ray absorbent compound (in particular, a copper compound), and thus, can suppress a decrease in properties of the near infrared ray absorbent compound. For this reason, it is considered that it is possible to form a cured film having excellent heat resistance while maintaining high near infrared ray shielding properties.

Hereinafter, each component of the near infrared ray absorbent composition of the present invention will be described.

<<Compound Having Partial Structure Represented by M-X>>

The near infrared ray absorbent composition of the present invention contains the compound having a partial structure represented by M-X.

M is an atom selected from Si, Ti, Zr, and Al, Si, Ti, and Zr are preferable, and Si is more preferable.

X is one type selected from a hydroxy group, an alkoxy group, an acyloxy group, a phosphoryloxy group, a sulfonyloxy group, an amino group, an oxime group, and O═C($R^a$)($R^b$), the alkoxy group, the acyloxy group, and the oxime group are preferable, and the alkoxy group is more preferable. Furthermore, in a case where X is O═C($R^a$)($R^b$), X is bonded to M by an unshared electron pair of an oxygen atom of a carbonyl group (—CO—). $R^a$ and $R^b$ each independently represent a monovalent organic group.

It is preferable that the partial structure represented by M-X, in particular, is a combination in which M is Si, and X is an alkoxy group. According to such a combination, the near infrared ray absorbent composition has moderate reactivity, and thus, it is possible to make preservation stability of the near infrared ray absorbent composition excellent. Further, a film having more excellent heat resistance is easily formed.

The number of carbon atoms of the alkoxy group is preferably 1 to 20, is more preferably 1 to 10, is even more preferably 1 to 5, and is particularly preferably 1 and 2. The alkoxy group may be any one of a linear alkoxy group, a branched alkoxy group, and a cyclic alkoxy group, the linear alkoxy group or the branched alkoxy group is preferable, and the linear alkoxy group is more preferable. The alkoxy group may be a non-substituted alkoxy group, or may be a substituent alkoxy group, and the non-substituted alkoxy group is preferable. Examples of a substituent include a halogen atom (preferably a fluorine atom), a polymerizable group (for example, a vinyl group, a (meth)acryloyl group, a styryl group, an epoxy group, an oxetane group, and the like), an amino group, an isocyanate group, an isocyanurate group, a ureido group, a mercapto group, a sulfide group, a sulfo group, a carboxyl group, a hydroxyl group, and the like.

Examples of the acyloxy group include a substituted alkyl carbonyloxy group or a non-substituted alkyl carbonyloxy group having 2 to 30 carbon atoms, a substituted aryl carbonyloxy group or a non-substituted aryl carbonyloxy group having 6 to 30 carbon atoms, and the like. Examples of the acyloxy group include a formyloxy group, an acetyloxy group, a pivaloyloxy group, a stearoyloxy, a benzoyloxy group, a p-methoxy phenyl carbonyloxy group, and the like. Examples of a substituent include the substituents described above.

The number of carbon atoms of the oxime group is preferably 1 to 20, is more preferably 1 to 10, and is even more preferably 1 to 5. Examples of the oxime group include an ethyl methyl ketoxime group, and the like.

Examples of the amino group include an amino group, a substituted alkyl amino group or a non-substituted alkyl amino group having 1 to 30 carbon atoms, a substituted aryl amino group or a non-substituted aryl amino group having 6 to 30 carbon atoms, a heterocyclic amino group having 0 to 30 carbon atoms, and the like. Examples of the amino group include amino, methyl amino, dimethyl amino, anilino, N-methyl-anilino, diphenyl amino, N-1,3,5-triazin-2-yl amino, and the like. Examples of a substituent include the substituents described above.

Examples of the monovalent organic group represented by $R^a$ and $R^b$ include an alkyl group, an aryl group, a group represented by —$R^{101}$—$COR^{102}$, and the like.

The number of carbon atoms of the alkyl group is preferably 1 to 20, and is more preferably 1 to 10. The alkyl group may be any one of a linear alkyl group, a branched alkyl group, and a cyclic alkyl group. The alkyl group may be a non-substituted alkyl group, or may have the substituents described above.

The number of carbon atoms of the aryl group is preferably 6 to 20, and is more preferably 6 to 12. The aryl group may be a non-substituted aryl group, or may have the substituents described above.

In the group represented by —$R^{101}$—$COR^{102}$, $R^{101}$ represents an arylene group, and $R^{102}$ represents an alkyl group or an aryl group.

The number of carbon atoms of the arylene group represented by $R^{101}$ is preferably 1 to 20, is more preferably 1 to 10. The arylene group may be any one of a linear arylene group, a branched arylene group, and a cyclic arylene group. The arylene group may be a non-substituted arylene group, or may have the substituents described above.

Examples of the alkyl group and the aryl group represented by $R^{102}$ include the groups described in $R^a$ and $R^b$, and the preferred ranges thereof are identical to those of the groups described in $R^a$ and $R^b$.

The compound having a partial structure represented by M-X may be any one of a low molecular compound and a polymer, the polymer is preferable from the reason of easily forming a film having more excellent heat resistance.

In the compound having a partial structure represented by M-X, it is preferable that the molecular weight of the low molecular compound is 100 to 1,000. The upper limit is preferably less than or equal to 800, and is more preferably less than or equal to 700. Furthermore, the molecular weight is a theoretical value obtained from a structural formula.

In the compound having a partial structure represented by M-X, it is preferable that the weight-average molecular weight of a polymer type compound is 500 to 300,000. The lower limit is preferably greater than or equal to 1,000, and is more preferably greater than or equal to 2,000. The upper limit is preferably less than or equal to 250,000, and is more preferably less than or equal to 200,000.

<<<Low Molecular Compound>>>

In the compound having a partial structure represented by M-X, examples of the low molecular compound include a compound represented by (MX1) described below.

$$M\text{-}(X^1)_m \quad\quad (MX1)$$

M represents an atom selected from Si, Ti, Zr, and Al, $X^1$ represents a substituent or a ligand, at least one of m $X^1$'s is one type selected from a hydroxy group, an alkoxy group, an acyloxy group, a phosphoryloxy group, a sulfonyloxy group, an amino group, an oxime group, and O=C($R^a$)($R^b$), $X^1$'s may form a ring by being bonded to each other, and m represents the number of bonding hands between M and $X^1$.

M is an atom selected from Si, Ti, Zr, and Al, Si, Ti, and Zr are preferable, and Si is more preferable.

$X^1$ represents a substituent or a ligand, at least one of m $X^1$'s is one type selected from a hydroxy group, an alkoxy group, an acyloxy group, a phosphoryloxy group, a sulfonyloxy group, an amino group, an oxime group, and O=C($R^a$)($R^b$), and it is preferable that at least one of m $X^1$'s is one type selected from an alkoxy group, an acyloxy group, and an oxime group, it is more preferable that at least one of m $X^1$'s is an alkoxy group, and it is even more preferable that all $X^1$'s are alkoxy groups.

In the substituent and the ligand, the hydroxy group, the alkoxy group, the acyloxy group, the phosphoryloxy group, the sulfonyloxy group, the amino group, the oxime group, and O=C($R^a$)($R^b$) are identical to those described above, and the preferred ranges thereof are identical to those described above.

A hydrocarbon group is preferable as a substituent other than the hydroxy group, the alkoxy group, the acyloxy group, the phosphoryloxy group, the sulfonyloxy group, the amino group, and the oxime group. Examples of the hydrocarbon group include an alkyl group, an alkenyl group, an aryl group, and the like.

The alkyl group may be any one of a linear alkyl group, a branched alkyl group, and a cyclic alkyl group. The number of carbon atoms of the linear alkyl group is preferably 1 to 20, is more preferably 1 to 12, and is even more preferably 1 to 8. The number of carbon atoms of the branched alkyl group is preferably 3 to 20, is more preferably 3 to 12, and is even more preferably 3 to 8. The cyclic alkyl group may be any one of a monocyclic alkyl group and a polycyclic alkyl group. The number of carbon atoms of the cyclic alkyl group is preferably 3 to 20, is more preferably 4 to 10, and is even more preferably 6 to 10.

The number of carbon atoms of the alkenyl group is preferably 2 to 10, is more preferably 2 to 8, and is even more preferably 2 to 4.

The number of carbon atoms of the aryl group is preferably 6 to 18, is more preferably 6 to 14, and is even more preferably 6 to 10.

The hydrocarbon group may have a substituent, and examples of the substituent include an alkyl group, a halogen atom (preferably a fluorine atom), a polymerizable group (for example, a vinyl group, a (meth)acryloyl group, a styryl group, an epoxy group, an oxetane group, and the like), an amino group, an isocyanate group, an isocyanurate group, a ureido group, a mercapto group, a sulfide group, a sulfo group, a carboxyl group, a hydroxyl group, an alkoxy group, and the like.

Examples of a compound in which M is Si include methyl trimethoxy silane, dimethyl dimethoxy silane, phenyl trimethoxy silane, methyl triethoxy silane, dimethyl diethoxy silane, phenyl triethoxy silane, n-propyl trimethoxy silane, n-propyl triethoxy silane, hexyl trimethoxy silane, hexyl triethoxy silane, octyl triethoxy silane, decyl trimethoxy silane, 1,6-bis(trimethoxy silyl) hexane, trifluoropropyl trimethoxy silane, hexamethyl disilazane, vinyl trimethoxy silane, vinyl triethoxy silane, 2-(3,4-epoxy cyclohexyl) ethyl trimethoxy silane, 3-glycidoxy propyl methyl dimethoxy silane, 3-glycidoxy propyl trimethoxy silane, 3-glycidoxy propyl methyl diethoxy silane, 3-glycidoxy propyl triethoxy silane, p-styryl trimethoxy silane, 3-methacryloxy propyl methyl dimethoxy silane, 3-methacryloxy propyl trimethoxy silane, 3-methacryloxy propyl methyl diethoxy silane, 3-methacryloxy propyl triethoxy silane, 3-acryloxy propyl trimethoxy silane, N-2-(amino ethyl)-3-amino propyl methyl dimethoxy silane, N-2-(amino ethyl)-3-amino propyl trimethoxy silane, 3-amino propyl trimethoxy silane, 3-amino propyl triethoxy silane, 3-triethoxy silyl-N-(1,3-dimethyl-butylidene) propyl amine, N-phenyl-3-amino propyl trimethoxy silane, a hydrochloride of N-(vinyl benzyl)-2-amino ethyl-3-amino propyl trimethoxy silane, tris-(trimethoxy silyl propyl) isocyanurate, 3-ureidopropyl triethoxy silane, 3-mercapto propyl methyl dimethoxy silane, 3-mercapto propyl trimethoxy silane, bis(triethoxy silyl propyl) tetrasulfide, 3-isocyanate propyl triethoxy silane, and the like.

Examples of a commercially available product include KBM-13, KBM-22, KBM-103, KBE-13, KBE-22, KBE-103, KBM-3033, KBE-3033, KBM-3063, KBE-3063, KBE-3083, KBM-3103, KBM-3066, KBM-7103, SZ-31, KPN-3504, KBM-1003, KBE-1003, KBM-303, KBM-402, KBM-403, KBE-402, KBE-403, KBM-1403, KBM-502, KBM-503, KBE-502, KBE-503, KBM-5103, KBM-602, KBM-603, KBM-903, KBE-903, KBE-9103, KBM-573, KBM-575, KBM-9659, KBE-585, KBM-802, KBM-803, KBE-846, KBE-9007, and the like, which are manufactured by Shin-Etsu Chemical Co., Ltd.

Examples of a compound in which M is Ti include tetraisopropyl titanate, tetranormal butyl titanate, a butyl titanate dimer, tetraoctyl titanate, titanium diisopropoxy bis(acetyl acetonate), titanium tetraacetyl acetonate, titanium diisopropoxy bis(ethyl acetoacetate), a titanium phosphate compound, titanium di-2-ethyl hexoxy bis(2-ethyl-3-hydroxy hexoxide), titanium diisopropoxy bis(ethyl acetoacetate), a titanium lactate ammonium salt, titanium lactate, titanium diisopropoxy bis(triethanol aminate), tertiary amyl titanate, tetratertiary butyl titanate, tetrastearyl titanate, titanium-1,3-propane dioxy bis(ethyl acetoacetate), a titanium dodecyl benzene sulfonate compound, titanium isostearate, titanium diethanol aminate, titanium aminoethyl aminoethanolate, and the like. Examples of a commercially available product include ORGATIX series (for example, TA-10, TA-21, TA-23, TA-30, TC-100, TC-401, TC-710, TC-1040, TC-201, TC-750, TC-300, TC-310, TC-315, TC-400, TA-60, TA-80, TA-90, TC-120, TC-220, TC-730, TC-810, TC-800, TC-500, TC-510, and the like) which are manufactured by Matsumoto Fine Chemical Co. Ltd., and PLENACT series (for example, TTS, 46B, 55, 41B, 38S, 138S, 238S, 338X, 44, 9SA, ET, and the like) which are manufactured by Ajinomoto Fine-Techno Co., Inc.

Examples of a compound in which M is Zr include zirconium tetranormal propoxide, zirconium tetranormal butoxide, zirconium tetraacetyl acetonate, zirconium tributoxy monoacetyl acetonate, zirconium dibutoxy bis(ethyl acetoacetate), and the like. Examples of a commercially available product include ORGATIX series (for example, ZA-45, ZA-65, ZC-150, ZC-540, ZC-700, ZC-580, ZC-200, ZC-320, ZC-126, ZC-300, and the like) which are manufactured by Matsumoto Fine Chemical Co. Ltd.

Examples of a compound in which M is Al include alkyl acetoacetate aluminum diisopropylate, and the like. Examples of a commercially available product include PLENACT AL-M and the like which are manufactured by Ajinomoto Fine-Techno Co., Inc.

<<<Polymer Type Compound>>>

In the compound having a partial structure represented by M-X, examples of the polymer type compound include an acrylic resin, an acrylamide resin, a styrene resin, polysiloxane, and the like. Among them, the acrylic resin, the acrylamide resin, or the styrene resin is preferable from the reason of easily improving coating properties and easily adjusting a coating liquid viscosity.

Specific examples of the polymer type compound include a polymer having one type selected from a repeating unit represented by (MX2-1) described below, a repeating unit represented by (MX2-2) described below, and a repeating unit represented by (MX2-3) described below, and the like.

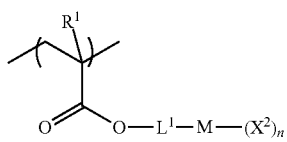

(MX2-1)

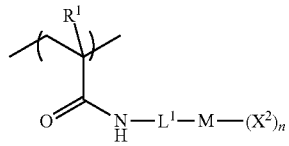

(MX2-2)

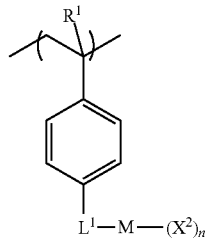

(MX2-3)

M represents an atom selected from Si, Ti, Zr, and Al, $X^2$ represents a substituent or a ligand, at least one of n $X^2$'s is one type selected from a hydroxy group, an alkoxy group, an acyloxy group, a phosphoryloxy group, a sulfonyloxy group, an amino group, an oxime group, and $O=C(R^a)(R^b)$, $X^2$'s may form a ring by being bonded to each other, $R^1$ represents a hydrogen atom or an alkyl group, $L^1$ represents a single bond or a divalent linking group, and n represents the number of bonding hands between M and $X^2$.

M and $X^2$ are identical to M and $X^1$ of (MX1), and the preferred ranges thereof are identical to those of M and $X^1$ of (MX1).

$R^1$ represents a hydrogen atom or an alkyl group. The number of carbon atoms of the alkyl group is preferably 1 to 5, is more preferably 1 to 3, and is particularly preferably 1. The alkyl group is preferably any one of a linear alkyl group and a branched alkyl group, and the linear alkyl group is more preferable. In the alkyl group, a part or all of hydrogen atoms may be substituted with a halogen atom (preferably a fluorine atom).

$L^1$ represents a single bond or a divalent linking group. Examples of the divalent linking group include an alkylene group, an arylene group, —O—, —S—, —CO—, —COO—, —OCO—, —SO$_2$—, —NR$^{10}$— ($R^{10}$ represents a hydrogen atom or an alkyl group, and the hydrogen atom is preferable), or a group formed of a combination thereof, and the alkylene group, and a group formed of a combination between at least one of the arylene group or the alkylene group and —O— are preferable.

The number of carbon atoms of the alkylene group is preferably 1 to 30, is more preferably 1 to 15, and is even more preferably 1 to 10. The alkylene group may have a substituent, and a non-substituted alkylene group is preferable. The alkylene group may be any one of a linear alkylene group, a branched alkylene group, and a cyclic alkylene group. In addition, the cyclic alkylene group may be any one of a monocyclic alkylene group and a polycyclic alkylene group.

The number of carbon atoms of the arylene group is preferably 6 to 18, is more preferably 6 to 14, and is even more preferably 6 to 10, and a phenylene group is particularly preferable.

The polymer type compound described above may contain other repeating units in addition to the repeating units represented by Formulas (MX2-1), (MX2-2), and (MX2-3).

A component configuring the other repeating unit can be referred to the description of a copolymerization component disclosed in paragraphs 0068 to 0075 of JP2010-106268A ([0112] to [0118] of the specification of corresponding US2011/0124824A), and the contents thereof are incorporated herein.

Preferred examples of the other repeating unit include repeating units represented by Formulas (MX3-1) to (MX3-6) described below.

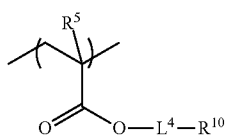
(MX3-1)

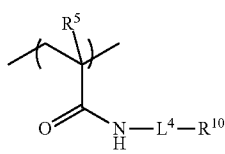
(MX3-2)

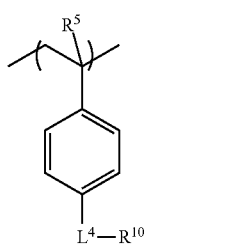
(MX3-3)

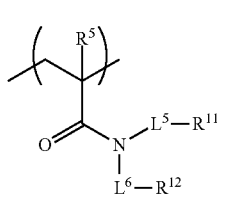
(MX3-4)

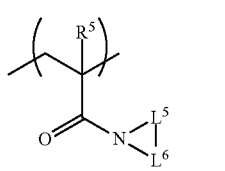
(MX3-5)

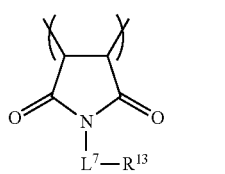
(MX3-6)

In Formulas (MX3-1) to (MX3-6), $R^5$ represents a hydrogen atom or an alkyl group, $L^4$ to $L^7$ each independently represent a single bond or a divalent linking group, and $R^{10}$ to $R^{13}$ each independently represent an alkyl group or an aryl group.

$R^5$ is identical to $R^1$ of Formulas (MX2-1) to (MX2-3), and the preferred range thereof is identical to that of $R^1$ of Formulas (MX2-1) to (MX2-3).

$L^4$ to $L^7$ are identical to $L^1$ of Formulas (MX2-1) to (MX2-3), and the preferred range thereof is identical to that of $L^1$ of Formulas (MX2-1) to (MX2-3).

The alkyl group represented by $R^{10}$ may be any one of a linear alkyl group, a branched alkyl group, and a cyclic alkyl group, and the cyclic alkyl group is preferable. The number of carbon atoms of the alkyl group is preferably 1 to 30, is more preferably 1 to 20, and is even more preferably 1 to 10. The alkyl group may have a substituent, and examples of the substituent include the substituents described above.

The aryl group represented by $R^{10}$ may be a monocyclic aryl group, or may be a polycyclic aryl group, and the monocyclic aryl group is preferable. The number of carbon atoms of the aryl group is preferably 6 to 18, is more preferably 6 to 12, and is even more preferably 6.

It is preferable that $R^{10}$ is the cyclic alkyl group or the cyclic aryl group.

The alkyl group represented by $R^{11}$ and $R^{12}$ may be any one of a linear alkyl group, a branched alkyl group, and a cyclic alkyl group, and the linear alkyl group or the branched alkyl group is preferable. The alkyl group may be substituted, and examples of a substituent include the substituents described above. The number of carbon atoms of the alkyl group is preferably 1 to 12, is more preferably 1 to 6, and is even more preferably 1 to 4.

The aryl group represented by $R^{11}$ and $R^{12}$ may be a monocyclic aryl group, or may be a polycyclic aryl group, and the monocyclic aryl group is preferable. The number of carbon atoms of the aryl group is preferably 6 to 18, is more preferably 6 to 12, and is even more preferably 6.

It is preferable that $R^{11}$ and $R^{12}$ are the linear alkyl group or the branched alkyl group.

The alkyl group represented by $R^{13}$ may be any one of a linear alkyl group, a branched alkyl group, and a cyclic alkyl group, and the linear alkyl group or the branched alkyl group is preferable. The alkyl group may be substituted, and examples of a substituent include the substituents described above. The number of carbon atoms of the alkyl group is preferably 1 to 12, is more preferably 1 to 6, and is even more preferably 1 to 4.

The aryl group represented by $R^{13}$ may be a monocyclic aryl group, or may be a polycyclic aryl group, and the monocyclic aryl group is preferable. The number of carbon atoms of the aryl group is preferably 6 to 18, is more preferably 6 to 12, and is even more preferably 6.

It is preferable that $R^{13}$ is a linear alkyl group or a branched alkyl group, or a linear aryl group or a branched aryl group.

In a case where the polymer type compound described above includes the other repeating unit (preferably the repeating units represented by Formulas (MX3-1) to (MX3-6)), a molar ratio of the total of the repeating units represented by Formulas (MX2-1) to (MX2-3) to the total of the other repeating unit is preferably 95:5 to 20:80, and is more preferably 90:10 to 40:60. By increasing the content rate of the repeating units represented by Formulas (MX2-1) to (MX2-3) in the range described above, moisture resistance and solvent resistance tend to be further improved. In addition, by decreasing the content rate of the repeating units represented by Formulas (MX2-1) to (MX2-3) in the range described above, heat resistance tends to be further improved.

Examples of the polymer type compound in which M is Si include (P-1) to (P-15) described below. Furthermore, a numerical value described in a repeating unit is a molar ratio. In addition, Mw is a weight-average molecular weight.

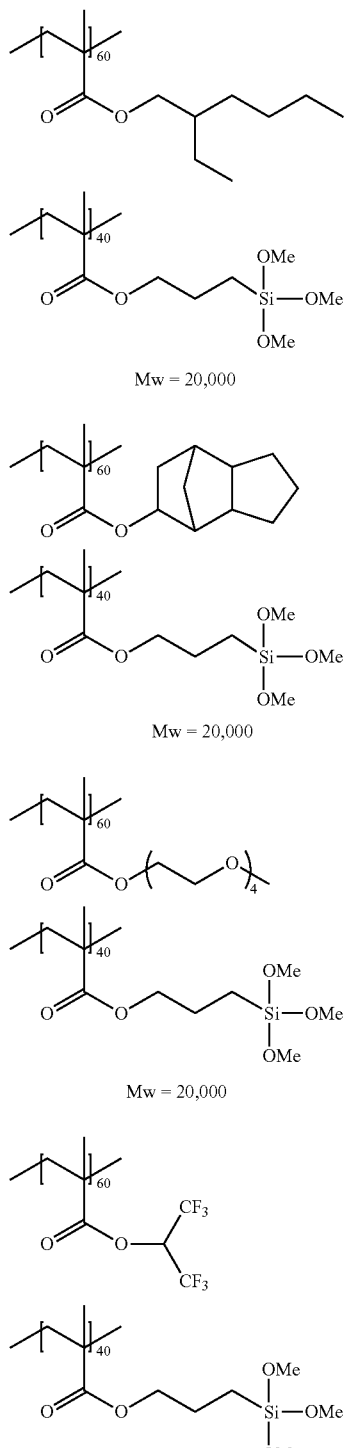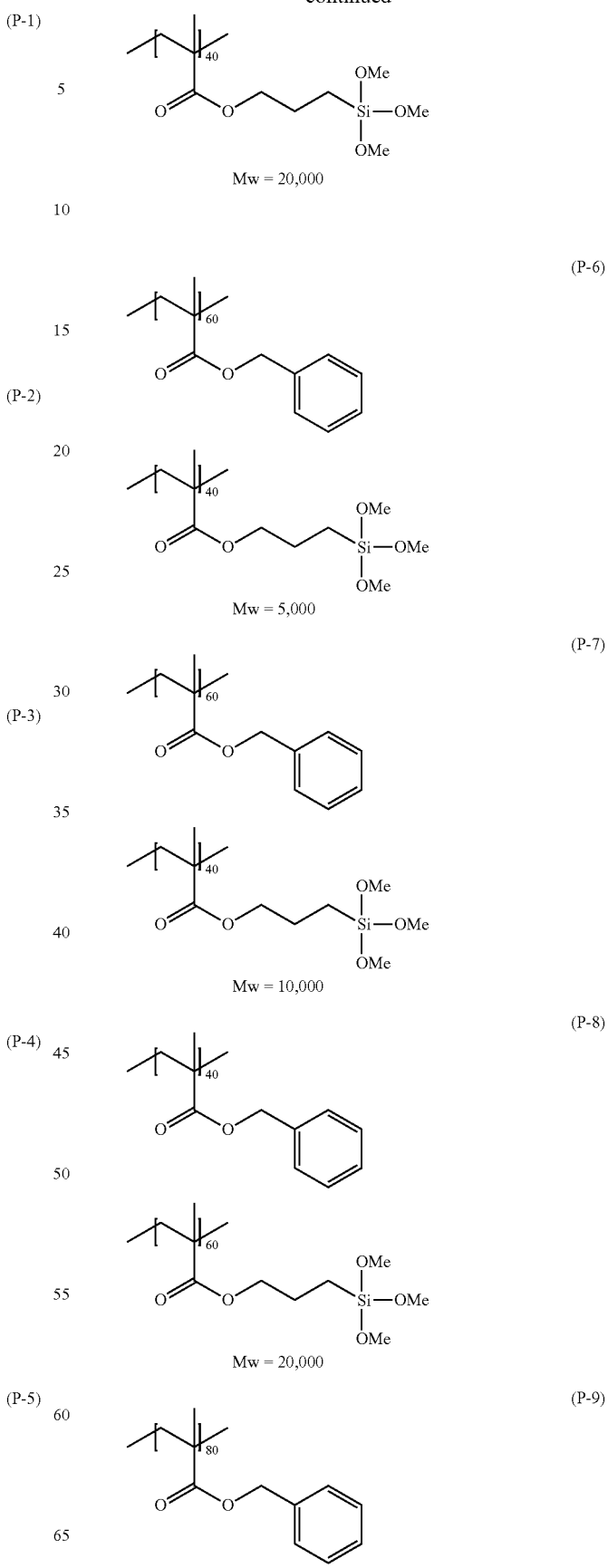

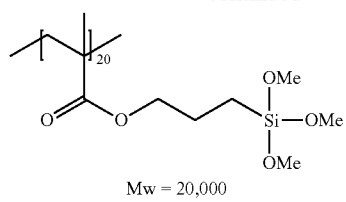
Mw = 20,000
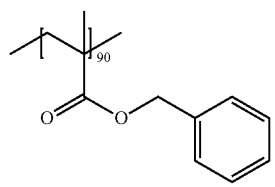
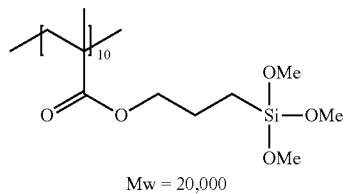
Mw = 20,000
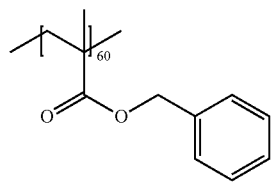
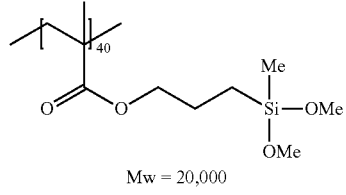
Mw = 20,000
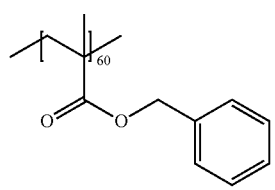
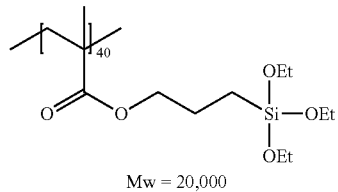
Mw = 20,000
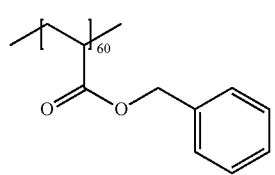
(P-10)
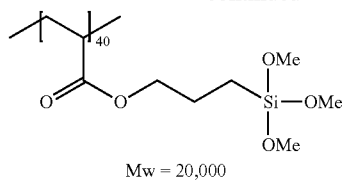
(P-11)
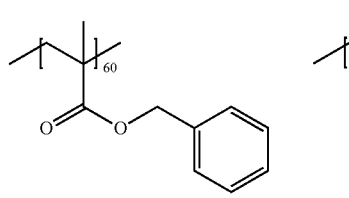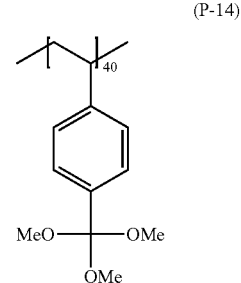
Mw = 20,000
(P-12)
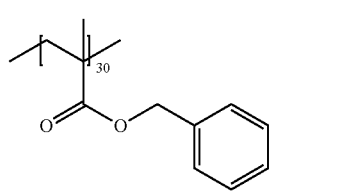
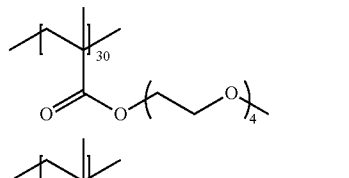
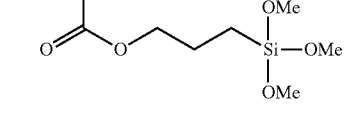
Mw = 20,000
(P-13)
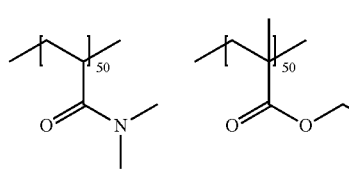
Mw = 15,000
(P-14)
(P-15)
(P-16)
(P-17)
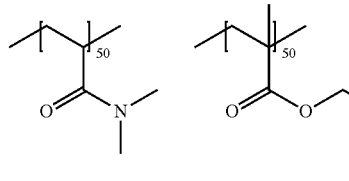
Mw = 15,000

(P-18)
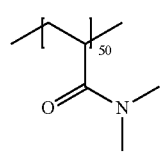 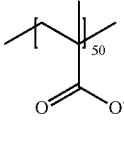
Mw = 15,000
(P-19)
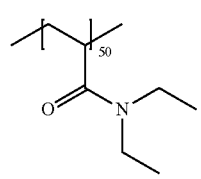
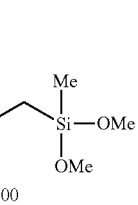
Mw = 15,000
(P-20)
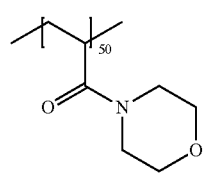
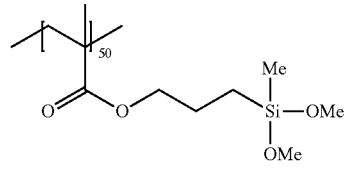
Mw = 15,000
(P-21)
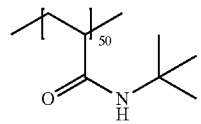
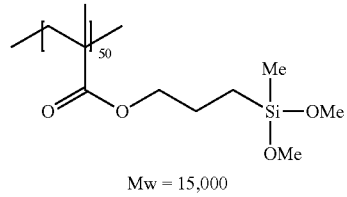
Mw = 15,000
(P-22)
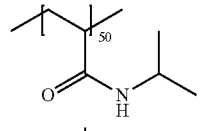
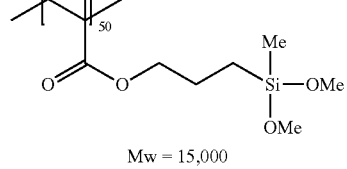
Mw = 15,000
(P-23)
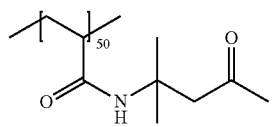
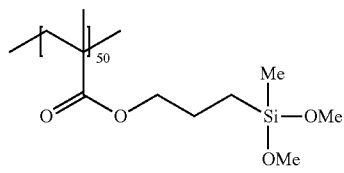
Mw = 15,000
(P-24)
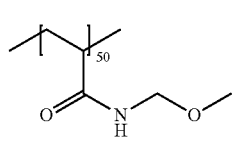
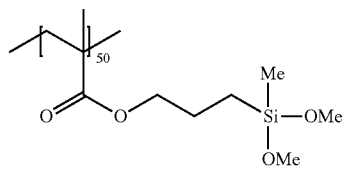
Mw = 15,000
(P-25)
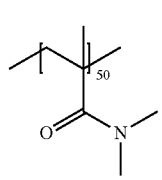
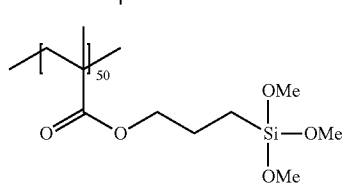
Mw = 15,000
(P-26)
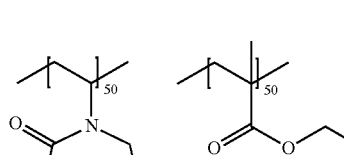
Mw = 10,000
(P-27)
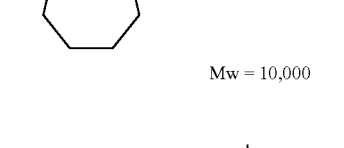
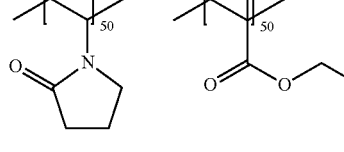
Mw = 10,000

-continued
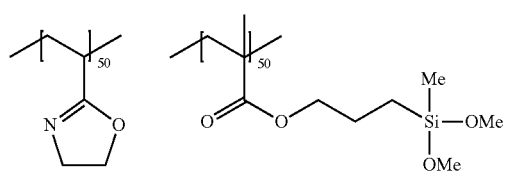
Mw = 10,000 (P-28)
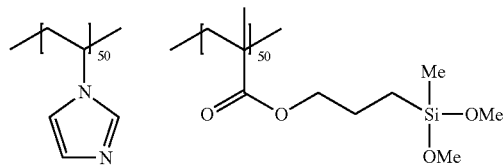
Mw = 10,000 (P-29)
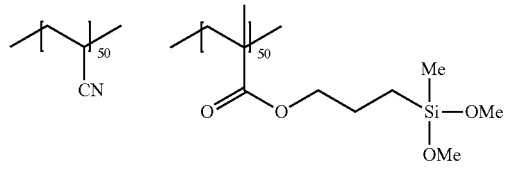
Mw = 10,000 (P-30)
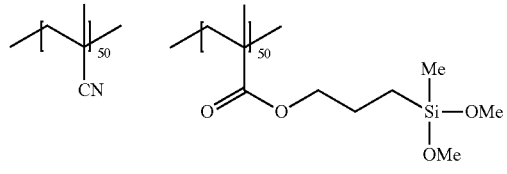
Mw = 10,000 (P-31)
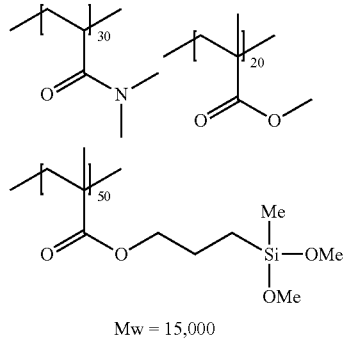
Mw = 15,000 (P-32)
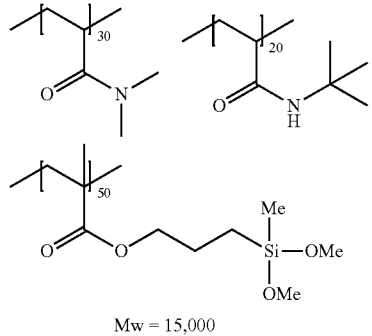
Mw = 15,000 (P-33)
-continued
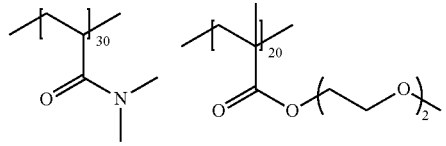
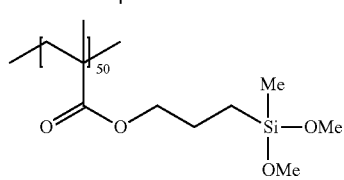
Mw = 15,000 (P-34)
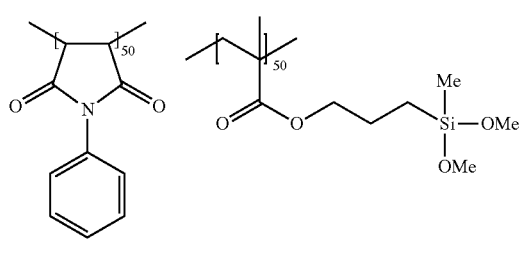
Mw = 10,000 (P-35)
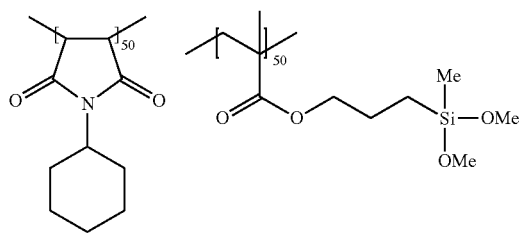
Mw = 10,000 (P-36)
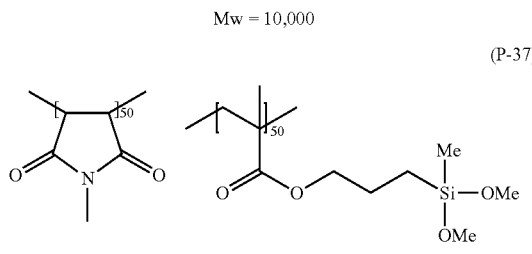
Mw = 10,000 (P-37)
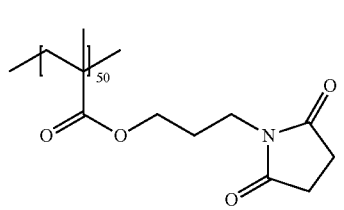
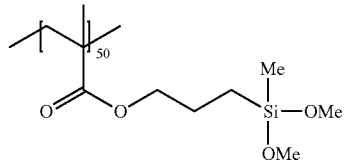
Mw = 15,000 (P-38)

-continued (P-39) 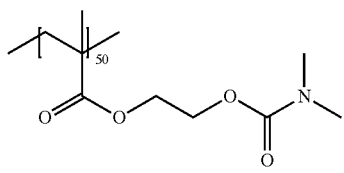
Mw = 15,000

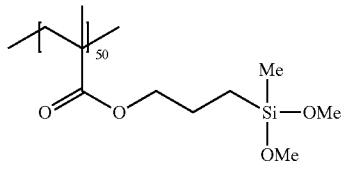
Mw = 10,000

(P-40) 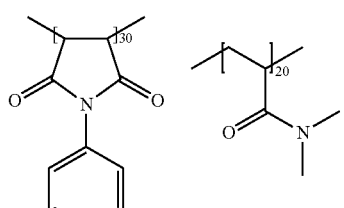
Mw = 10,000

(P-41) 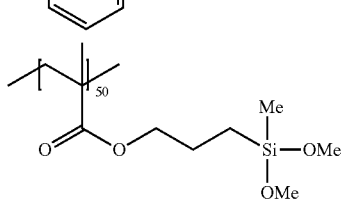
Mw = 10,000

(P-42) 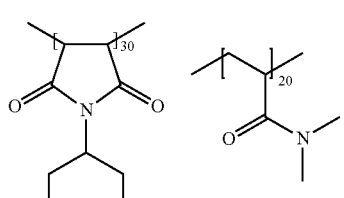
Mw = 10,000

-continued (P-43) 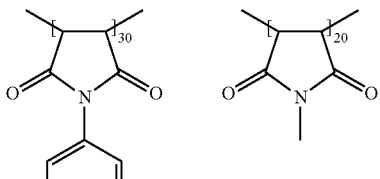
Mw = 10,000

(P-44) 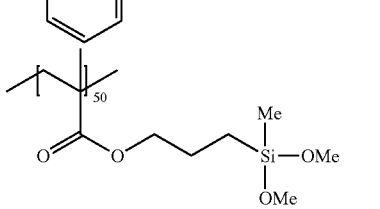
Mw = 10,000

In the present invention, polysiloxane can also be used as the polymer type compound having a partial structure represented by M-X. Examples of the polysiloxane include KC-89S, KR-500, X-40-9225, X-40-9246, and X-40-9250 (all are methyl-based silicone alkoxy oligomers having a methoxy group), KR-9218, KR-213, KR-510, X-40-9227, and X-40-9247 (all are methyl phenyl-based silicone alkoxy oligomers having a methoxy group), X-41-1053, X-41-1059A, X-41-1056, X-41-1805, X-41-1818, X-41-1810, KR-513, X-40-2672B, X-40-9272B, X-40-2651, X-40-2308, and X-40-9238 (a silicone alkoxy oligomer), and the like, which are manufactured by Shin-Etsu Chemical Co., Ltd.

In the near infrared ray absorbent composition of the present invention, the content of the compound having a partial structure represented by M-X is preferably greater than or equal to 15 mass %, is more preferably greater than or equal to 20 mass %, and is even more preferably greater than or equal to 25 mass %, with respect to the total solid content of the near infrared ray absorbent composition. The upper limit is not particularly limited, but is preferably less than or equal to 99 mass %, is more preferably less than or equal to 90 mass %, is even more preferably less than or equal to 80 mass %, and still more preferably less than or equal to 70 mass %. In a case where the content of the compound having a partial structure represented by M-X is in the range described above, a film having excellent heat resistance is easily formed.

In addition, a mass ratio of the compound having a partial structure represented by M-X to the near infrared ray absorbent compound described below, that is, Compound Having Partial Structure Represented by M-X:Near Infrared Ray Absorbent Compound is preferably 15:85 to 90:10, is more preferably 20:80 to 80:20, and is even more preferably 25:75 to 70:30. In a case where the ratio of the both compounds is in the range described above, a film having excellent heat resistance while maintaining high near infrared ray shielding properties is easily formed.

In addition, the compound having a partial structure represented by M-X can have an aspect which is substantially configured of one type selected from the low molecular compound and the polymer type compound described above. Furthermore, "being substantially configured of one type selected from the low molecular compound and the polymer type compound", for example, indicates that the content of the compound other than a target type compound in the low molecular compound and the polymer type compound is preferably less than or equal to 1 mass %, and is more preferably less than or equal to 0.5 mass %, with respect to the total mass of the compound having a partial structure represented by M-X, and it is even more preferable that the compound other than the target type compound is not contained. For example, in a case where the target type compound is the polymer type compound, the low molecular compound corresponds to the compound other than the target type compound.

In addition, one or more types selected from the low molecular compound and one or more types selected from the polymer type compound can be used in combination. A mass ratio of the total of the low molecular compounds to the total of the polymer type compounds is preferably 1:9 to 5:5, is more preferably 1:9 to 4:6, and is particularly preferably 1:9 to 3:7.

<<Near Infrared Ray Absorbent Compound>>

The near infrared ray absorbent composition of the present invention contains the near infrared ray absorbent compound.

The near infrared ray absorbent compound is not particularly limited insofar as the near infrared ray absorbent compound has the maximum absorption wavelength range in a range of 700 to 2,500 nm, and preferably in a range of 700 to 1,000 nm (a near infrared ray range).

A molar light absorption coefficient c of the near infrared ray absorbent compound is preferably 50,000 to 500,000, and is more preferably 100,000 to 300,000.

In the near infrared ray absorbent composition of the present invention, it is preferable that the content of the near infrared ray absorbent compound is 10 to 85 mass % with respect to the total solid content of the near infrared ray absorbent composition. The upper limit is preferably less than or equal to 80 mass %, and is more preferably less than or equal to 70 mass %. The lower limit is preferably greater than or equal to 20 mass %, and is more preferably greater than or equal to 30 mass %. In a case where the content of the near infrared ray absorbent compound is in the range described above, a film having excellent near infrared ray shielding properties is easily formed.

Examples of the near infrared ray absorbent compound include a copper compound, a pyrrolo pyrrole-based compound, a cyanine-based compound, a phthalocyanine-based compound, a naphthalocyanine-based compound, an immonium-based compound, a thiol complex-based compound, a transition metal oxide-based compound, a squarylium-based compound, a quaterrylene-based compound, a dithiol metal complex-based compound, a croconium-based compound, and the like. Among them, the copper compound is preferable from the reason of easily forming a film excellent in both of near infrared ray shielding properties and visible transmittance.

The pyrrolo pyrrole-based compound may be a pigment, or may be a dye, and the pigment is preferable from the reason of easily obtaining a coloring composition which can form a film having excellent heat resistance. Examples of the pyrrolo pyrrole-based compound include pyrrolo pyrrole compounds disclosed in paragraphs 0016 to 0058 of JP2009-263614A, and the like.

Compounds disclosed in paragraphs 0010 to 0081 of JP2010-111750A may be used as the cyanine-based compound, the phthalocyanine-based compound, the immonium-based compound, the squarylium-based compound, and the croconium-based compound, and the contents thereof are incorporated herein. In addition, the cyanine-based compound, for example, can be referred to "Functional Coloring Agent, written by OKAWARA Makoto/MATSUOKA Masaru/KITAO Teijiro/HIRASHIMA Tsuneaki and published by Kodansha Scientific Ltd.", and the contents thereof are incorporated herein. In addition, the phthalocyanine-based compound can be referred to the description in paragraphs 0013 to 0029 of JP2013-195480A, and the contents thereof are incorporated herein.

<<<Copper Compound>>>

It is preferable that the copper compound contains a copper complex. Near infrared ray shielding properties are improved by increasing the content of the copper, and thus, the content of the copper is preferably greater than or equal to 10 mass %, is more preferably greater than or equal to 20 mass %, is even more preferably greater than or equal to 30 mass %, with respect to the total solid content of the near infrared ray absorbent composition, on an atom basis. The upper limit is not particularly limited, but is preferably less than or equal to 70 mass %, and is more preferably less than or equal to 60 mass %.

For example, a copper compound obtained by a reaction between a copper component and a compound having a coordination portion with respect to the copper component is preferably used as the copper compound. The compound having a coordination portion with respect to the copper component may be a low molecular compound, or may be a polymer. Both compounds can be used together.

Copper or a compound containing copper can be used as the copper component, and a compound containing divalent copper is preferable. Only one type of the copper component may be used, or two or more types thereof may be used.

For example, as the copper salt, copper oxide or a copper salt can be used as the copper component. For example, copper carboxylate (for example, copper acetate, ethyl acetoacetate, copper formate, copper benzoate, copper stearate, copper naphthenate, copper citrate, copper 2-ethyl hexanoate, and the like), copper sulfonate (for example, copper methane sulfonate and the like), copper phosphate, copper phosphoric acid ester, copper phosphonate, copper phosphonic acid ester, copper phosphinate, copper amide, copper sulfone amide, copper imide, copper acyl sulfone imide, copper bissulfone imide, copper methide, alkoxy copper, phenoxy copper, copper hydroxide, copper carbonate, copper sulfate, copper nitrate, copper perchlorate, copper chloride, and copper bromide are preferable, the copper carboxylate, the copper sulfonate, the copper sulfone amide, the copper imide, the copper acyl sulfone imide, the copper bissulfone imide, the alkoxy copper, the phenoxy copper, the copper hydroxide, the copper carbonate, the copper chloride, and the copper sulfate are more preferable, the copper carboxylate, the copper acyl sulfone imide, the phenoxy copper, and the copper chloride are even more preferable, and the copper carboxylate and the copper acyl sulfone imide are particularly preferable.

<<<<Low Molecular Type Copper Compound>>>>

For example, a copper complex represented by Formula (A) described below can be used as the copper compound.

$$Cu(L)_{n1} \cdot (X)_{n2} \quad \text{Formula (A)}$$

In Formula (A) described above, L represents a ligand which coordinates with copper, and X represents a counter ion. n1 represents an integer of 1 to 4. n2 represents an integer of 0 to 4.

X represents the counter ion. The copper compound used in the present invention may be a cationic complex or an anionic complex in addition to an aprotic complex not having an electric charge according to the number of coordination portions coordinating with anions. In this case, in order to neutralize the electric charge of the copper compound, as necessary, counter ions exist.

In a case where the counter ion is a negative counter ion, for example, the counter ion may be an inorganic anion or an organic anion. Specific examples of the counter ion include a hydroxide ion, a halogen anion (for example, a fluoride ion, a chloride ion, a bromide ion, an iodide ion, and the like), a substituted alkyl carboxylate ion or a non-substituted alkyl carboxylate ion (an acetate ion, a trifluoroacetate ion, and the like), a substituted aryl carboxylate ion or a non-substituted aryl carboxylate ion (a benzoate ion and the like), a substituted alkyl sulfonate ion or a non-substituted alkyl sulfonate ion (a methane sulfonate ion, a trifluoromethane sulfonate ion, and the like), a substituted aryl sulfonate ion or a non-substituted aryl sulfonate ion (for example, a para-toluene sulfonate ion, a para-chlorobenzene sulfonate ion, and the like), an aryl disulfonate ion (for example, a 1,3-benzene disulfonate ion, a 1,5-naphthalene disulfonate ion, a 2,6-naphthalene disulfonate ion, and the like), an alkyl sulfate ion (for example, a methyl sulfate ion and the like), a sulfate ion, a thiocyanate ion, a nitrate ion, a perchlorate ion, a tetrafluoroborate ion, a tetraaryl borate ion, a tetrakis(pentafluorophenyl) borate ion ($B^-(C_6F_5)_4$), a hexafluorophosphate ion, a picrate ion, an amide ion (including amide substituted with an acyl group or a sulfonyl group), and a methide ion (including methide substituted with an acyl group or a sulfonyl group), and the halogen anion, the substituted alkyl carboxylate ion or the non-substituted alkyl carboxylate ion, the sulfate ion, the nitrate ion, the tetrafluoroborate ion, the tetraaryl borate ion, the hexafluorophosphate ion, the amide ion (including the amide substituted with the acyl group or the sulfonyl group), and the methide ion (including the methide substituted with the acyl group or the sulfonyl group) are preferable.

In a case where the counter ion is a positive counter ion, examples of the counter ion include an inorganic ammonium ion or an organic ammonium ion (for example, a tetraalkyl ammonium ion such as a tetrabutyl ammonium ion, a triethyl benzyl ammonium ion, a pyridinium ion, and the like), a phosphonium ion (for example, a tetraalkyl phosphonium ion such as a tetrabutyl phosphonium ion, an alkyl triphenyl phosphonium ion, a triethyl phenyl phosphonium ion, and the like), an alkali metal ion, or a proton.

In addition, the counter ion may be a metal complex ion, and in particular, the counter ion may be a copper complex, that is, may be a salt of a cationic copper complex and an anionic copper complex.

The ligand L is a group having one or more types selected from a coordination portion coordinating with the copper by an anion and a coordination atom coordinating with the copper by an unshared electron pair. The coordination portion coordinating with the copper by the anion may be a dissociative coordination portion, or may be a non-dissociative coordination portion. In a case where the coordination portion is the non-dissociative coordination portion, X does not exist.

The copper complex described above is a copper compound in which a ligand coordinates with copper in center metal, and the copper is general divalent copper. For example, the copper complex can be obtained by mixing and reacting a compound which becomes a ligand or a salt thereof with a copper component.

The compound which becomes the ligand or a salt thereof is not particularly limited, but is preferably a compound represented by General Formula (i) described below.

$$R^{100}-(X^{100})_{n3} \quad (i)$$

(In General Formula (i), $X^{100}$ represents a coordination portion, n3 represents an integer of 1 to 6, and $R^{100}$ represents a single bond or an n-valent group.) In General Formula (i), $X^{100}$ is preferably one or more types selected from a coordination portion performing coordination by an anion and a coordination atom performing coordination by an unshared electron pair, and more preferably includes one or more types of the coordination portions performing coordination by an anion.

The anion described above may be an anion which can coordinate with a copper atom in a copper component, and an oxygen anion, a nitrogen anion, or a sulfur anion is preferable.

It is preferable that the coordination portion performing coordination by an anion, for example, is at least one type selected from Group (AN) described below.

Group (AN)

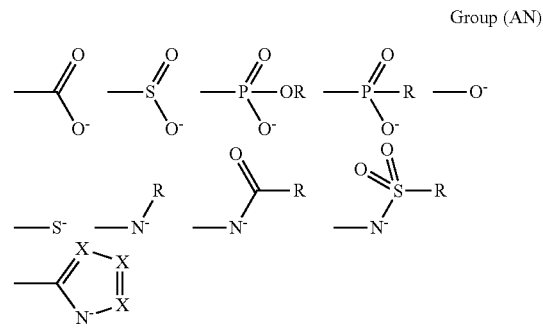

In Group (AN), X represents N or CR, and R's each independently represent a hydrogen atom, an alkyl group, an alkenyl group, an alkynyl group, an aryl group, or a heteroaryl group.

The alkyl group represented by R may be a linear alkyl group, a branched alkyl group, or a cyclic alkyl group, and the linear alkyl group is preferable. The number of carbon atoms of the alkyl group is preferably 1 to 10, is more preferably 1 to 6, and is even more preferably 1 to 4. Examples of the alkyl group include a methyl group. The alkyl group may have a substituent, and examples of the substituent include a halogen atom, a carboxyl group, and a heterocyclic group. The heterocyclic group as the substituent may be a monocyclic group or a polycyclic group, and may be an aromatic group or a non-aromatic group. The number of hetero atoms configuring a hetero ring is preferably 1 to 3, and is more preferably 1 or 2. The hetero atom configuring the hetero ring is preferably a nitrogen atom. In a case where the alkyl group has the substituent, the substituent may further have a substituent.

The number of carbon atoms of the alkynyl group represented by R is preferably 1 to 10, and is more preferably 1 to 6.

The aryl group represented by R may be a monocyclic aryl group, or may be a polycyclic aryl group, and the monocyclic aryl group is preferable. The number of carbon atoms of the aryl group is preferably 6 to 18, is more preferably 6 to 12, and is even more preferably 6.

The heteroaryl group represented by R may be a monocyclic heteroaryl group, or may be a polycyclic heteroaryl group. The number of hetero atoms configuring the heteroaryl group is preferably 1 to 3. The hetero atom configuring the heteroaryl group is preferably a nitrogen atom, an oxygen atom, or a sulfur atom. The number of carbon atoms of the heteroaryl group is preferably 6 to 18, and is more preferably 6 to 12.

Examples of the coordination portion performing coordination by an anion also include a monoanionic coordination portion. The monoanionic coordination portion indicates a portion coordinating with a copper atom through a functional group having one negative electric charge. For example, an acid group having an acid dissociation constant (pKa) of less than or equal to 12 is included. Specifically, examples of the acid group include an acid group containing a phosphorus atom (a phosphoric acid diester group, a phosphonic acid monoester group, a phosphinic acid group, and the like), a sulfo group, a carboxyl group, an imide acid group, and the like, the sulfo group and the carboxyl group are preferable, and the carboxyl group is more preferable.

Examples of the coordination atom performing coordination by an unshared electron pair preferably include an oxygen atom, a nitrogen atom, a sulfur atom, or a phosphorus atom, more preferably include an oxygen atom, a nitrogen atom, or a sulfur atom, and even more preferably include a nitrogen atom. In addition, an aspect is preferable in which the coordination atom performing coordination by an unshared electron pair is a nitrogen atom, and an atom adjacent to such a nitrogen atom is a carbon atom, and it is also preferable that such a carbon atom has a substituent. According to such a configuration, a structure of a copper complex is more easily distorted, and thus, a color valency can be further improved. The substituent is identical to a substituent that a ring having the coordination atom performing coordination by an unshared electron pair described below may have, and an alkyl group having 1 to 10 carbon atoms, an aryl group having 6 to 12 carbon atoms, a carboxyl group, an alkoxy group having 1 to 12 carbon atoms, an acyl group having 2 to 12 carbon atoms, an alkyl thio group having 1 to 12 carbon atoms, and a halogen atom are preferable as the substituent.

The coordination atom performing coordination by an unshared electron pair may be contained in a ring, or may be contained in at least one type of partial structure selected from Group (UE) described below.

Group (UE)

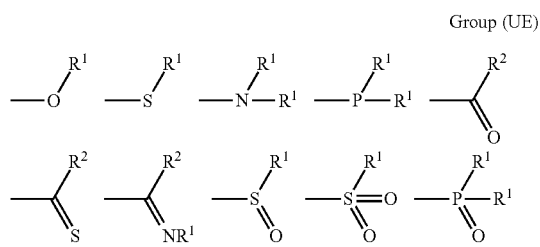

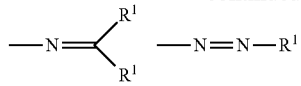

In Group (UE), $R^1$'s each independently represent a hydrogen atom, an alkyl group, an alkenyl group, an alkynyl group, an aryl group or a heteroaryl group, $R^2$'s each independently represent a hydrogen atom, an alkyl group, an alkenyl group, an alkynyl group, an aryl group, a heteroaryl group, an alkoxy group, an aryloxy group, a heteroaryloxy group, an alkyl thio group, an aryl thio group, a heteroaryl thio group, an amino group, or an acyl group.

The alkyl group represented by $R^1$ is identical to the alkyl group described in R of Group (AN), and the preferred range thereof is also identical to that of the alkyl group described in R of Group (AN).

The number of carbon atoms of the alkenyl group represented by $R^1$ is preferably 1 to 10, and is more preferably 1 to 6.

The number of carbon atoms of the alkynyl group represented by $R^1$ is preferably 1 to 10, and is more preferably 1 to 6.

The heteroaryl group represented by $R^1$ is identical to the heteroaryl group described in R of Group (AN), and the preferred range thereof is also identical to that of the heteroaryl group described in R of Group (AN).

The alkyl group represented by $R^2$ is identical to the alkyl group described in $R^1$ of Group (UE), and the preferred range thereof is also identical to that of the alkyl group described in $R^1$ of Group (UE).

The number of carbon atoms of the alkenyl group represented by $R^2$ is preferably 1 to 10, and is more preferably 1 to 6.

The number of carbon atoms of the alkynyl group represented by $R^2$ is preferably 1 to 10, and is more preferably 1 to 6.

The aryl group represented by $R^2$ is identical to the aryl group described in Group (UE), and the preferred range thereof is also identical to that of the aryl group described in Group (UE).

The heteroaryl group represented by $R^2$ is identical to the heteroaryl group of Group (UE), and the preferred range thereof is also identical to that of the heteroaryl group of Group (UE).

The number of carbon atoms of the alkoxy group represented by $R^2$ is preferably 1 to 12.

The number of carbon atoms of the aryloxy group represented by $R^2$ is preferably 6 to 18.

The heteroaryloxy group represented by $R^2$ may be a monocyclic heteroaryloxy group, or may be a polycyclic heteroaryloxy group. A heteroaryl group configuring the heteroaryloxy group is identical to the heteroaryl group of Group (UE), and the preferred range thereof is also identical to that of the heteroaryl group of Group (UE).

The number of carbon atoms of the alkyl thio group represented by $R^2$ is preferably 1 to 12.

The number of carbon atoms of the aryl thio group represented by $R^2$ is preferably 6 to 18.

The heteroaryl thio group represented by $R^2$ may be a monocyclic heteroaryl thio group, or may be a polycyclic heteroaryl thio group. A heteroaryl group configuring the heteroaryl thio group is identical to the heteroaryl group of Group (UE), and the preferred range thereof is also identical to that of the heteroaryl group of Group (UE).

The number of carbon atoms of the acyl group represented by $R^2$ is preferably 2 to 12.

In a case where the coordination atom performing coordination by an unshared electron pair is contained in the ring, the ring containing the coordination atom may be a monocyclic ring, or may be a polycyclic ring, and may be an aromatic ring or a non-aromatic ring. A 5-membered ring to 12-membered ring are preferable, a 5-membered ring to a 7-membered ring are more preferable, and a 5-membered ring or a 6-membered ring is even more preferable.

The ring containing a coordination atom performing coordination by an unshared electron pair may have a substituent. Examples of the substituent include a linear alkyl group, a branched alkyl group, or a cyclic alkyl group having 1 to 10 carbon atoms, an aryl group having 6 to 12 carbon atoms, a halogen atom, a silicon atom, an alkoxy group having 1 to 12 carbon atoms, an acyl group having 1 to 12 carbon atoms, an alkyl thio group having 1 to 12 carbon atoms, a carboxyl group, and the like.

The substituent described above may further have a substituent. Examples of such a substituent include a group formed of a ring containing a coordination atom performing coordination by an unshared electron pair, a group having at least one type of a partial structure selected from Group (UE) described above, an alkyl group having 1 to 12 carbon atoms, an acyl group having 1 to 12 carbon atoms, a hydroxy group, and the like.

In General Formula (i), n3 represents an integer of 1 to 6, is preferably 1 to 3, is more preferably 2 or 3, and is even more preferably 3.

In General Formula (i), $R^{100}$ represents a single bond or an n-valent group. An n-valent organic group, or a group formed of a combination between the n-valent organic group and —O—, —SO—, —SO$_2$—, —NR$^{N1}$—, —CO—, and —CS— is preferable as the n-valent group. Examples of the n-valent organic group include a hydrocarbon group, an oxy alkylene group, a heterocyclic group, and the like. In addition, the n-valent group may be a group having at least one type selected from Group (AN-1) described below, a ring containing a coordination atom performing coordination by an unshared electron pair, or a group having at least one type selected from Group (UE-1) described below.

The hydrocarbon group is preferably an aliphatic hydrocarbon group or an aromatic hydrocarbon group. The hydrocarbon group may have a substituent, and examples of the substituent include an alkyl group, a halogen atom (preferably a fluorine atom), a polymerizable group (for example, a vinyl group, a (meth)acryloyl group, an epoxy group, an oxetane group, and the like), a sulfo group, a carboxyl group, an acid group containing a phosphorus atom, a carboxylic acid ester group (for example, —CO$_2$CH$_3$), a hydroxyl group, an alkoxy group (for example, a methoxy group), an amino group, a carbamoyl group, a carbamoyloxy group, an alkyl halide group (for example, a fluoroalkyl group and a chloroalkyl group), a (meth)acryloyloxy group, and the like. In a case where the hydrocarbon group has the substituent, the substituent may further have a substituent, and examples of the substituent include an alkyl group, the polymerizable group described above, a halogen atom, and the like.

In a case where the hydrocarbon group described above is a monovalent hydrocarbon group, an alkyl group, an alkenyl group, or an aryl group is preferable, and the aryl group is more preferable. In a case where the hydrocarbon group is a divalent hydrocarbon group, an alkylene group, an arylene group, and an oxy alkylene group are preferable, and the arylene group is more preferable. In a case where the hydrocarbon group is a trivalent or higher hydrocarbon group, the hydrocarbon groups corresponding to the monovalent hydrocarbon group or the divalent hydrocarbon group described above are preferable.

The alkyl group and the alkylene group may be any one of a linear alkyl group and a linear alkylene group, a branched alkyl group and a branched alkylene group, or a cyclic alkyl group and a cyclic alkylene group. The number of carbon atoms of the linear alkyl group and the linear alkylene group is preferably 1 to 20, is more preferably 1 to 12, and is even more preferably 1 to 8. The number of carbon atoms of the branched alkyl group and the branched alkylene group is preferably 3 to 20, is more preferably 3 to 12, and is even more preferably 3 to 8. The cyclic alkyl group and the cyclic alkylene group may be any one of a monocyclic alkyl group and a monocyclic alkylene group and a polycyclic alkyl group and a polycyclic alkylene group. The number of carbon atoms of the cyclic alkyl group and the cyclic alkylene group is preferably 3 to 20, is more preferably 4 to 10, and is even more preferably 6 to 10.

The number of carbon atoms of the alkenyl group and the alkenylene group is preferably 2 to 10, is more preferably 2 to 8, and is even more preferably 2 to 4.

The number of carbon atoms of the aryl group and the arylene group is preferably 6 to 18, is more preferably 6 to 14, and is even more preferably 6 to 10.

Examples of the heterocyclic group include a heterocyclic group in which a hetero atom is contained in an alicyclic group or an aromatic heterocyclic group. A 5-membered ring or a 6-membered ring is preferable as the heterocyclic group. In addition, the heterocyclic group is a monocyclic ring or a fused ring, a monocyclic ring or a fused ring having 2 to 8 condensations is preferable, and a monocyclic ring or a fused ring having 2 to 4 condensations is more preferable. The heterocyclic group may have a substituent, and the substituent is identical to the substituent that the hydrocarbon group described above may have.

In —NR$^{N1}$—, R$^{N1}$ represents a hydrogen atom, an alkyl group, an aryl group, or an aralkyl group. The alkyl group in R$^{N1}$ may be any one of a linear alkyl group, a branched alkyl group, and a cyclic alkyl group. The number of carbon atoms of the linear alkyl group or the branched alkyl group is preferably 1 to 20, and is more preferably 1 to 12. The cyclic alkyl group may be any one of a monocyclic alkyl group and a polycyclic alkyl group. The number of carbon atoms of the cyclic alkyl group is preferably 3 to 20, and is more preferably 4 to 14.

The number of carbon atoms of the aryl group in R$^{N1}$ is preferably 6 to 18, and is more preferably 6 to 14. Specifically, a phenyl group, a naphthyl group, and the like are exemplified. An aralkyl group having 7 to 20 carbon atoms is preferable as the aralkyl group in R$^{N1}$, and a non-substituted aralkyl group having 7 to 15 carbon atoms is more preferable.

Group (UE-1)

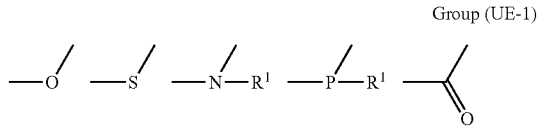

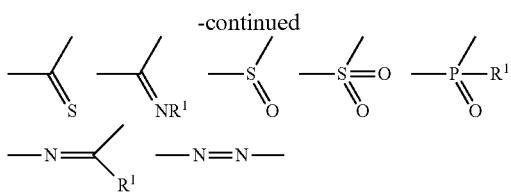

$R^1$ in Group (UE-1) is identical to $R^1$ of Group (UE).

Group (AN-1)

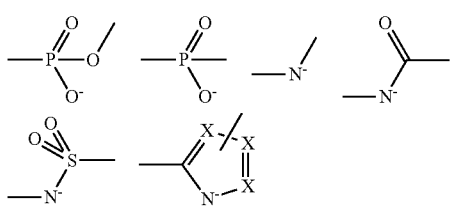

In Group (AN-1), X represents N or CR, and R is identical to R described in CR in Group (AN) described above.

A compound having at least two coordination portions is preferable as a specific aspect of the compound which becomes the ligand. Specifically, examples of the compound include a compound having one or more coordination portions performing coordination by an anion and one or more coordination atoms performing coordination by an unshared electron pair (hereinafter, also referred to as a compound (A1)), a compound having two or more coordination atoms performing coordination by an unshared electron pair (hereinafter, also referred to as a compound (A2)), a compound having two coordination portions performing coordination by an anion (hereinafter, also referred to as a compound (A3)), and the like. The compounds can be each independently used by combining one type or two or more types thereof.

In addition, one or more types selected from the compounds (A1) to (A3) and a compound having only one coordination portion (also referred to as a unidentate ligand) can be preferably used together as the ligand. In the unidentate ligand, examples of a ligand performing coordination by an anion include a halide anion ($Cl^-$, $F^-$, $Br^-$, and the like), a hydroxide anion, an alkoxide anion, a phenoxide anion, an amide anion (including amide substituted with an acyl group or a sulfonyl group), an imide anion (including imide substituted with an acyl group or a sulfonyl group), an anilide anion (including anilide substituted with an acyl group or a sulfonyl group), a thiolate anion, a hydrogen carbonate anion, a carboxylate anion, a thiocarboxylate anion, a dithiocarboxylate anion, a hydrogen sulfate anion, a sulfonate anion, a dihydrogen phosphate anion, a phosphoric acid diester anion, a phosphonic acid monoester anion, a hydrogen phosphonate anion, a phosphinate anion, nitrogen-containing heterocyclic anion, a nitrate anion, a hypochlorite anion, a cyanide anion, a cyanate anion, an isocyanate anion, a thiocyanate anion, an isothiocyanate anion, an azide anion, and the like. Examples of a unidentate ligand performing coordination by an unshared electron pair include water, alcohol, phenol, ether, amine, aniline, amide, imide, imine, nitrile, isonitrile, thiol, thioether, a carbonyl compound, a thiocarbonyl compound, sulfoxide, a hetero ring, a carbonic acid, a carboxylic acid, a sulfuric acid, a sulfonic acid, a phosphoric acid, a phosphonic acid, a phosphinic acid, a nitric acid, or ester thereof.

The type and the number of unidentate ligands can be suitably selected according to the compound (A) coordinating with a copper complex.

<<Compound (A1)>>

In the compound (A1), the total of the coordination portion performing coordination by an anion and the coordination atom performing coordination by an unshared electron pair in one molecule may be greater than or equal to 2, may also be 3, or may also be 4. The total of the coordination portion performing coordination by an anion and the coordination atom performing coordination by an unshared electron pair in one molecule may be greater than or equal to 4.

For example, a compound represented by Formula (i-1) described below is preferable as the compound (A1).

$$X^{11}\text{-}L^{11}\text{-}Y^{11} \tag{i-1}$$

$X^{11}$ represents the coordination portion represented by Group (AN) described above.

$Y^{11}$ represents the ring containing a coordination atom performing coordination by an unshared electron pair or a partial structure represented by Group (UE) described above.

$L^{11}$ represents a single bond or a divalent linking group. An alkylene group having 1 to 12 carbon atoms, an arylene group having 6 to 12 carbon atoms, —SO—, —$SO_2$—, —O—, or a group formed of a combination thereof is preferable as the divalent linking group.

Specific examples of the compound (A1) also include compounds represented by General Formulas (i-2) to (i-9) described below.

$$X^{12}\text{-}L^{12}\text{-}Y^{12}\text{-}L^{13}\text{-}X^{13} \tag{i-2}$$

$$Y^{13}\text{-}L^{14}\text{-}Y^{14}\text{-}L^{15}\text{-}X^{14} \tag{i-3}$$

$$Y^{15}\text{-}L^{16}\text{-}X^{15}\text{-}L^{17}\text{-}X^{16} \tag{i-4}$$

$$Y^{16}\text{-}L^{18}\text{-}X^{17}\text{-}L^{19}\text{-}Y^{17} \tag{i-5}$$

$$X^{18}\text{-}L^{20}\text{-}Y^{18}\text{-}L^{21}\text{-}Y^{19}\text{-}L^{22}\text{-}X^{19} \tag{i-6}$$

$$X^{19}\text{-}L^{23}\text{-}Y^{20}\text{-}L^{24}\text{-}Y^{21}\text{-}L^{25}\text{-}Y^{22} \tag{i-7}$$

$$Y^{23}\text{-}L^{26}\text{-}X^{20}\text{-}L^{27}\text{-}X^{21}\text{-}L^{28}\text{-}Y^{24} \tag{i-8}$$

$$Y^{25}\text{-}L^{29}\text{-}X^{22}\text{-}L^{30}\text{-}Y^{26}\text{-}L^{31}\text{-}Y^{27} \tag{i-9}$$

In General Formulas (i-2) to (i-9), $X^{12}$ to $X^{14}$, $X^{18}$, and $X^{19}$ each independently represent the coordination portion represented by Group (AN) described above. In addition, $X^{15}$, $X^{17}$, and $X^{20}$ to $X^{22}$ each independently represent the coordination portion represented by Group (AN-1) described above.

In General Formulas (i-2) to (i-9), $L^{12}$ to $L^{31}$ each independently represent a single bond or a divalent linking group. The divalent linking group is identical to a case where $L^1$ in General Formula (i-1) represents a divalent linking group.

A compound represented by Formula (i-10) or Formula (i-11) is preferable as the compound (A1).

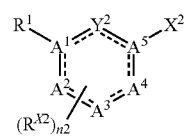

Formula (i-10)

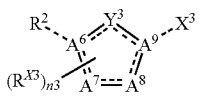
Formula (i-11)

In Formula (i-10), $X^2$ represents a group having the coordination portion performing coordination by an anion. $Y^2$ represents an oxygen atom, a nitrogen atom, a sulfur atom, or a phosphorus atom. $A^1$ and $A^5$ each independently represent a carbon atom, a nitrogen atom, or a phosphorus atom. $A^2$ to $A^4$ each independently represent a carbon atom, an oxygen atom, a nitrogen atom, a sulfur atom, or a phosphorus atom. $R^1$ represents a substituent. $R^{X2}$ represents a substituent. n2 represents an integer of 0 to 3.

In Formula (i-10), $X^2$ may be formed of only the group having the coordination portion performing coordination by an anion described above, or the group having the coordination portion performing coordination by an anion described above may have a substituent. Examples of the substituent that the group having the coordination portion performing coordination by an anion may have include a halogen atom, a carboxyl group, and a heterocyclic group. The heterocyclic group as the substituent may be a monocyclic group or a polycyclic group, and may be an aromatic group or a non-aromatic group. The number of hetero atoms configuring the hetero ring is preferably 1 to 3. The hetero atom configuring the hetero ring is preferably a nitrogen atom.

In Formula (i-10), $Y^2$ is preferably an oxygen atom, a nitrogen atom, or a sulfur atom, is more preferably an oxygen atom or a nitrogen atom, and is even more preferably a nitrogen atom.

In Formula (i-10), $A^1$ and $A^5$ are preferably carbon atoms.

In Formula (i-10), it is preferable that $A^2$ and $A^3$ represent a carbon atom. It is preferable that $A^4$ represents a carbon atom or a nitrogen atom.

In Formula (i-10), $R^1$ is identical to the substituent that the ring containing a coordination atom performing coordination by an unshared electron pair described above may have.

In Formula (i-10), $R^{X2}$ is identical to the substituent that the ring containing a coordination atom performing coordination by an unshared electron pair described above may have, and the preferred range thereof is also identical to that of the substituent that the ring containing a coordination atom performing coordination by an unshared electron pair described above may have.

In Formula (i-10), n2 represents an integer of 0 to 3, is preferably 0 or 1, and is more preferably 0.

In the compound represented by Formula (i-10), a hetero ring having $Y^2$ may have a monocyclic structure, or may have a polycyclic structure. Specific examples of a case where the hetero ring having $Y^2$ has the monocyclic structure include a pyridine ring, a pyridazine ring, a pyrimidine ring, a pyrazine ring, a triazine ring, a pyran ring, and the like. Specific examples of a case where the hetero ring having $Y^2$ has the polycyclic structure include a quinoline ring, an isoquinoline ring, a quinoxaline ring, an acridine ring, and the like.

In Formula (i-11), $X^3$ represents a group having the coordination portion performing coordination by an anion described above. $Y^3$ represents an oxygen atom, a nitrogen atom, a sulfur atom, or a phosphorus atom. $A^6$ and $A^9$ each independently represent a carbon atom, a nitrogen atom, or a phosphorus atom. $A^7$ and $A^8$ each independently represent a carbon atom, an oxygen atom, a nitrogen atom, a sulfur atom, or a phosphorus atom. $R^2$ represents a substituent. $R^{X3}$ represents a substituent. n3 represents an integer of 0 to 2.

In Formula (i-11), $X^3$ is identical to $X^2$ of Formula (i-10), and the preferred range thereof is also identical to that of $X^2$ of Formula (i-10).

In Formula (i-3), $Y^3$ is preferably an oxygen atom, a nitrogen atom, or a sulfur atom, and is more preferably an oxygen atom or a nitrogen atom.

In Formula (i-11), $A^6$ is preferably a carbon atom or a nitrogen atom. $A^9$ is preferably a carbon atom.

In Formula (i-11), $A^7$ is preferably a carbon atom. $A^8$ is preferably a carbon atom, a nitrogen atom, or a sulfur atom.

In Formula (i-11), $R^2$ is preferably a hydrophobic substituent, is more preferably a hydrocarbon group having 1 to 30 carbon atoms, is even more preferably an alkyl group having 3 to 30 carbon atoms or an aryl group having 6 to 30 carbon atoms, and is particularly preferably an alkyl group having 3 to 15 carbon atoms.

In Formula (i-11), $R^{X3}$ is identical to $R^{X2}$ of Formula (i-10), and the preferred range thereof is also identical to that of $R^{X2}$ of Formula (i-10).

In Formula (i-11), n3 is preferably 0 or 1, and is more preferably 0.

In the compound represented by Formula (i-11), a hetero ring having $Y^3$ may have a monocyclic structure, or may have a polycyclic structure. Specific examples of a case where the hetero ring having $Y^3$ has the monocyclic structure include a pyrazole ring, an imidazole ring, a triazole ring, an oxazole ring, a thiazole ring, an isothiazole ring, and the like. Specific examples of a case where the hetero ring having $Y^3$ has the polycyclic structure include an indole ring, an isoindole ring, a benzofuran ring, an isobenzofuran ring, and the like.

In particular, it is preferable that the compound represented by Formula (i-11) is a compound having a pyrazole ring, and has a secondary alkyl group or a tertiary alkyl group on a 5-position of the pyrazole ring. Herein, the 5-position of the pyrazole ring in a case where the compound represented by Formula (i-11) is the compound having the pyrazole ring indicates a substitution position of $R^2$ in a case where $Y^3$ and $A^6$ in (i-3) described above represent a nitrogen atom, and $A^7$ to $A^9$ represent a carbon atom. The number of carbon atoms of the secondary alkyl group or the tertiary alkyl group on the 5-position of the pyrazole ring is preferably 3 to 15, and is more preferably 3 to 12.

The molecular weight of the compound (A1) is preferably less than or equal to 1,000, is more preferably less than or equal to 750, and is even more preferably less than or equal to 600. In addition, the molecular weight of the compound (A1) is preferably greater than or equal to 50, and is more preferably greater than or equal to 80.

Specific examples of the compound (A 1) include compounds described below and salts thereof. Examples of atoms configuring the salt include a metal atom, tetrabutyl ammonium, and the like. An alkali metal atom or an alkali earth metal atom is more preferable as the metal atom. Examples of the alkali metal atom include sodium, potassium, and the like. Examples of the alkali earth metal atom include calcium, magnesium, and the like.

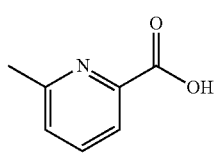

(A1-1)

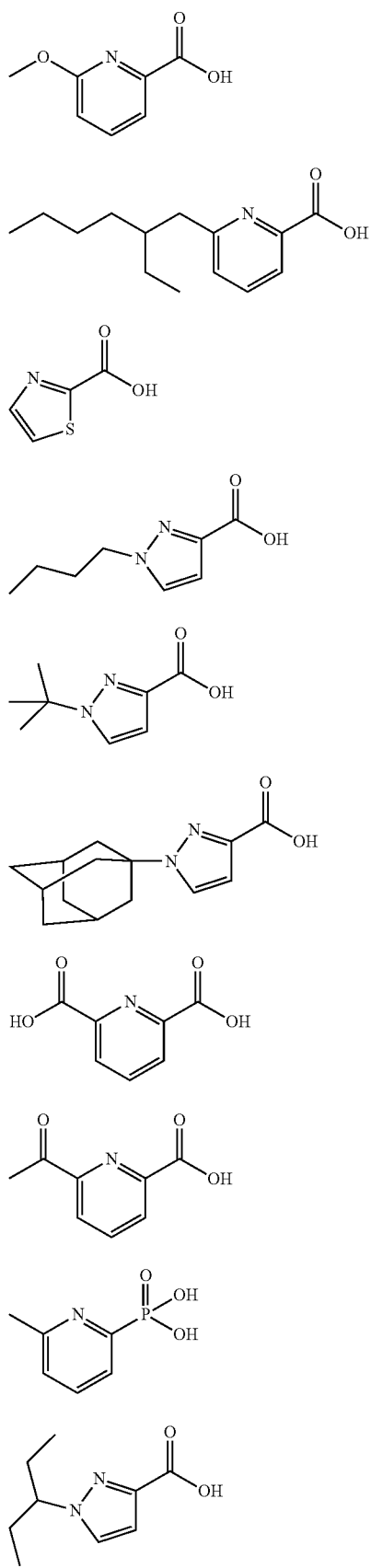
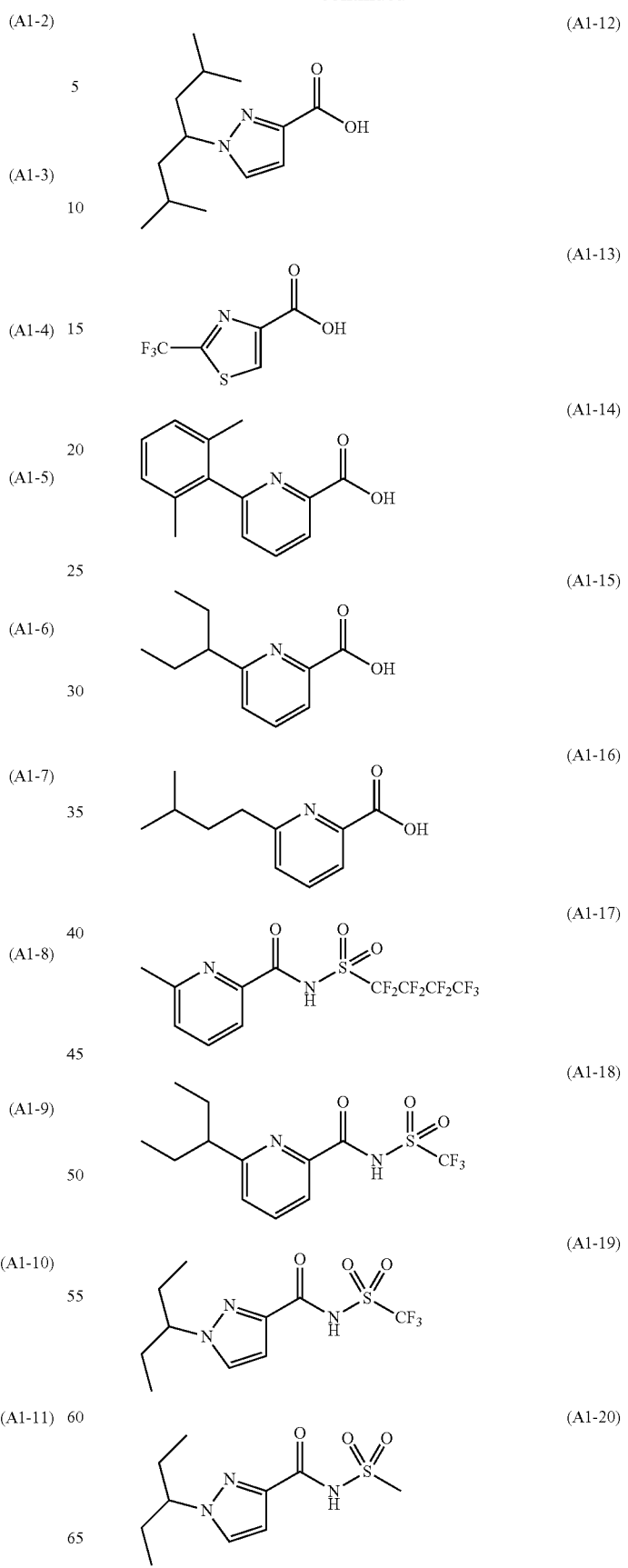

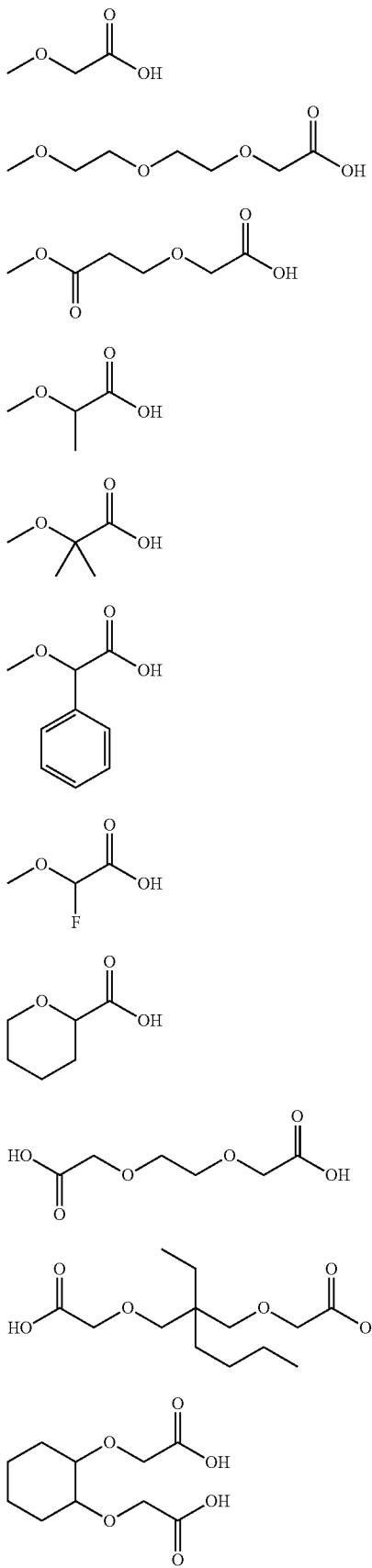
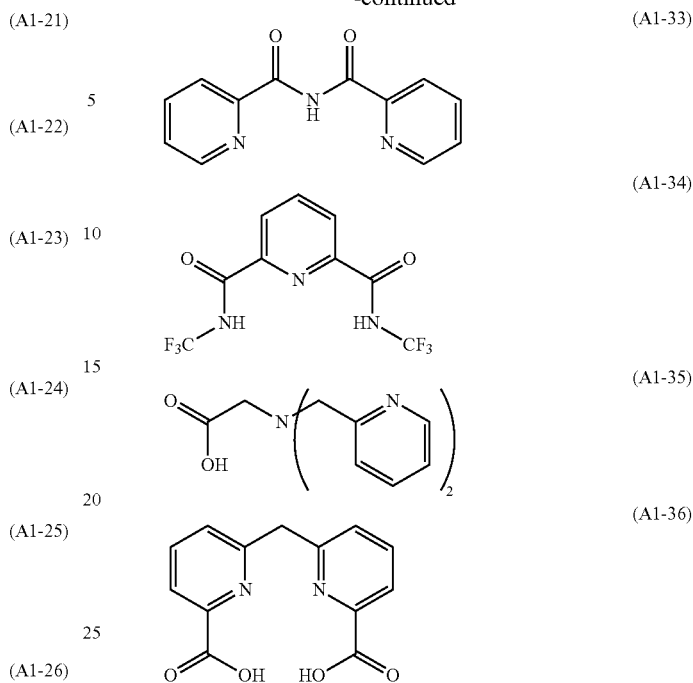

<<Compound (A2)>>

The compound (A2) may have two or more coordination atoms performing coordination by an unshared electron pair in one molecule, or may have three or more coordination atoms performing coordination by an unshared electron pair in one molecule, and is preferably has 2 to 4 coordination atoms performing coordination by an unshared electron pair in one molecule. The compound (A2) may have 4 or more coordination atoms performing coordination by an unshared electron pair in one molecule.

The compound (A2), for example, is preferably a compound represented by General Formula (ii-1) described below.

$$Y^{40}\text{-}L^{40}\text{-}Y^{41} \tag{ii-1}$$

In General Formula (ii-1), $Y^{40}$ and $Y^{41}$ each independently represent a ring containing a coordination atom performing coordination by an unshared electron pair or a partial structure represented by Group (UE).

In General Formula (ii-1), $L^{40}$ represents a single bond or a divalent linking group. In a case where $L^1$ represents the divalent linking group, an alkylene group having 1 to 12 carbon atoms, an arylene group having 6 to 12 carbon atoms, —SO—, —O—, —SO$_2$—, or a group formed of a combination thereof is preferable, and an alkylene group having 1 to 3 carbon atoms, a phenylene group, or —SO$_2$— is more preferable.

More specific examples of the compound (A2) also include compound represented by General Formula (ii-2) or (ii-3) described below.

$$Y^{42}\text{-}L^{41}\text{-}Y^{43}\text{-}L^{42}\text{-}Y^{44} \tag{ii-2}$$

$$Y^{45}\text{-}L^{43}\text{-}Y^{46}\text{-}L^{44}\text{-}Y^{47}\text{-}L^{45}\text{-}Y^{48} \tag{ii-3}$$

In General Formulas (ii-2) and (ii-3), $Y^{42}$, $Y^{44}$, $Y^{45}$, and $Y^{48}$ each independently represent a ring containing a coordination atom performing coordination by an unshared electron pair or a partial structure represented by Group (UE).

In addition, $Y^{43}$, $Y^{46}$, and $Y^{47}$ each independently represent a ring containing a coordination atom performing coordination by an unshared electron pair or a partial structure represented by Group (UE-1) described above.

In General Formulas (ii-2) and (ii-3), $L^{41}$ to $L^{48}$ each independently represent a single bond or a divalent linking group. The divalent linking group is identical to a case where $L^{40}$ of General Formula (ii-1) represents a divalent linking group, and the preferred range thereof is also identical to that of the case described above.

The molecular weight of the compound (A2) is preferably less than or equal to 1,000, is more preferably less than or equal to 750, and is even more preferably less than or equal to 600. In addition, the molecular weight of the compound (A2) is preferably greater than or equal to 50, is more preferably greater than or equal to 80.

Specific examples of the compound (A2) include the followings.

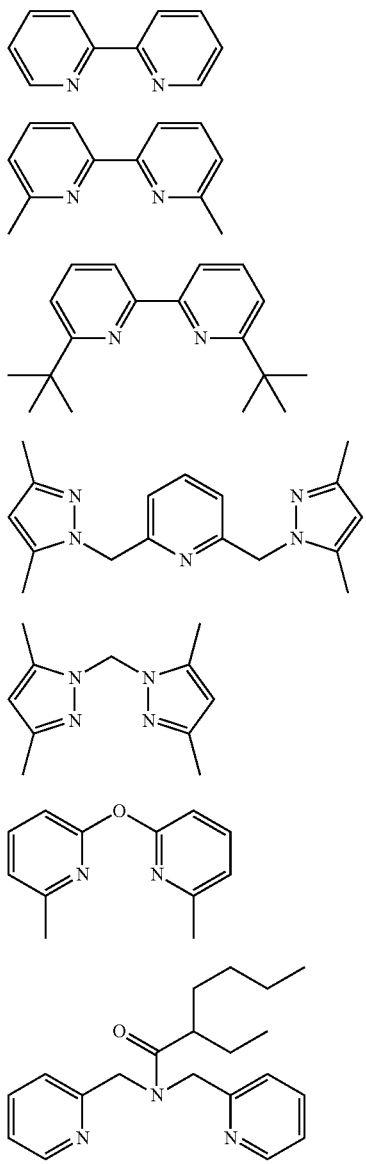

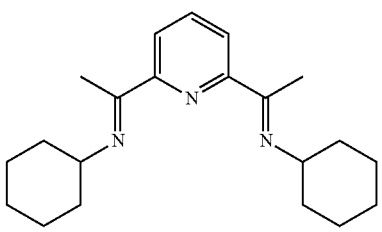

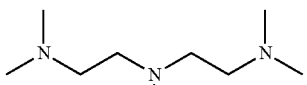

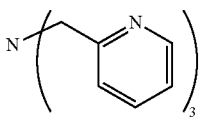

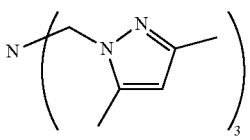

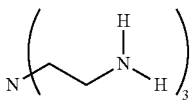

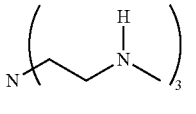

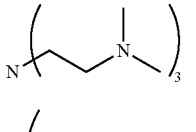

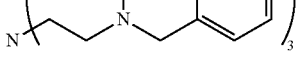

<<Compound (A3)>>

The compound (A3) has two coordination portions performing coordination by an anion. The coordination portion performing coordination by an anion is identical to the coordination portion performing coordination by an anion described above.

A compound represented by General Formula (iii-1) described below is preferable as the compound (A3).

$$X^{50}\text{-}L^{50}\text{-}X^{51} \qquad \text{(iii-1)}$$

In General Formula (iii-1), $X^{50}$ and $X^{51}$ each independently represent a coordination portion performing coordination by an anion, which is identical to the coordination portion performing coordination by an anion described above, and a monoanionic coordination portion is preferable.

In General Formula (iii-1), $L^{50}$ represents a single bond or a divalent linking group. An alkylene group having 1 to 20 carbon atoms, an alkenylene group having 2 to 10 carbon atoms, an arylene group having 6 to 18 carbon atoms, a heterocyclic group, —O—, —S—, —NR$^{N1}$—, —CO—, —CS—, —SO$_2$—, or a group formed of a combination thereof is preferable as the divalent linking group. R$^{N1}$ is preferably a hydrogen atom, an alkyl group having 1 to 12 carbon atoms, an aryl group having 6 to 18 carbon atoms, or an aralkyl group having 7 to 20 carbon atoms.

The compound (A3) preferably contains one or more types selected from a sulfo group and a carboxyl group, and more preferably contains a sulfo group and a carboxyl group. By using the compound containing at least one type selected from the sulfo group and the carboxyl group, it is possible to further improve a color valency.

The molecular weight of the compound (A3) is preferably less than or equal to 1,000, is more preferably less than or equal to 750, and is even more preferably less than or equal to 600. In addition, the molecular weight of the compound (A3) is preferably greater than or equal to 50, and is more preferably greater than or equal to 80.

Specific examples of the compound (A3) include the following compounds and salts thereof. Atoms configuring the salt are identical to those described above, and the preferred ranges thereof are identical to those described above.

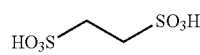
(A3-1)

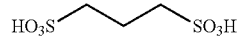
(A3-2)

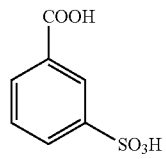
(A3-3)

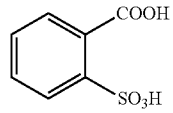
(A3-4)

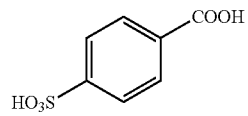
(A3-5)

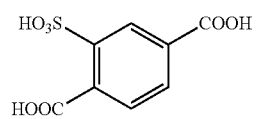
(A3-6)

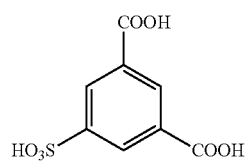
(A3-7)

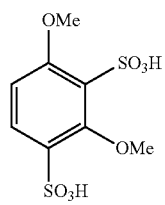
(A3-8)

-continued

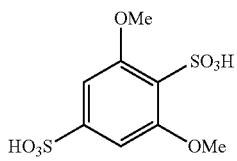
(A3-9)

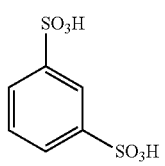
(A3-10)

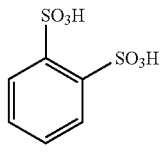
(A3-11)

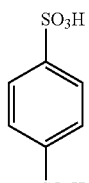
(A3-12)

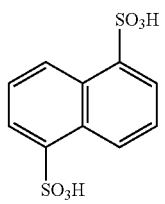
(A3-13)

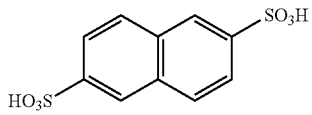
(A3-14)

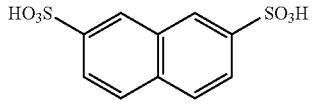
(A3-15)

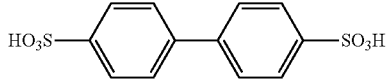
(A3-16)

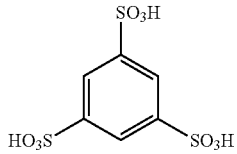
(A3-17)

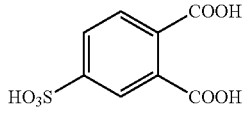
(A3-18)

<<<<Polymer Type Copper Compound>>>>

In the present invention, it is possible to use a polymer having a coordination portion (also referred to as a polymer (B)) and a polymer type copper compound (also referred to as a polymer copper compound) which is obtained by a reaction with a copper component, as a copper compound.

In the polymer copper compound, it is considered that a coordination atom (an unshared electron pair, an anion, and the like) of the polymer (B) coordinates with copper of the copper component, and thus, the structure of the polymer copper compound is distorted, high transmittance in a visible light range is obtained, light absorption power of a near infrared ray is improved, and a color valency is also improved. In addition, in the polymer copper compound, a crosslinking structure is formed between side chains of the polymer (B) beginning at the copper, and thus, a film having excellent heat resistance is obtained.

Examples of the copper component include those described above.

Examples of the coordination portion include a coordination portion performing coordination with a copper component by an anion, a coordination atom performing coordination with a copper component by an unshared electron pair, and the like.

An oxygen anion, a nitrogen anion, or a sulfur anion is preferable as the coordination portion performing coordination with a copper component by an anion.

The coordination atom performing coordination with a copper component by an unshared electron pair preferably contains an oxygen atom, a nitrogen atom, a sulfur atom, or a phosphorus atom, more preferably contains an oxygen atom, a nitrogen atom, or a sulfur atom, and even more preferably contains a nitrogen atom.

Specific examples thereof include those described in the low molecular type copper compound described above, and the preferred ranges thereof are also identical to those described above.

It is preferable that the polymer (B) contains a group represented by Formula (1) described below on a side chain.

In General Formula (1), L represents a single bond or a linking group, $Y^1$ represents a group having one or more types selected from a coordination portion performing coordination with a copper component by an anion and a coordination atom performing coordination with a copper component by an unshared electron pair, and * represents a linking hand with respect to a polymer.

In General Formula (1), $Y^1$ represents a group having one or more types selected from a coordination portion performing coordination with a copper component by an anion and a coordination atom performing coordination with a copper component by an unshared electron pair, and a group having two or more coordination portions performing coordination by an anion, a group having two or more coordination atoms performing coordination by an unshared electron pair, or a group having one or more coordination atoms performing coordination by an unshared electron pair and one or more coordination portions performing coordination by an anion is preferable.

In General Formula (1), in a case where $L^1$ represents a linking group, examples of a divalent linking group include an alkylene group, an arylene group, a heteroarylene group, —O—, —S—, —CO—, —COO—, —OCO—, —SO$_2$—, —NR$^{10}$— (R$^{10}$ represents a hydrogen atom or an alkyl group, and the hydrogen atom is preferable), or a group formed of a combination thereof.

The number of carbon atoms of the alkylene group is preferably 1 to 30, is more preferably 1 to 15, and is even more preferably 1 to 10. The alkylene group may have a substituent, and a non-substituted alkylene group is preferable. The alkylene group may be any one of a linear alkylene group, a branched alkylene group, and a cyclic alkylene group. In addition, the cyclic alkylene group may be any one of a monocyclic alkylene group and a polycyclic alkylene group.

The number of carbon atoms of the arylene group is preferably 6 to 18, is more preferably 6 to 14, and is even more preferably 6 to 10, and a phenylene group is particularly preferable.

The heteroarylene group is not particularly limited, but a 5-membered ring or a 6-membered ring is preferable. Examples of the hetero atom include an oxygen atom, a nitrogen atom, and a sulfur atom. The number of hetero atoms is preferably 1 to 3. The heteroarylene group may be a monocyclic ring or a fused ring, a monocyclic ring or a fused ring having 2 to 8 condensations is preferable, and a monocyclic ring or a fused ring having 2 to 4 condensation is more preferable.

In a case where $L^1$ represents a trivalent or higher linking group, examples thereof include the groups exemplified as the divalent linking group described above from which one or more hydrogen atoms are removed.

<<<<<Group Having Coordination Atom Performing Coordination by Unshared Electron Pair>>>>>

In General Formula (1) described above, in a case where $Y^1$ represents a group having a coordination atom performing coordination by an unshared electron pair, examples of $Y^1$ include groups represented by Formula (1a1) or (1a2) described below.

"*" represents a linking hand with respect to $L^1$ of Formula (1).

$L^{11}$ represents a single bond or a (p+1)-valent linking group. In a case where $L^{11}$ represents a divalent linking group, an alkylene group having 1 to 12 carbon atoms, an arylene group having 6 to 12 carbon atoms, —CO—, —COO—, —OCO—, —SO$_2$—, —O—, —NR$^{10}$— (R$^{10}$ represents a hydrogen atom or an alkyl group, and the hydrogen atom is preferable), or a group formed of a combination thereof is preferable.

In a case where $L^{11}$ represents a trivalent or higher linking group, examples thereof include the groups exemplified as the divalent linking group described above from which one or more hydrogen atoms are removed.

$L^{12}$ represents a single bond or a divalent linking group. Examples of the divalent linking group preferably include the divalent linking group described in $L^{11}$. $L^{12}$ is more preferably a single bond, an alkylene group, or a group formed of a combination between —NH— and —CO—.

$Y^{11}$ represents a ring containing a coordination atom performing coordination by an unshared electron pair or a partial structure represented by Group (UE) described above. In a case where p represents an integer of greater than or equal to 2, a plurality of $Y^{11}$'s may be identical to each other, or may be different from each other.

$Y^{11a}$ represents a ring containing a coordination atom performing coordination by an unshared electron pair or at least one type selected from Group (UE-1) described above. In a case where p represents an integer of greater than or equal to 2, a plurality of $Y^{11a}$'s may be identical to each other, or may be different from each other.

In Formulas (1a1) and (1a2), p represents an integer of greater than or equal to 1, and is preferably greater than or equal to 2. The upper limit, for example, is preferably less than or equal to 5, and is more preferably less than or equal to 3.

<<<<<Group Having One or More Coordination Atoms Performing Coordination by Unshared Electron Pair and One or More Coordination Portions Performing Coordination by Anion>>>>>

In General Formula (1) described above, in a case where $Y^1$ represents a group having one or more coordination atoms performing coordination by an unshared electron pair and one or more coordination portions performing coordination by an anion, examples of $Y^1$ include groups represented by the following formulas.

  (1b1)

  (1b2)

  (1b3)

  (1b4)

  (1b5)

  (1b6)

  (1b7)

"*" represents a linking hand with respect to $L^1$ of Formula (1).

$L^{21}$ represents a single bond or a (q+1)-valent linking group. $L^{21}$ is identical to $L^{11}$ of Formula (1a1), and the preferred range thereof is also identical to that of $L^{11}$ of Formula (1a1).

$L^{22}$ represents a single bond or a (q+r+1)-valent linking group. $L^{22}$ is identical to $L^{11}$ of Formula (1a1), and the preferred range thereof is also identical to that of $L^{11}$ of Formula (1a1).

$L^{23}$ represents a single bond or a divalent linking group. Examples of the divalent linking group preferably include the divalent linking group described in $L^{11}$ of Formula (1a1). $L^{23}$ is more preferably a single bond, an alkylene group, or a group formed of a combination between —NH— and —CO—.

$Y^{21}$ represents a ring containing a coordination atom performing coordination by an unshared electron pair or a partial structure represented by Group (UE) described above. In a case where q and r represent an integer of greater than or equal to 2, a plurality of $Y^{21}$'s may be identical to each other, or may be different from each other.

$Y^{21a}$ represents a ring containing a coordination atom performing coordination by an unshared electron pair or at least one type selected from Group (UE-1) described above. In a case where q and r represent integer of greater than or equal to 2, a plurality of $Y^{21a}$'s may be identical to each other, or may be different from each other.

$Y^{22}$ represents a partial structure represented by Group (AN) described above. In a case where q and r represent an integer of greater than or equal to 2, a plurality of $Y^{22}$'s may be identical to each other, or may be different from each other.

$Y^{22a}$ represents at least one type selected from Group (AN-1) described above.

q represents an integer of greater than or equal to 1, is preferably 1 to 5, and is particularly preferably 1 to 3.

r represents an integer of greater than or equal to 1, is preferably 1 to 5, and is particularly preferably 1 to 3.

q+r represents an integer of greater than or equal to 2, is preferably 2 to 5, and is particularly preferably 2 to 3.

<<<<<Group Having Coordination Portion Performing Coordination by Anion>>>>>

In General Formula (1) described above, in a case where $Y^1$ represents a group having a coordination portion performing coordination by an anion, examples of $Y^1$ include groups represented by Formula (1c1) or (1c2) described below.

  (1c1)

  (1c2)

"*" represents a linking hand with respect to $L^1$ of Formula (1).

$L^{31}$ represents a single bond or a (p+1)-valent linking group. $L^{31}$ is identical to $L^{11}$ of Formula (1a1), and the preferred range thereof is also identical to that of $L^{11}$ of Formula (1a1).

$L^{32}$ represents a single bond or a divalent linking group. The divalent linking group is identical to the divalent linking group of $L^{12}$ of Formula (1a2), and the preferred range thereof is also identical to that of the divalent linking group of $L^{12}$ of Formula (1a2).

$Y^{31}$ represents a partial structure represented by Group (AN) described above. In a case where p represents an integer of greater than or equal to 2, a plurality of $Y^{31}$'s may be identical to each other, or may be different from each other. $Y^{31a}$ represents at least one type selected from Group (AN-1) described above. In a case where p represents an integer of greater than or equal to 2, a plurality of $Y^{31a}$'s may be identical to each other, or may be different from each other.

In Formulas (1c1) and (1c2), p represents an integer of greater than or equal to 1, and is preferably greater than or equal to 2. The upper limit, for example, is preferably less than or equal to 5, and is more preferably less than or equal to 3.

It is preferable that the polymer (B) has a repeating unit represented by Formula (B1-1) described below.

(B1-1)

In Formula (B1-1), $R^1$ represents a hydrogen atom or a hydrocarbon group, $L^1$ represents a single bond or a linking group, and $Y^1$ represents a group having one or more types selected from a coordination portion performing coordination with a copper component by an anion and a coordination atom performing coordination with a copper component by an unshared electron pair.

In Formula (B1-1), $R^1$ represents a hydrogen atom or a hydrocarbon group. Examples of the hydrocarbon group include a linear aliphatic hydrocarbon group, a branched aliphatic hydrocarbon group, or a cyclic aliphatic hydrocarbon group, or an aromatic hydrocarbon group. The hydrocarbon group may have a substituent, and a non-substituted hydrocarbon group is preferable. The number of carbon atoms of the hydrocarbon group is preferably 1 to 10, is more preferably 1 to 5, and is even more preferably 1 to 3. The hydrocarbon group is preferably a methyl group. $R^1$ is preferably a hydrogen atom or a methyl group.

$L^1$ and $Y^1$ of Formula (B1-1) are identical to $L^1$ and $Y^1$ of Formula (1) described above, and the preferred ranges thereof are also identical to those of $L^1$ and $Y^1$ of Formula (1).

Examples of the repeating unit represented by Formula (B1-1) include repeating units represented by (B1-1-1) to (B1-1-4) described below. (B1-1-1) and (B1-1-2) described below are preferable.

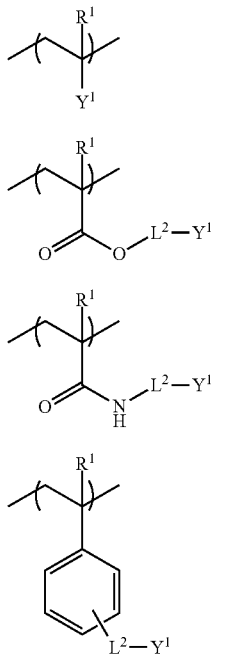

In Formulas (B-1-1) to (B1-1-4), $R^1$ represents a hydrogen atom or a hydrocarbon group, $L^2$ represents a single bond or a linking group, $Y^1$ represents a group having one or more types selected from a coordination portion performing coordination with a copper component by an anion and a coordination atom performing coordination with a copper component by an unshared electron pair, and $R^2$ and $R^3$ each independently represent a hydrogen atom or an alkyl group.

$R^1$ in Formulas (B-1-1) to (B1-1-4) is identical to $R^1$ in Formula (B1-1), and the preferred range thereof is also identical to that of $R^1$ in Formula (B1-1).

$Y^1$ in Formulas (B1-1-1) to (B1-1-4) is identical to $Y^1$ in Formula (B1-1), and the preferred range thereof is also identical to that of $Y^1$ in Formula (B1-1).

$L^2$ in Formulas (B1-1-2) to (B1-1-4) is identical to $L^1$ Formula (B1-1), and the preferred range thereof is also identical to that of $L^1$ in Formula (B1-1).

A linear alkyl group or a branched alkyl group having 1 to 10 carbon atoms is preferable as the alkyl group represented by $R^3$ and $R^4$ in Formula (B1-1-4), a linear alkyl group having 1 to 3 carbon atoms is more preferable, and a methyl group is even more preferable. It is particularly preferable that both of $R^3$ and $R^4$ represent a methyl group.

The polymer (B) may contain other constitutional units in addition to the constitutional unit represented by Formula (B1-1).

Components configuring the other constitutional unit can be referred to the description of copolymerization components disclosed in paragraphs 0068 to 0075 of JP2010-106268A ([0112] to [0118] of the specification of corresponding US2011/0124824A), and the contents thereof are incorporated herein.

Preferred examples of the other constitutional unit include constitutional units represented by Formula (B2-1) described below.

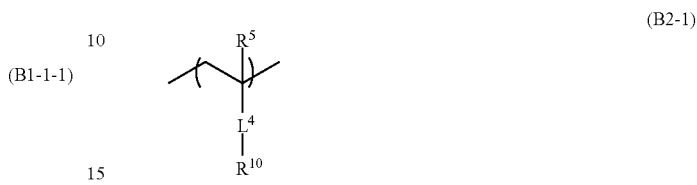

In Formula (B2-1), $R^5$ represents a hydrogen atom or a hydrocarbon group, $L^4$ represents a single bond or a divalent linking group, and $R^{11}$ represents an alkyl group or an aryl group.

$R^5$ of Formula (B2-1) is identical to $R^1$ of Formula (B1-1), and the preferred range thereof is also identical to that of $R^1$ of Formula (B1-1).

$L^4$ of Formula (B2-1) is identical to $L^1$ of Formula (B1-1), and the preferred range thereof is also identical to that of $L^1$ of Formula (B1-1).

The alkyl group represented by $R^{11}$ of Formula (B2-1) may be any one of a linear alkyl group, a branched alkyl group, and a cyclic alkyl group. The number of carbon atoms of the alkyl group is preferably 1 to 30, is more preferably 1 to 20, and is even more preferably 1 to 10. The alkyl group may have a substituent, and examples of the substituent include the substituents described above.

The aryl group represented by $R^{10}$ of Formula (B2-1) may be a monocyclic aryl group, or may be a polycyclic aryl group, and the monocyclic aryl group is preferable. The number of carbon atoms of the aryl group is preferably 6 to 18, is more preferably 6 to 12, and is even more preferably 6.

In a case where the polymer (B) has the other constitutional unit (preferably, the constitutional unit represented by Formula (B2-1)), a molar ratio of the constitutional unit represented by Formula (B1-1) to the other constitutional unit is preferably 95:5 to 20:80, and is more preferably 90:10 to 40:60.

In addition, a polymer which has a group having one or more types selected from a coordination portion performing coordination with a copper component by an anion and a coordination atom performing coordination with a copper component by an unshared electron pair, and has an aromatic hydrocarbon group and/or an aromatic heterocyclic group on a main chain (hereinafter, referred to as an aromatic group-containing polymer) may be used as the polymer (B). The aromatic group-containing polymer may have at least one type of the aromatic hydrocarbon group or the aromatic heterocyclic group on the main chain, or may have two or more types of the aromatic hydrocarbon group and the aromatic heterocyclic group on the main chain.

The number of carbon atoms of the aromatic hydrocarbon group is preferably 6 to 20, is more preferably 6 to 15, and is even more preferably 6 to 12. In particular, a phenyl group, a naphthyl group, or a biphenyl group is preferable. The aromatic hydrocarbon group may be a monocyclic aromatic hydrocarbon group or a polycyclic aromatic hydrocarbon group, and the monocyclic aromatic hydrocarbon group is preferable.

The number of carbon atoms of the aromatic heterocyclic group is preferably 2 to 30. The aromatic heterocyclic group is preferably a 5-membered ring or a 6-membered ring. The aromatic heterocyclic group is preferably a monocyclic ring or a fused ring having 2 to 8 condensations, and is more preferably a monocyclic ring or a fused ring having 2 to 4 condensations. A nitrogen atom, an oxygen atom, and a sulfur atom are exemplified as a hetero atom contained in the aromatic heterocyclic group, and the nitrogen atom or the oxygen atom is preferable.

It is preferable that the aromatic group-containing polymer is at least one type of polymer selected from a polyether sulfone-based polymer, a polysulfone-based polymer, a polyether ketone-based polymer, a polyphenylene ether-based polymer, a polyimide-based polymer, a polybenzimidazole-based polymer, a polyphenylene-based polymer, a phenol resin-based polymer, a polycarbonate-based polymer, a polyamide-based polymer, and a polyester-based polymer. Hereinafter, examples of each polymer will be described.

Polyether Sulfone-Based Polymer: a polymer having a main chain structure represented by (—O-Ph-SO$_2$-Ph-) (Ph represents a phenylene group, and the same applies to the following)

Polysulfone-Based Polymer: a polymer having a main chain structure represented by (—O-Ph-Ph-O-Ph-SO$_2$-Ph-)

Polyether Ketone-Based Polymer: a polymer having a main chain structure represented by (—O-Ph-O-Ph-C(=O)-Ph-)

Polyphenylene Ether-Based Polymer: a polymer having a main chain structure represented by (-Ph-O—, -Ph-S—)

Polyphenylene-Based Polymer: a polymer having a main chain structure represented by (-Ph-)

Phenol Resin-Based Polymer: a polymer having a main chain structure represented by (-Ph(OH)—CH$_2$—)

Polycarbonate-Based Polymer: a polymer having a main chain structure represented by (-Ph-O—C(=O)—O—)

As the polyamide-based polymer, for example, a polymer having a main chain structure represented by (-Ph-C(=O)—NH—)

As the polyester-based polymer, for example, a polymer having a main chain structure represented by (-Ph-C(=O)O—)

The polyether sulfone-based polymer, the polysulfone-based polymer, and the polyether ketone-based polymer, for example, can be referred to main chain structures described in paragraph 0022 of JP2006-310068A and paragraph 0028 of JP2008-27890A, and the contents thereof are incorporated herein. The polyimide-based polymer can be referred to main chain structures described in paragraphs 0047 to 0058 of JP2002-367627A and paragraphs 0018 to 0019 of JP2004-35891A, and the contents thereof are incorporated herein.

Preferred examples of the aromatic group-containing polymer preferably include aromatic group-containing polymers having a constitutional unit represented by Formula (B10-1) described below.

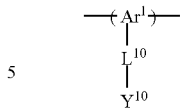

(B10-1)

(In Formula (B10-1), $Ar^1$ represents an aromatic hydrocarbon group and/or an aromatic heterocyclic group, $L^{10}$ represents a single bond or a divalent linking group, and $Y^{10}$ represents a group having one or more types selected from a coordination portion performing coordination with a copper component by an anion and a coordination atom performing coordination with a copper component by an unshared electron pair.)

In Formula (B10-1), in a case where $Ar^1$ represents an aromatic hydrocarbon group, the aromatic hydrocarbon group is identical to the aromatic hydrocarbon group described above, and the preferred range thereof is also identical to that of the aromatic hydrocarbon group described above. In a case where $Ar^1$ represents an aromatic heterocyclic group, the aromatic heterocyclic group is identical to the aromatic heterocyclic group described above, and the preferred range thereof is also identical to that of the aromatic heterocyclic group described above. $Ar^1$ may have a substituent. For example, an alkyl group, a polymerizable group (preferably, a polymerizable group having a carbon-carbon double bond), a halogen atom (a fluorine atom, a chlorine atom, a bromine atom, and an iodine atom), a carboxylic acid ester group, an alkyl halide group, an alkoxy group, a methacryloyloxy group, an acryloyloxy group, an ether group, a sulfonyl group, a sulfide group, an amide group, an acyl group, a hydroxy group, a carboxyl group, an aralkyl group, and the like are exemplified as the substituent, and the alkyl group (in particular, an alkyl group having 1 to 3 carbon atoms) is preferable as the substituent.

It is preferable that $L^{10}$ of Formula (B10-1) is a single bond. In a case where $L^{10}$ represents a divalent linking group, examples of the divalent linking group include the linking group described in $L^1$ of Formula (B1-1), and the preferred range thereof is also identical to that of the linking group described in $L^1$ of Formula (B1-1).

$Y^{10}$ of Formula (B10-1) is identical to $Y^1$ of Formula (B1-1), and the preferred range thereof is also identical to that of $Y^1$ of Formula (B1-1).

The weight-average molecular weight of the polymer (B) is preferably greater than or equal to 2,000, is more preferably 2,000 to 2,000,000, and is even more preferably 6,000 to 200,000. By setting the weight-average molecular weight of the polymer (B) to be in such a range, moisture resistance of a cured film to be obtained tends to be further improved.

Specific examples of the polymer (B) include compounds described below and salts of the compounds described below, but are not limited thereto. Examples of atoms configuring the salt include those described above.

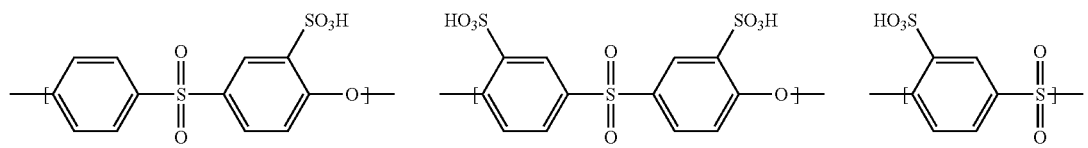

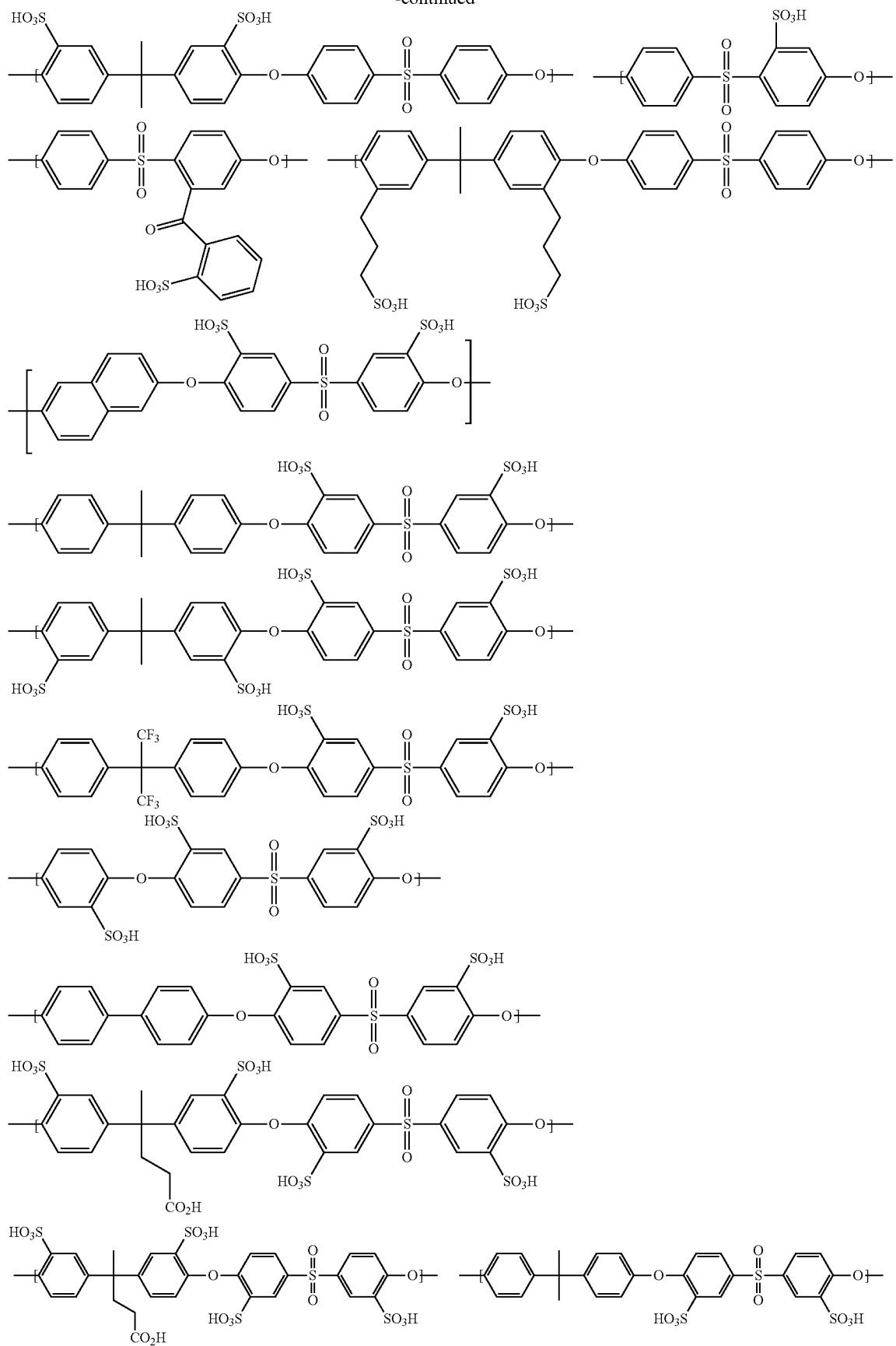

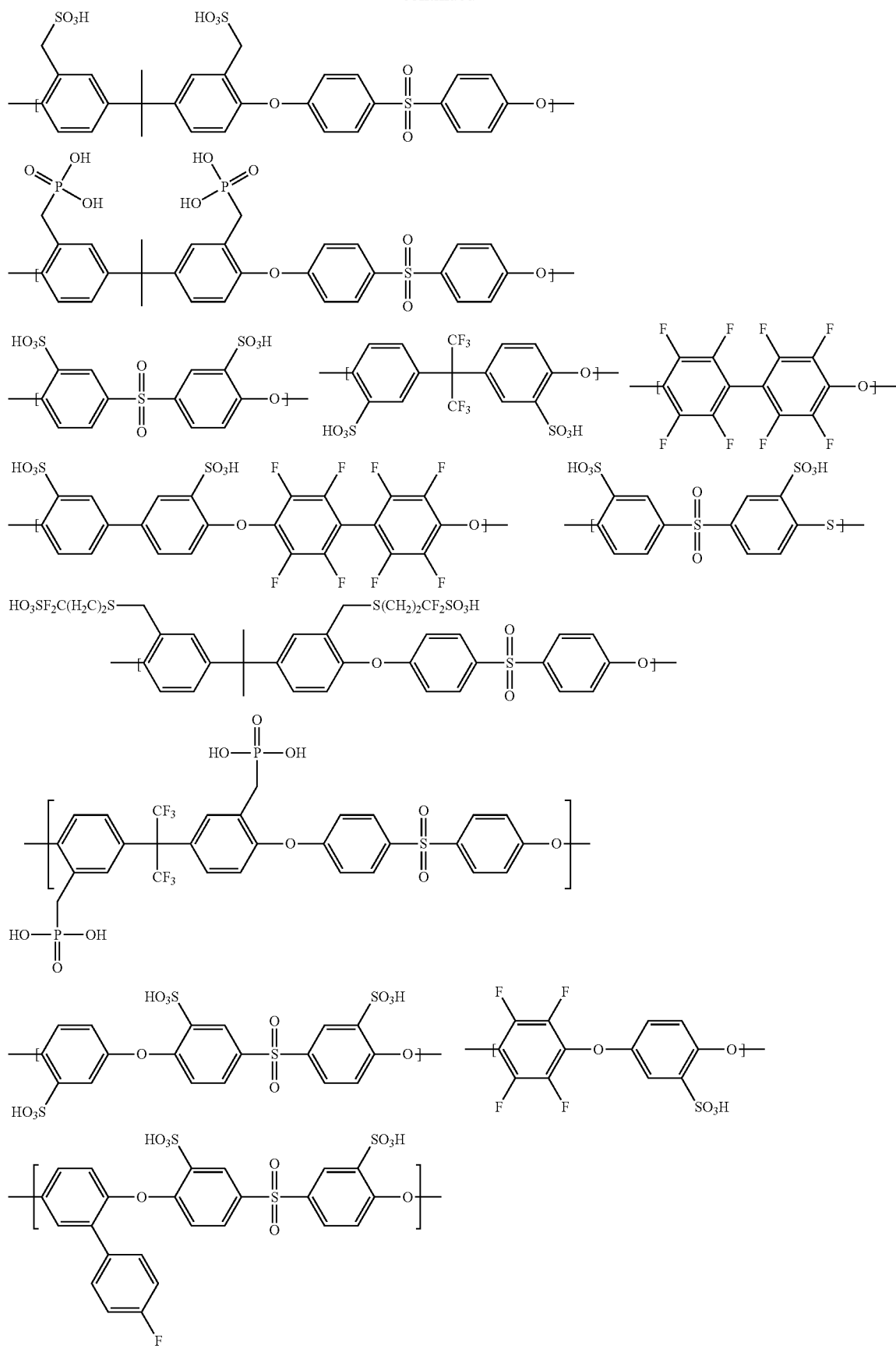

-continued
(P-B-1)
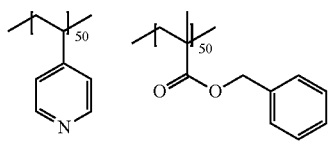
(P-B-2)
(P-B-3)
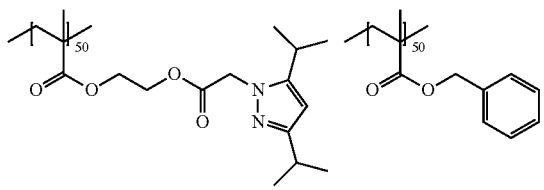
(P-B-4)
(P-B-5)
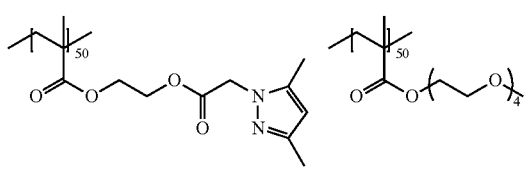
(P-B-6)
(P-B-7)
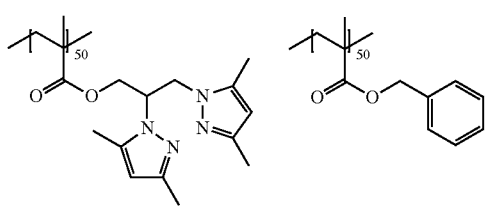
(P-B-8)
(P-B-9)
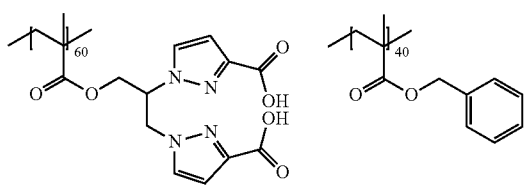
(P-B-10)
(P-B-11)
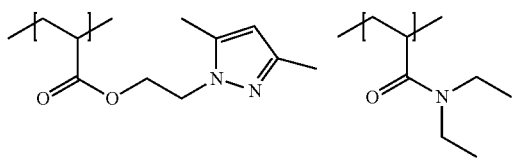
(P-B-12)
(P-B-13)
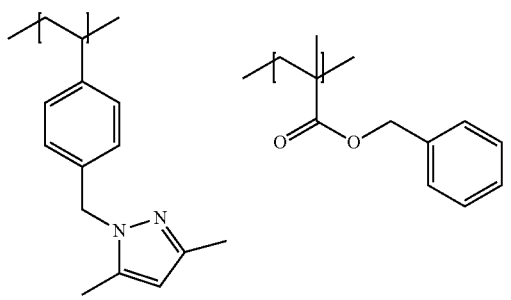
(P-B-14)

<<<Pyrrolo Pyrrole Compound>>>

A pyrrolo pyrrole compound is also preferable as the near infrared ray absorbent compound used in the present invention, and a compound represented by Formula (A1) described below is more preferable.

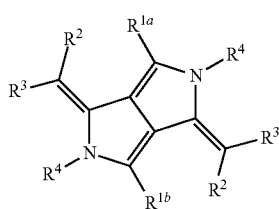

Formula (A1)

(In Formula (A1), $R^{1a}$ and $R^{1b}$ each independently represent an alkyl group, an aryl group, or a heteroaryl group. $R^2$ and $R^3$ each independently represent a hydrogen atom or a substituent, at least one of them is an electron-withdrawing group, and $R^2$ and $R^3$ may form a ring by being bonded to each other. $R^4$ represents a hydrogen atom, an alkyl group, an aryl group, a heteroaryl group, substituted boron, or a metal atom, and may subjected to covalent bonding or coordination bonding with at least one of $R^{1a}$, $R^{1b}$, or $R^3$.)

In Formula (A1), the alkyl group represented by $R^{1a}$ and $R^{1b}$ is preferably an alkyl group having 1 to 30 carbon atoms, is more preferably an alkyl group having 1 to 20 carbon atoms, and is particularly preferably an alkyl group having 1 to 10 carbon atoms.

The number of carbon atoms of the aryl group represented by $R^{1a}$ and $R^{1b}$ is preferably 6 to 30, is more preferably 6 to 20, and is particularly preferably 6 to 12.

The number of carbon atoms of the heteroaryl group represented by $R^{1a}$ and $R^{1b}$ is preferably 1 to 30, and is more preferably 1 to 12. Examples of a hetero atom can include a nitrogen atom, an oxygen atom, and a sulfur atom.

It is preferable that the group represented by $R^{1a}$ and $R^{1b}$ is an aryl group which has an alkoxy group having a branched alkyl group. An alkyl group having 3 to 30 carbon atoms is preferable, and an alkyl group having 3 to 20 carbon atoms is more preferable as the alkyl group of the branched alkyl group.

For example, 4-(2-ethyl hexyloxy) phenyl, 4-(2-methyl butyloxy) phenyl, and 4-(2-octyl dodecyloxy) phenyl are particularly preferable as the group represented by $R^{1a}$ and $R^{1b}$.

$R^{1a}$ and $R^{1b}$ of General Formula (A1) may be identical to each other or different from each other.

$R^2$ and $R^3$ each independently represent a hydrogen atom or a substituent T, at least one of them is an electron-withdrawing group, and $R^2$ and $R^3$ may form a ring by being bonded to each other. In particular, it is preferable that $R^2$ and $R^3$ each independently represent a cyano group or a heterocyclic group.

Examples of the substituent T can include the followings.

An alkyl group (preferably an alkyl group having 1 to 30 carbon atoms), an alkenyl group (preferably an alkenyl group having 2 to 30 carbon atoms), an alkynyl group (preferably an alkynyl group having 2 to 30 carbon atoms), an aryl group (preferably an aryl group having 6 to 30 carbon atoms), an amino group (preferably an amino group having 0 to 30 carbon atoms), an alkoxy group (preferably an alkoxy group having 1 to 30 carbon atoms), an aryloxy group (preferably an aryloxy group having 6 to 30 carbon atoms), an aromatic heterocyclic oxy group (preferably an aromatic heterocyclic oxy group having 1 to 30 carbon atoms), an acyl group (preferably an acyl group having 1 to 30 carbon atoms), an alkoxy carbonyl group (preferably an alkoxy carbonyl group having 2 to 30 carbon atoms), an aryloxy carbonyl group (preferably an aryloxy carbonyl group having 7 to 30 carbon atoms), an acyloxy group (preferably an acyloxy group having 2 to 30 carbon atoms), an acyl amino group (preferably an acyl amino group having 2 to 30 carbon atoms), an alkoxy carbonyl amino group (preferably an alkoxy carbonyl amino group having 2 to 30 carbon atoms), an aryloxy carbonyl amino group (preferably an aryloxy carbonyl amino group having 7 to 30 carbon atoms), a sulfonyl amino group (preferably a sulfonyl amino group having 1 to 30 carbon atoms), a sulfamoyl group (preferably a sulfamoyl group having 0 to 30 carbon atoms), a carbamoyl group (preferably a carbamoyl group having 1 to 30 carbon atoms), an alkyl thio group (preferably an alkyl thio group having 1 to 30 carbon atoms), an aryl thio group (preferably an aryl thio group having 6 to 30 carbon atoms), an aromatic heterocyclic thio group (preferably an aromatic heterocyclic thio group having 1 to 30 carbon atoms), a sulfonyl group (preferably a sulfonyl group having 1 to 30 carbon atoms), a sulfinyl group (preferably a sulfinyl group having 1 to 30 carbon atoms), a ureido group (preferably a ureido group having 1 to 30 carbon atoms), a phosphoric acid amide group (preferably a phosphoric acid amide group having 1 to 30 carbon atoms), a hydroxy group, a mercapto group, a halogen atom, a cyano group, a sulfo group, a carboxyl group, a nitro group, a hydroxamic acid group, a sulfino group, a hydrazino group, an imino group, and a heterocyclic group (preferably a heterocyclic group having 1 to 30 carbon atoms).

At least one of $R^2$ or $R^3$ is an electron-withdrawing group. In general, a substituent having a positive σp value (a sigma para value) of Hammett functions as an electron-withdrawing group. Examples of the electron-withdrawing group preferably include a cyano group, an acyl group, an alkyloxy carbonyl group, an aryloxy carbonyl group, a sulfamoyl group, a sulfinyl group, a heterocyclic group, and the like, and the cyano group is more preferable. The electron-withdrawing group may further substituted.

In the present invention, substituents in which a substituent constant σp value of Hammett is greater than or equal to 0.2 can be exemplified as the electron-withdrawing group. The σp value is preferably greater than or equal to 0.25, is more preferably greater than or equal to 0.3, and is particularly preferably greater than or equal to 0.35. The upper limit is not particularly limited, but is preferably 0.80.

Specific examples of the substituent include a cyano group (0.66), a carboxyl group (—COOH: 0.45), an alkoxy carbonyl group (—COOMe: 0.45), an aryloxy carbonyl group (—COOPh: 0.44), a carbamoyl group (—CONH$_2$: 0.36), an alkyl carbonyl group (—COMe: 0.50), an aryl carbonyl group (—COPh: 0.43), an alkyl sulfonyl group (—SO$_2$Me: 0.72), an aryl sulfonyl group (—SO$_2$Ph: 0.68), or the like. The cyano group is particularly preferable. Here, Me represents a methyl group, and Ph represents a phenyl group.

The substituent constant σ value of Hammett, for example, can be referred to paragraphs 0017 to 0018 of JP2011-68731A, and the contents thereof are incorporated herein.

In a case where $R^2$ and $R^3$ form a ring by being bonded to each other, it is preferable that $R^2$ and $R^3$ form a 5-membered ring to a 7-membered ring (preferably, a 5-membered ring or a 6-membered ring). A ring which is generally used as an acid nucleus in a merocyanine coloring agent is preferable as the ring to be formed, specific examples thereof, for example, can be referred to paragraphs 0019 to 0021 of JP2011-68731A, and the contents thereof are incorporated herein.

It is particularly preferable that $R^3$ is a hetero ring. In particular, it is preferable that $R^3$ is quinoline, benzothiazole, or naphthothiazole.

Two $R^2$'s of Formula (A1) may be identical to each other or different from each other, and two $R^3$'s may be identical to each other or different from each other.

When the group represented by $R^4$ is an alkyl group, an aryl group, or a heteroaryl group, the groups are identical to those described in $R^{1a}$ and $R^{1b}$, and preferred groups are also identical to those described in $R^{1a}$ and $R^{1b}$.

When the group represented by $R^4$ is substituted boron, a substituent thereof is identical to the substituent T described above in $R^2$ and $R^3$, and is preferably an alkyl group, an aryl group, and a heteroaryl group.

In addition, when the group represented by $R^4$ is a metal atom, transition metal is preferable, and substituted boron is particularly preferable. Examples of the substituted boron preferably include difluoroboron, diphenyl boron, dibutyl boron, dinaphthyl boron, and catechol boron. Among them, the diphenyl boron is particularly preferable.

$R^4$ may be subjected to covalent bonding or coordination bonding with at least one of $R^{1a}$, $R^{1b}$, or $R^3$, and it is particularly preferable that $R^4$ is subjected to coordination bonding with $R^3$.

In particular, it is preferable that $R^4$ is a hydrogen atom or substituted boron (in particular, diphenyl boron).

Two $R^4$'s of Formula (A1) may be identical to each other or different from each other.

The compound represented by Formula (A1), for example, can be referred to paragraphs 0024 to 0052 of JP2011-68731A ([0043] to [0074] of the specification of corresponding US2011/0070407A), and the contents thereof are incorporated herein.

A compound represented by Formula (A2) described below is more preferable as the pyrrolo pyrrole compound.

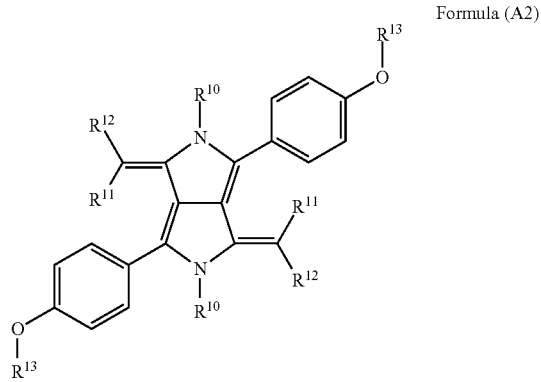

Formula (A2)

(In Formula (A2), $R^{10}$'s each independently represent a hydrogen atom, an alkyl group, an aryl group, a heteroaryl group, substituted boron, or a metal atom, and may be subjected to covalent bonding or coordination bonding with $R^{12}$. $R^{11}$ and $R^{12}$ each independently represent a hydrogen atom or a substituent, at least one of them is an electron-withdrawing group, and $R^{11}$ and $R^{12}$ may form a ring by being bonded to each other. $R^{13}$'s each independently represent a branched alkyl group having 3 to 30 carbon atoms.)

$R^{10}$ is identical to $R^4$ of Formula (A1) described above, and the preferred range thereof is also identical to that of $R^4$ of Formula (A1) described above.

$R^{11}$ and $R^{12}$ are identical to $R^2$ and $R^3$ of (A1) described above, and the preferred ranges thereof are also identical to those of $R^2$ and $R^3$ of (A1) described above.

$R^{13}$'s may be identical to each other or different from each other.

In addition, it is preferable that $R^{13}$, for example, is an alcohol residue derived from isoeicosanol (manufactured by Nissan Chemical Industries, Ltd., FINEOXOCOL 2000).

Alcohol may be linear alcohol or branched alcohol, is preferably alcohol having 1 to 30 carbon atoms, is more preferably alcohol having 3 to 25 carbon atoms, and is particularly preferably branched alcohol having 3 to 25 carbon atoms. More specifically, examples of the alcohol include methanol, ethanol, iso-propanol, n-butanol, tert-butanol, 1-octanol, 1-decanol, 1-hexadecanol, 2-methyl butanol, 2-ethyl hexanol, 2-octyl dodecanol, isohexadecanol (manufactured by Nissan Chemical Industries, Ltd., FINEOXOCOL 1600), isooctadecanol (manufactured by Nissan Chemical Industries, Ltd., FINEOXOCOL 180), isooctadecanol (manufactured by Nissan Chemical Industries, Ltd., FINEOXOCOL 180N), isooctadecanol (manufactured by Nissan Chemical Industries, Ltd., FINEOXOCOL 180T), isoeicosanol (manufactured by Nissan Chemical Industries, Ltd., FINEOXOCOL 2000), and the like. The alcohols may be a mixture of two or more types thereof.

<<Inorganic Fine Particles>>

The near infrared ray absorbent composition of the present invention may contain inorganic fine particles. Only one type of the inorganic fine particles may be used, or two or more types thereof may be used.

The inorganic fine particles are particles which mainly have a function of shielding (absorbing) an infrared ray. It is preferable that the inorganic fine particles are metal oxide fine particles or metal fine particles from the viewpoint of more excellent infrared ray shielding properties.

Examples of the metal oxide particles include indium tin oxide (ITO) particles, antimony tin oxide (ATO) particles, zinc oxide (ZnO) particles, Al-doped zinc oxide (Al-doped ZnO) particles, fluorine-doped tin dioxide (F-doped $SnO_2$) particles, niobium-doped titanium dioxide (Nb-doped $TiO_2$) particles, and the like.

Examples of the metal fine particles include silver (Ag) particles, gold (Au) particles, copper (Cu) particles, nickel (Ni) particles, and the like. Furthermore, in order to make infrared ray shielding properties and photolithographic properties compatible, it is desirable that a transmittance in an exposure wavelength (365 to 405 nm) is high, and thus, the indium tin oxide (ITO) particles or the antimony tin oxide (ATO) particles are preferable.

The shape of the inorganic fine particles is not particularly limited, and may be not only a spherical shape and a non-spherical shape, but also a sheet-like shape, a wire-like shape, and a tubular shape.

In addition, a tungsten oxide-based compound can be used as the inorganic fine particles, and specifically, a tungsten oxide-based compound represented by General Formula (Compositional Formula) (I) described below is more preferable.

$$M_xW_yO_z \qquad (I)$$

M represents metal, W represents tungsten, and O represents oxygen.

$0.001 \leq x/y \leq 1.1$ $2.2 \leq z/y \leq 3.0$

Examples of the metal represented by M include alkali metal, alkali earth metal, Mg, Zr, Cr, Mn, Fe, Ru, Co, Rh, Ir, Ni, Pd, Pt, Cu, Ag, Au, Zn, Cd, Al, Ga, In, Tl, Sn, Pb, Ti, Nb, V, Mo, Ta, Re, Be, Hf, Os, and Bi, the alkali metal is preferable, Rb or Cs is more preferable, and Cs is particularly preferable. Only one type of the metals of M may be used or two or more types thereof may be used.

By setting x/y to be greater than or equal to 0.001, it is possible to sufficiently shield an infrared ray, and by setting X/Y to be less than or equal to 1.1, it is possible to reliably prevent an impurity phase from being generated in the tungsten oxide-based compound.

By setting z/y to be greater than or equal to 2.2, it is possible to further improve chemical stability as a material, and by setting z/y to be less than or equal to 3.0, it is possible to sufficiently shield an infrared ray.

Specific examples of the tungsten oxide-based compound represented by General Formula (I) described above can include $Cs_{0.33}WO_3$, $Rb_{0.33}WO_3$, $K_{0.33}WO_3$, $Ba_{0.33}WO_3$, and the like, $Cs_{0.33}WO_3$ or $Rb_{0.33}WO_3$ is preferable, and $Cs_{0.33}WO_3$ is more preferable.

The tungsten oxide-based compound, for example, can be available as a dispersion of tungsten fine particles such as YMF-02 manufactured by Sumitomo Metal Mining Co., Ltd.

The average particle diameter of the inorganic fine particles is preferably less than or equal to 800 nm, is more preferably less than or equal to 400 nm, and is even more preferably less than or equal to 200 nm. By setting the average particle diameter of the inorganic fine particles to be in such a range, it is possible to make light transmittance in a visible light range more reliable. It is preferable that the average particle diameter is small from the viewpoint of preventing light scattering, and the average particle diameter of the inorganic fine particles is generally greater than or equal to 1 nm from the reason of handling easiness or the like at the time of manufacturing.

The content of the inorganic fine particles is preferably 0.01 to 30 mass % with respect to the total solid content of the near infrared ray absorbent composition. The lower limit is preferably greater than or equal to 0.1 mass %, and is more preferably greater than or equal to 1 mass %. The upper limit is preferably less than or equal to 20 mass %, and is more preferably less than or equal to 10 mass %.

<<Solvent>>

The near infrared ray absorbent composition of the present invention may contain a solvent. The solvent is not particularly limited, and can be suitably selected according to the purpose, insofar as each component can be homogeneously dissolved or dispersed in the solvent. For example, water and an organic solvent can be used. In addition, water and an organic solvent can be used together. By using water and the organic solvent together, hydrolysis of the compound having a partial structure represented by M-X is performed, and thus, a crosslinking reaction can be easily performed, and moisture resistance of a cured film can be further improved.

Examples of the organic solvent preferably include alcohols, ketones, esters, aromatic hydrocarbons, halogenated hydrocarbons, dimethyl formamide, dimethyl acetamide, dimethyl sulfoxide, sulfolane, and the like. Only one type of the organic solvent may be used, or two or more types thereof may be used together.

Specific examples of the alcohols, the aromatic hydrocarbons, and the halogenated hydrocarbons includes those described in paragraph 0136 of JP2012-194534A and the like, and the contents thereof are incorporated herein.

Specific examples of the esters, the ketones, and the ethers include those described in paragraph 0497 of JP2012-208494A ([0609] of the specification of corresponding US2012/0235099A). Further, the specific examples include n-amyl acetate, ethyl propionate, dimethyl phthalate, ethyl benzoate, methyl sulfate, acetone, methyl isobutyl ketone, diethyl ether, ethylene glycol monobutyl ether acetate, and the like.

It is preferable that at least one type selected from cyclopentanone, cyclohexanone, propylene glycol monomethyl ether acetate, N-methyl-2-pyrrolidone, butyl acetate, ethyl lactate, and propylene glycol monomethyl ether is used as the solvent.

The content of the solvent is preferably 5 to 60 mass %, and is more preferably 10 to 40 mass %, with respect to the total solid content of the near infrared ray absorbent composition of the present invention.

In addition, in a case where water and the organic solvent are used together, a mass ratio of water to the organic solvent is preferably 0.1:99.9 to 30:70, is more preferably 0.2:99.8 to 20:80, and is even more preferably 0.5:99.5 to 10:90.

Only one type of the solvent may be used, or two or more types thereof may be used, and in a case where two or more types of the solvents are used, it is preferable that the total amount is in the range described above.

<<Curable Compound>>

The near infrared ray absorbent composition of the present invention may contain a curable compound in addition to the compound having a partial structure represented by M-X described above. The curable compound may be a compound having a polymerizable group (hereinafter, may be referred to as a "polymerizable compound"), or may be a non-polymerizable compound such as a binder. The curable compound may have any one of chemical forms such as a monomer, an oligomer, a prepolymer, and a polymer. The curable compound, for example, can be referred to the description of paragraphs 0070 to 0191 of JP2014-41318A (paragraphs 0071 to 0192 of the pamphlet of corresponding WO2014/017669A), paragraphs 0045 to 0216 of JP2014-32380A, and the like, and the contents thereof are incorporated herein.

A polymerizable compound is preferable as the curable compound. Examples of the polymerizable compound include a compound having an ethylenically unsaturated bond and a polymerizable group such as cyclic ether (epoxy and oxetane). A vinyl group, a styryl group, a (meth)acryloyl group, and an allyl group are preferable as the ethylenically unsaturated bond. The polymerizable compound may be a monofunctional compound having one polymerizable group, or may be a polyfunctional compound having two or more polymerizable groups, and is preferably a polyfunctional compound. The near infrared ray absorbent composition contains the polyfunctional compound, and thus, heat resistance can be further improved.

Examples of the curable compound include monofunctional (meth)acrylate, polyfunctional (meth)acrylate (preferably trifunctional (meth)acrylate to hexafunctional (meth) acrylate), a polybasic acid-modified acryl oligomer, an epoxy resin, a polyfunctional epoxy resin, and the like.

In a case where the near infrared ray absorbent composition of the present invention contains the curable compound, the content of the curable compound is preferably 1 to 90 mass % with respect to the total solid content of the near infrared ray absorbent composition. The lower limit is preferably greater than or equal to 5 mass %, is more preferably greater than or equal to 10 mass %, and is even more preferably greater than or equal to 20 mass %. The upper limit is preferably less than or equal to 80 mass %, and is more preferably less than or equal to 75 mass %. In addition, in a case where a polymer which has a repeating unit having a polymerizable group is used as the curable compound, the content of the curable compound is preferably 10 to 75 mass % with respect to the total solid content of the near infrared ray absorbent composition. The lower limit is preferably greater than or equal to 20 mass %. The upper limit is preferably less than or equal to 65 mass %, and is more preferably less than or equal to 60 mass %.

Only one type of the curable compound may be used, or two or more types thereof may be used. In a case where two or more types of the curable compounds are used, it is preferable that the total amount is in the range described above.

It is possible that the near infrared ray absorbent composition of the present invention does not substantially contain the curable compound. "Not substantially containing the curable compound", for example, indicates that the content of the curable compound is preferably less than or equal to 0.5 mass %, and is more preferably less than or equal to 0.1 mass %, with respect to the total solid content of the near infrared ray absorbent composition, and it is even more preferable that the curable compound is not contained.

<<<Compound Having Ethylenically Unsaturated Bond>>>

In the present invention, a compound having an ethylenically unsaturated bond can be used as the curable compound. Examples of the compound having an ethylenically unsaturated bond can be referred to the description of paragraphs 0033 and 0034 of JP2013-253224A, and the contents thereof are incorporated herein.

Ethylene oxy-modified pentaerythritol tetraacrylate (NK ESTER ATM-35E; manufactured by Shin Nakamura Chemical Co., Ltd. as a commercially available product), dipentaerythritol triacrylate (KAYARAD D-330; manufactured by Nippon Kayaku Co., Ltd. as a commercially available product), dipentaerythritol tetraacrylate (KAYARAD D-320; manufactured by Nippon Kayaku Co., Ltd. as a commercially available product), dipentaerythritol penta(meth)acrylate (KAYARAD D-310; manufactured by Nippon Kayaku Co., Ltd. as a commercially available product), dipentaerythritol hexa(meth)acrylate (KAYARAD DPHA; manufactured by Nippon Kayaku Co., Ltd. and A-DPH-12E; manufactured by Shin Nakamura Chemical Co., Ltd. as commercially available products), and a structure in which (meth)acryloyl groups thereof interpose ethylene glycol and a propylene glycol residue therebetween are preferable as the compound having an ethylenically unsaturated bond. In addition, oligomer type compounds thereof can also be used.

In addition, the compound can be referred to the description of a polymerizable compound of paragraphs 0034 to 0038 of JP2013-253224A, and the contents thereof are incorporated herein.

In addition, examples of the compound include a polymerizable monomer described in paragraph 0477 of JP2012-208494A ([0585] of the specification of corresponding US2012/0235099A), and the like, and the contents thereof are incorporated herein.

In addition, diglycerin ethylene oxide (EO)-modified (meth)acrylate (M-460; manufactured by TOAGOSEI CO., LTD. as a commercially available product) is preferable. Pentaerythritol tetraacrylate (manufactured by Shin Nakamura Chemical Co., Ltd., A-TMMT) and 1,6-hexanediol diacrylate (manufactured by Nippon Kayaku Co., Ltd., KAYARAD HDDA) are also preferable. Oligomer type compounds thereof are can also be used. For example, RP-1040 (manufactured by Nippon Kayaku Co., Ltd.) is included.

The compound having an ethylenically unsaturated bond may have an acid group such as a carboxyl group, a sulfo group, and a phosphoric acid group.

Examples of the compound having an acid group and an ethylenically unsaturated bond include ester of an aliphatic polyhydroxy compound and an unsaturated carboxylic acid, and the like. A compound having an acid group by allowing a non-aromatic carboxylic acid anhydride to react with an unreacted hydroxyl group of the aliphatic polyhydroxy compound is preferable, and a compound in which the aliphatic polyhydroxy compound is pentaerythritol and/or dipentaerythritol in the ester described above is particularly preferable. Polybasic acid-modified acryl oligomer manufactured by TOAGOSEI CO., LTD. is a commercially available product, and examples thereof include M-305, M-510, and M-520 of ARONIX series, and the like.

An acid value of the compound having an acid group and an ethylenically unsaturated bond is preferably 0.1 to 40 mgKOH/g. The lower limit is preferably greater than or equal to 5 mgKOH/g. The upper limit is preferably less than or equal to 30 mgKOH/g.

<<<Compound Having Epoxy Group or Oxetanyl Group>>>

In the present invention, a compound having an epoxy group or an oxetanyl group can be used as the curable compound. Examples of the compound having an epoxy group or an oxetanyl group include a polymer having an epoxy group on a side chain, a monomer or an oligomer having two or more epoxy groups in the molecules, and the like. Examples of the compound can include a bisphenol A type epoxy resin, a bisphenol F type epoxy resin, a phenol novolac type epoxy resin, a cresol novolac type epoxy resin, an aliphatic epoxy resin, and the like. In addition, examples of the compound also include a monofunctional glycidyl ether compound or a polyfunctional glycidyl ether compound, and the polyfunctional aliphatic glycidyl ether compound is preferable.

The weight-average molecular weight thereof is preferably 500 to 5,000,000, and is more preferably 1,000 to 500,000.

A commercially available product may be used as the compound, or a compound obtained by introducing an epoxy group to the side chain of the polymer may be used.

A commercially available product, for example, can be referred to the description of paragraph 0191 of JP2012-155288A and the like, and the contents thereof are incorporated herein.

In addition, examples of the commercially available product include a polyfunctional aliphatic glycidyl ether compound such as DENACOL EX-212L, EX-214L, EX-216L, EX-321L, and EX-850L (which are manufactured by Nagase ChemteX Corporation.). The examples described above are low chlorine products, and EX-212, EX-214, EX-216, EX-321, EX-850, and the like, which are not low chlorine products, can also be used.

In addition, examples of the commercially available product include ADEKA RESIN EP-4000S, ADEKA RESIN EP-4003S, ADEKA RESIN EP-4010S, and ADEKA RESIN EP-4011S (which are manufactured by ADEKA CORPORATION), NC-2000, NC-3000, NC-7300, XD-1000, EPPN-501, and EPPN-502 (which are manufactured by ADEKA CORPORATION), JER1031S, CELLOXIDE 2021P, CELLOXIDE 2081, CELLOXIDE 2083, CELLOXIDE 2085, EHPE3150, EPOLEAD PB 3600, and EPOLEAD PB 4700 (which are manufactured by DAICEL CORPORATION), CYCLOMER P ACA 200M, CYCLOMER ACA 230AA, CYCLOMER ACA Z250, CYCLOMER ACA Z251, CYCLOMER ACA Z300, and CYCLOMER ACA Z320 (which are manufactured by DAICEL CORPORATION), and the like.

Further, examples of a commercially available product of the phenol novolac type epoxy resin include JER-157S65, JER-152, JER-154, and JER-157S70 (which are manufactured by Mitsubishi Chemical Corporation), and the like.

In addition, ARON OXETANE OXT-121, OXT-221, OX-SQ, and PNOX (which are manufactured by TOAGOSEI CO., LTD.) can be used as specific examples of the polymer having an oxetanyl group on the side chain, and the polymerizable monomer or the polymerizable oligomer having two or more oxetanyl groups in the molecules.

A compound having a glycidyl group as an epoxy group of glycidyl (meth)acrylate, allyl glycidyl ether, or the like can also be used as the compound having an epoxy group, and an unsaturated compound having an alicyclic epoxy group is preferable. Such compounds, for example, can be referred to the description of paragraph 0045 of JP2009-265518A, and the like, and the contents thereof are incorporated herein.

The compound having an epoxy group or an oxetanyl group may include a polymer having an epoxy group or an oxetanyl group as a repeating unit. Specifically, examples of the polymer include polymers (copolymers) having repeating units described below.

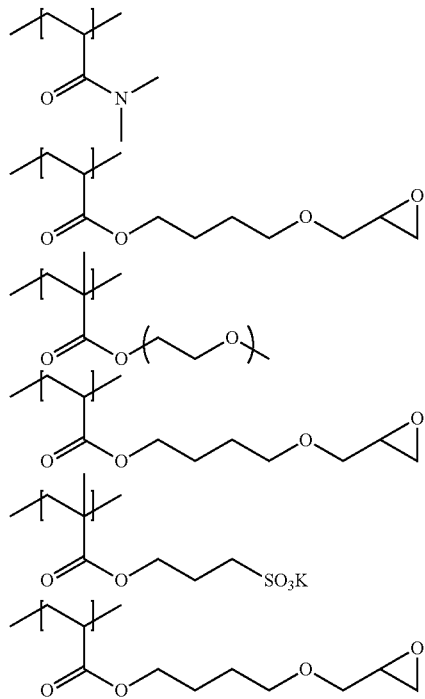

<<<Other Curable Compounds>>>

In the present invention, a polymerizable compound having a caprolactone-modified structure can be used as the curable compound.

The polymerizable compound having a caprolactone-modified structure can be referred to the description of paragraphs 0042 to 0045 of JP2013-253224A, and the contents thereof are incorporated herein.

Examples of the polymerizable compound having a caprolactone-modified structure include DPCA-20, DPCA-30, DPCA-60, DPCA-120, and the like, which are commercially as KAYARAD DPCA series from Nippon Kayaku Co., Ltd., SR-494 manufactured by Arkema Inc., which is tetrafunctional acrylate having four ethylene oxy chains, TPA-330 manufactured by Arkema Inc., which is trifunctional acrylate having three isobutylene oxy chains, and the like.

<<Binder Polymer>>

The near infrared ray absorbent composition of the present invention can contain a binder polymer in addition to the compound having a partial structure represented by M-X described above, in order to improve film properties or the like. An alkali soluble resin is preferably used as the binder polymer. By containing the alkali soluble resin, an effect is obtained in which heat resistance or the like is improved, or coating suitability is finely adjusted. The alkali soluble resin can be referred to the description of paragraphs 0558 to 0571 of JP2012-208494A ([0685] to [0700] of the specification of corresponding US2012/0235099A), and the contents thereof are incorporated herein.

In a case where the near infrared ray absorbent composition of the present invention contains the binder polymer, the content of the binder polymer is preferably 1 to 80 mass % with respect to the total solid content of the near infrared ray absorbent composition. The lower limit is preferably greater than or equal to 5 mass %, and is more preferably greater than or equal to 7 mass %. The upper limit is preferably less than or equal to 50 mass %, and is more preferably less than or equal to 30 mass %.

<<Surfactant>>

The near infrared ray absorbent composition of the present invention may contain a surfactant in addition to the compound having a partial structure represented by M-X described above. Only one type of the surfactant may be used, or two or more types thereof may be used in combination. In a case where near infrared ray absorbent composition of the present invention contains the surfactant, the content of the surfactant is preferably 0.0001 to 2 mass % with respect to the total solid content of the near infrared ray absorbent composition. The lower limit is preferably greater than or equal to 0.005 mass %, and is more preferably greater than or equal to 0.01 mass %. The upper limit is preferably less than or equal to 1.0 mass %, and is more preferably less than or equal to 0.1 mass %.

Various surfactants such as a fluorine-based surfactant, a nonionic surfactant, a cationic surfactant, an anionic surfactant, and a silicone-based surfactant can be used as the surfactant. It is preferable that the near infrared ray absorbent composition of the present invention contains at least one of the fluorine-based surfactant or the silicone-based surfactant. Accordingly, an interfacial tension between a surface to be coated and a coating liquid decreases, and thus, wettability with respect to the surface to be coated is improved. For this reason, liquid properties (in particular, fluidity) of the near infrared ray absorbent composition are improved, and thus, homogeneity of a coating thickness or liquid saving properties are further improved. As a result thereof, even in a case where a thin film of approximately several μm is formed by a small amount of liquid, a film which has a homogeneous thickness and small thickness unevenness is more preferably formed.

A fluorine content rate of the fluorine-based surfactant is preferably 3 to 40 mass %. The lower limit is preferably greater than or equal to 5 mass %, and more preferably greater than or equal to 7 mass %. The upper limit is preferably less than or equal to 30 mass %, and is more preferably less than or equal to 25 mass %. In a case where the fluorine content rate is in the range described above, it is effective from the viewpoint of homogeneity of a thickness of a coated film or liquid saving properties, and solubility in the near infrared ray absorbent composition is also excellent.

Specifically, examples of the fluorine-based surfactant include surfactants described in paragraphs 0060 to 0064 of JP2014-41318A (paragraphs 0060 to 0064 of the pamphlet of corresponding WO2014/17669A), and the like, and the contents thereof are incorporated herein.

Examples of the nonionic surfactant include polyoxy ethylene alkyl ether, polyoxy ethylene alkyl allyl ether, polyoxy ethylene fatty acid ester, sorbitan fatty acid ester, polyoxy ethylene sorbitan fatty acid ester, polyoxy ethylene alkyl amine, glycerin fatty acid ester, an oxy ethylene oxy propylene block copolymer, an acetylene glycol-based surfactant, acetylene-based polyoxy ethylene oxide, and the like. Only one type of the nonionic surfactant can be used, or two or more types thereof can be used.

Specific product names thereof include SURFYNOL 61, 82, 104, 104E, 104H, 104A, 104BC, 104DPM, 104PA, 104PG-50, 104S, 420, 440, 465, 485, 504, CT-111, CT-121, CT-131, CT-136, CI-141, CT-151, CT-171, CT-324, DF-37, DF-58, DF-75, DF-110D, DF-210, GA. OP-340, PSA-204, PSA-216, PSA-336, SE, SE-F, TG, GA, and DYNOL 604 (which are manufactured by Nissin Chemical Co., Ltd. and Air Products and Chemicals, Inc.), OLFINE A, B, AK-02, CT-151W, E1004, E1010, P, SPC, STG, Y, 32W, PD-001, PD-002W, PD-003, PD-004, EXP.4001, EXP.4036, EXP.4051, AF-103, AF-104, SK-14, and AE-3 (which are manufactured by Nissin Chemical Co., Ltd.), ACETYLENOL E00, E13T, E40, E60, E81, E100, and E200 (which are product names and are manufactured by Kawaken Fine Chemicals Co., Ltd.), and the like. Among them, OLFINE E1010 is preferable.

In addition, specifically, examples of the nonionic surfactant include nonionic surfactants described in paragraph 0553 of JP2012-208494A ([0679] of the specification of corresponding US2012/0235099A), and the like, and the contents thereof are incorporated herein.

Specifically, examples of the cationic surfactant include cationic surfactants described in paragraph 0554 of JP2012-208494A ([0680] of the specification of corresponding US2012/0235099A), and the contents thereof are incorporated herein.

Specifically, examples of the anionic surfactant include W004, W005, and W017 (manufactured by Yusho Co., Ltd.), and the like.

Examples of the silicone-based surfactant include silicone-based surfactants described in paragraph 0556 of JP2012-208494A ([0682] of the specification of corresponding US2012/0235099A), and the like, and the contents thereof are incorporated herein. In addition, "TORAY SILICONE SF8410", "TORAY SILICONE SF8427", "TORAY SILICONE SH8400", "ST80PA", "ST83PA", and "ST86PA" which are manufactured by Dow Corning Corporation, "TSF-400", "TSF-401", "TSF-410", and "TSF-4446" which are manufactured by Momentive Performance Materials Inc., "KP321", "KP323", "KP324", and "KP340" manufactured by Shin-Etsu Chemical Co., Ltd., and the like are also exemplified.

<<Polymerization Initiator>>

The near infrared ray absorbent composition of the present invention may contain a polymerization initiator. The polymerization initiator is not particularly limited insofar as the polymerization initiator has an ability of initiating polymerization of a polymerizable compound by either light or heat, or both of light and heat, but a photopolymerizable compound (a photopolymerization initiator) is preferable. In a case where polymerization is initiated by light, a polymerization initiator having photosensitivity with respect to a light ray in an ultraviolet ray range to a visible ray range is preferable. In addition, in a case where polymerization is initiated by heat, a polymerization initiator decomposed at 150° C. to 250° C. is preferable.

A compound having an aromatic group is preferable as the polymerization initiator. Examples of the compound include an acyl phosphine compound, an acetophenone compound, an α-amino ketone compound, a benzophenone compound, a benzoin ether compound, a ketal derivative compound, a thioxanthone compound, an oxime compound, a hexaaryl biimidazole compound, a trihalomethyl compound, an azo compound, an organic peroxide, a diazonium compound, an iodonium compound, a sulfonium compound, an azinium compound, an onium salt compound such as a metallocene compound, an organic boron salt compound, a disulfone compound, a thiol compound, and the like.

The polymerization initiator can be referred to the description of paragraphs 0217 to 0228 of JP2013-253224A, and the contents thereof are incorporated herein.

The polymerization initiator is preferably an oxime compound, an acetophenone compound, or an acyl phosphine compound.

IRGACURE-OXE01 (manufactured by BASF SE), IRGACURE-OXE02 (manufactured by BASF SE), TR-PBG-304 (manufactured by Changzhou Tronly New Electronic Materials CO., LTD.), ADEKA ARKLS NCI-831 (manufactured by ADEKA CORPORATION), ADEKA ARKLS NCI-930 (manufactured by ADEKA CORPORATION), and the like can be used as a commercially available product of the oxime compound.

IRGACURE-907, IRGACURE-369, and IRGACURE-379 (Product Names, which are manufactured by BASF SE), and the like can be used as a commercially available product of the acetophenone compound.

IRGACURE-819 and DAROCUR-TPO (Product Names, which are manufactured by BASF SE), and the like can be used as a commercially available product of the acyl phosphine compound.

In a case where the near infrared ray absorbent composition of the present invention contains the polymerization initiator, the content of the polymerization initiator is preferably 0.01 to 30 mass % with respect to the total solid content of the near infrared ray absorbent composition. The lower limit is preferably greater than or equal to 0.1 mass %. The upper limit is preferably less than or equal to 20 mass %, and is more preferably less than or equal to 15 mass %.

Only one type of the polymerization initiator may be used, or two or more types thereof may be used, and in a case where two or more types of the polymerization initiators are used, it is preferable that the total amount is in the range described above.

<<Other Components>>

Examples of other components which can be used together in the near infrared ray absorbent composition of the present invention include a dispersant, a sensitizer, a crosslinking agent, a curing accelerator, a filler, a thermal curing accelerator, a thermal polymerization inhibitor, a plasticizer, and the like, and an adhesion accelerator with respect to a surface of a substrate and other auxiliary agents (for example, conductive particles, a filler, an antifoaming agent, a flame retardant, a leveling agent, a peeling accelerator, an antioxidant, a flavoring agent, a surface tension adjuster, a chain transfer agent, and the like) may be used together.

By suitably containing such components, it is possible to adjust properties such as stability and film physical properties of the near infrared ray absorption filter which is a target.

The components, for example, can be referred to the description of paragraph 0183 on and after of JP2012-003225A ([0237] on and after of the specification of corresponding US2013/0034812A), the description of paragraphs 0101 to 0104 and 0107 to 0109 of JP2008-250074A, and the like, and the contents thereof are incorporated herein.

<Preparation and Usage of Near Infrared Ray Absorbent Composition>

The near infrared ray absorbent composition of the present invention can be in the form of a liquid, and thus, for example, the near infrared ray cut filter can be easily manufactured by applying the near infrared ray absorbent composition of the present invention onto a substrate or the like, and by drying the near infrared ray absorbent composition.

In a case where the near infrared ray cut filter is formed by coating, it is preferable that the viscosity of the near infrared ray absorbent composition of the present invention is 1 to 3,000 mPa·s. The lower limit is preferably greater than or equal to 10 mPa·s, and is more preferably greater than or equal to 100 mPa·s. The upper limit is preferably less than or equal to 2,000 mPa·s, and is more preferably less than or equal to 1,500 mPa·s.

The total solid content of the near infrared ray absorbent composition of the present invention is changed according to a coating method, and for example, is preferably 1 to 50 mass %. The lower limit is more preferably greater than or equal to 10 mass %. The upper limit is more preferably less than or equal to 30 mass %.

The usage of the near infrared ray absorbent composition of the present invention is not particularly limited, and can be preferably used for forming a near infrared ray cut filter or the like. For example, the near infrared ray absorbent composition can be preferably used in a near infrared ray cut filter of a solid image pickup element on a light receiving side (for example, a near infrared ray cut filter with respect to a wafer level lens, and the like), a near infrared ray cut filter of the solid image pickup element on a back surface side (a side opposite to the light receiving side), and the like. In particular, the near infrared ray absorbent composition can be preferably used as the near infrared ray cut filter of the solid image pickup element on the light receiving side.

In addition, according to the near infrared ray absorbent composition of the present invention, it is possible to realize high near infrared ray shielding properties while maintaining a high transmittance in a visible range, and to obtain a near infrared ray cut filter having excellent heat resistance.

<Near Infrared Ray Cut Filter>

Next, a near infrared ray cut filter of the present invention will be described.

The near infrared ray absorbent composition of the present invention described above can be used in the near infrared ray cut filter of the present invention.

In the near infrared ray cut filter of the present invention, a light transmittance preferably satisfies at least one of the following conditions (1) to (9), more preferably satisfies all of the following conditions (1) to (8), and even more preferably satisfies all of the following conditions (1) to (9).

(1) A light transmittance at a wavelength of 400 nm is preferably greater than or equal to 80%, more preferably greater than or equal to 90%, even more preferably greater than or equal to 92%, and is particularly preferably greater than or equal to 95%.

(2) A light transmittance at a wavelength of 450 nm is preferably greater than or equal to 80%, is more preferably greater than or equal to 90%, is even more preferably greater than or equal to 92%, and is particularly preferably greater than or equal to 95%.

(3) A light transmittance at a wavelength of 500 nm is preferably greater than or equal to 80%, is more preferably greater than or equal to 90%, is even more preferably greater than or equal to 92%, and is particularly preferably greater than or equal to 95%.

(4) A light transmittance at a wavelength of 550 nm is preferably greater than or equal to 80%, is more preferably greater than or equal to 90%, is even more preferably greater than or equal to 92%, and is particularly preferably greater than or equal to 95%.

(5) A light transmittance at a wavelength of 700 nm is preferably less than or equal to 20%, is more preferably less than or equal to 15%, is even more preferably less than or equal to 10%, and is particularly preferably less than or equal to 5%.

(6) A light transmittance at a wavelength of 750 nm is preferably less than or equal to 20%, is more preferably less than or equal to 15%, is even more preferably less than or equal to 10%, and is particularly preferably less than or equal to 5%.

(7) A light transmittance at a wavelength of 800 nm is preferably less than or equal to 20%, is more preferably less than or equal to 15%, is even more preferably less than or equal to 10%, and is particularly preferably less than or equal to 5%.

(8) A light transmittance at a wavelength of 850 nm is preferably less than or equal to 20%, is more preferably less than or equal to 15%, is even more preferably less than or equal to 10%, and is particularly preferably less than or equal to 5%.

(9) A light transmittance at a wavelength of 900 nm is preferably less than or equal to 20%, is more preferably less than or equal to 15%, is even more preferably less than or equal to 10%, and is particularly preferably less than or equal to 5%.

In the near infrared ray cut filter, a light transmittance in the entire wavelength range of 400 to 550 nm is preferably greater than or equal to 85%, is more preferably greater than or equal to 90%, and is even more preferably greater than or equal to 95%. It is preferable that a transmittance in a visible range becomes higher, and it is preferable that the transmittance becomes a high transmittance at a wavelength of 400 to 550 nm. In addition, it is preferable that a light transmittance at least one point in a wavelength range of 700 to 800 nm is less than or equal to 20%, and it is more preferable that a light transmittance in the entire wavelength range of 700 to 800 nm is less than or equal to 20%.

A film thickness of the near infrared ray cut filter can be suitably selected according to the purpose. For example, the film thickness is preferably less than or equal to 500 μm, is more preferably less than or equal to 300 μm, is even more preferably less than or equal to 250 μm, and is particularly preferably less than or equal to 200 μm. The lower limit of the film thickness, for example, is preferably greater than or equal to 0.1 μm, is more preferably greater than or equal to 0.2 μm, and is even more preferably greater than or equal to 0.5 μm.

According to the near infrared ray absorbent composition of the present invention, the near infrared ray absorbent composition has high near infrared ray shielding properties, and thus it is possible to thin the film thickness of the near infrared ray cut filter.

In the near infrared ray cut filter of the present invention, a change rate of light absorbance ratios before and after being left to stand under high temperature and high humidity of 85° C./relative humidity of 85% for 1 hour, which is obtained by the following expression, is preferably less than or equal to 7%, is more preferably less than or equal to 4%, and is even more preferably less than or equal to 2%. By setting the change rate of the light absorbance ratio to be in the range described above, excellent moisture resistance is obtained.

Change Rate (%) of Light Absorbance Ratios=|
(Light Absorbance Ratio before Test−Light Absorbance Ratio after Test)/Light Absorbance Ratio before Test|×100(%)

Here, the light absorbance ratio is a value represented by the following expression.

Light Absorbance Ratio=(Maximum Light Absorbance of Near Infrared Ray Cut Filter at Wavelength of 700 to 1,400 nm/Minimum Light Absorbance of Near Infrared Ray Cut Filter at Wavelength of 400 to 700 nm)

In the near infrared ray cut filter of the present invention, both of a change rate of a light absorbance at a wavelength of 400 nm and a change rate of a light absorbance at a wavelength of 800 nm before and after being heated at 200° C. for 5 minutes are preferably less than or equal to 7%, and are particularly preferably less than or equal to 5%. By setting the change rate of the light absorbance to be in the range described above, excellent heat resistance is obtained.

The near infrared ray cut filter of the present invention is used in a lens having a function of absorbing and cutting a near infrared ray (optical lenses such as lens for a camera of a digital camera, a mobile phone, a car-mounted camera, or the like, an f-θ lens, a pickup lens), an optical filter for a semiconductor light receiving element, a near infrared ray absorption film or a near infrared ray absorption plate shielding a heat ray for saving energy, an agricultural coating agent for selectively using solar light, a recording medium using absorption heat of a near infrared ray, a near infrared ray filter for an electronic device or a photograph, protective glasses, sunglasses, a heat ray shielding film, optical character reading and recording, confidential document copy prevention, an electrophotographic photoreceptor, laser welding, and the like. In addition, the near infrared ray cut filter is also useful as a noise cut filter for a CCD camera and a filter for a CMOS image sensor.

<Manufacturing Method of Near Infrared Ray Cut Filter>

The near infrared ray cut filter of the present invention can be manufactured through a step of applying the near infrared ray absorbent composition of the present invention. Specifically, the near infrared ray cut filter can be manufactured through a step of applying the near infrared ray absorbent composition of the present invention onto a support, and a step of drying a film. A film thickness, a laminated structure, and the like can be suitably selected according to the purpose. In addition, a step of forming a pattern may be further performed.

A step of forming a film, for example, can be performed by applying the near infrared ray absorbent composition of the present invention onto the support using a dropwise addition method (drop casting), a spin coater, a slit spin coater, a slit coater, screen printing, applicator coating, and the like. In a case of the dropwise addition method (the drop casting), it is preferable that a dropwise addition region of the near infrared ray absorbent composition, in which a photoresist is used as a partition wall, is formed on the support such that a homogeneous film having a predetermined film thickness is obtained. A desired film thickness can be obtained by adjusting a dropwise addition amount, the concentration of solid contents of the near infrared ray absorbent composition, and the area of the dropwise addition region. The thickness of the film after being dried is not particularly limited, and can be suitably selected according to the purpose.

The support may be a transparent substrate formed of glass or the like. In addition, the support may be a solid image pickup element. In addition, the support may be another substrate disposed on the solid image pickup element on a light receiving side. In addition, the support may be a layer such as a planarizing layer, which is disposed on the solid image pickup element on the light receiving side.

In the step of drying the film, drying conditions are different according to each component, the type of solvent, a use ratio, and the like. For example, it is preferable that the drying is performed at a temperature of 60° C. to 150° C. for 30 seconds to 15 minutes.

The step of forming the pattern is performed by a method including a step of forming a film-like composition layer by applying the near infrared ray absorbent composition of the present invention onto a support, a step of exposing the composition layer, and a step of forming a pattern by developing and removing an unexposed portion, and the like. In the step of forming the pattern, the pattern may be formed by a photolithography method, or the pattern may be formed by a dry etching method.

In the manufacturing method of a near infrared ray cut filter, other steps may be included. The other step is not particularly limited, and can be suitably selected according to the purpose. For example, examples of the other step include a surface treatment step of a substrate, a pre heating step (a pre baking step), a curing treatment step, a post heating step (a post baking step), and the like.

<<Pre Heating Step and Post Heating Step>>

A heating temperature in the pre heating step and the post heating step is preferably 80° C. to 200° C. The upper limit is preferably lower than or equal to 150° C. The lower limit is preferably higher than or equal to 90° C.

A heating time in the pre heating step and the post heating step is preferably 30 to 240 seconds. The upper limit is preferably shorter than or equal to 180 seconds. The lower limit is preferably longer than or equal to 60 seconds.

<<Curing Treatment Step>>

The curing treatment step is a step of performing a curing treatment with respect to the formed film described above, as necessary, and mechanical strength of the near infrared ray cut filter is improved by performing the curing treatment.

The curing treatment step is not particularly limited, and can be suitably selected according to the purpose. Examples of the curing treatment step preferably include an overall exposure treatment, an overall heat treatment, and the like. Here, in the present invention, "the exposure" is used as the meaning including not only irradiation of light rays at various wavelengths but also radiation irradiation of an electron beam, an X-ray, and the like.

It is preferable that the exposure is performed by radiation irradiation, and in particular, an electron beam, KrF, ArF, and an ultraviolet ray or visible light such as a g ray, an h ray, and an i ray are preferably used as radiation which can be used at the time of performing the exposure.

Examples of an exposure method include stepper exposure, exposure using a high-pressure mercury lamp, and the like.

An exposure amount is preferably 5 to 3,000 mJ/cm$^2$. The upper limit is preferably less than or equal to 2,000 mJ/cm$^2$, is more preferably less than or equal to 1,000 mJ/cm$^2$. The lower limit is preferably greater than or equal to 10 mJ/cm$^2$, and is more preferably greater than or equal to 50 mJ/cm$^2$.

Examples of a method of the overall exposure treatment include a method of exposing the entire surface of the formed film. In a case where the near infrared ray absorbent composition contains a polymerizable compound, curing of the polymerizable compound is accelerated by the overall exposure, and the film is further cured, and thus, mechanical strength and durability are improved.

A device performing the overall exposure is not particularly limited, can be suitably selected according to the purpose, and examples of the device preferably include a UV exposing machine such as a super high-pressure mercury lamp, and the like.

In addition, examples of a method of the overall heat treatment include a method of heating the entire surface of the formed film described above. Film strength of the pattern becomes higher by the overall heating.

A heating temperature in the overall heating is preferably 100° C. to 260° C. The lower limit is preferably higher than or equal to 120° C., and is more preferably higher than or equal to 160° C. The upper limit is preferably lower than or equal to 240° C., and is more preferably lower than or equal to 220° C. In a case where the heating temperature is in the range described above, a film having excellent strength is easily obtained.

A heating time in the overall heating is preferably 1 to 180 minutes. The lower limit is preferably longer than or equal to 3 minutes. The upper limit is preferably shorter than or equal to 120 minutes.

A device performing the overall heating is not particularly limited, can be suitably selected from known devices according to the purpose, and examples of the device include a dry oven, a hot plate, an IR heater, and the like.

<Camera Module and Manufacturing Method of Camera Module>

A camera module of the present invention includes a solid image pickup element, and a near infrared ray cut filter disposed on the solid image pickup element on a light receiving side.

In addition, a manufacturing method of the camera module of the present invention includes a step of applying the near infrared ray absorbent composition of the present invention described above onto the solid image pickup element on the light receiving side.

FIG. 1 is a schematic sectional view illustrating a configuration of a camera module including a near infrared ray cut filter according to an embodiment of the present invention.

A camera module 10, for example, includes a solid image pickup element 11, a planarizing layer 12 disposed on the solid image pickup element on a main surface side (a light receiving side), a near infrared ray cut filter 13, and a lens holder 15 which is disposed on the upper portion of the near infrared ray cut filter and includes an imaging lens 14 in an internal space.

In the camera module 10, an incidence ray hv from the outside is sequentially transmitted through the imaging lens 14, the near infrared ray cut filter 13, and the planarizing layer 12, and then, arrives at an image pickup element unit of the solid image pickup element 11.

The solid image pickup element 11, for example, includes a photodiode, an interlayer insulating film (not illustrated), a base layer (not illustrated), a color filter 17, over coat (not illustrated), and a micro lens 18 on a main surface of a silicon substrate 16 which is a base substrate, in this order. The color filter 17 (a red color filter, a green color filter, and a blue color filter) or the micro lens 18 are respectively arranged to correspond to the solid image pickup element 11.

In addition, the near infrared ray cut filter 13 may be disposed on the surface of the micro lens 18, between the base layer and the color filter 17, or between the color filter 17 and the over coat, instead of disposing the near infrared ray cut filter 13 on the surface of the planarizing layer 12. For example, the near infrared ray cut filter 13 may be disposed in a position of less than or equal to 2 mm (more preferably less than or equal to 1 mm) from the surface of the micro lens. In a case where the infrared ray cut filter 13 is disposed in such a position, it is possible to simplify a step of forming a near infrared ray cut filter, and to sufficiently cut an unnecessary near infrared ray with respect to the micro lens, and thus, it is possible to further increase near infrared ray shielding properties.

The near infrared ray cut filter of the present invention can be provided to a solder reflow step. By manufacturing the camera module using according to the solder reflow step, it is possible to realize automatic mounting of an electronic component mountable substrate which is required to be soldered, and to remarkably improve productivity, compared to a case where the solder reflow step is not used. Further, the mounting can be automatically performed, and thus, it is possible to reduce costs. In a case where the near infrared ray cut filter is provided to the solder reflow step, the is near infrared ray cut filter is exposed at a temperature of approximately 250° C. to 270° C., and thus, it is preferable that the near infrared ray cut filter has heat resistance (hereinafter, also referred to as "solder reflow resistance") with respect to the solder reflow step.

Herein, "having solder reflow resistance" indicates that properties as the near infrared ray cut filter are retained before and after performing heating at 200° C. for 10 minutes. More preferably, properties are retained before and after performing heating at 230° C. for 10 minutes. Even more preferably, properties are retained before and after performing heating at 250° C. for 3 minutes. In a case where the near infrared ray cut filter does not have solder reflow resistance, there is a case where near infrared ray shielding properties of the near infrared ray cut filter decrease, or a function as a film becomes insufficient in a case where the conditions described above are retained.

In addition, the present invention relates to a manufacturing method of a camera module including a step of performing a reflow treatment. The near infrared ray cut filter of the present invention maintains near infrared ray shielding properties even in the reflow step, and thus, properties of the camera module which is downsized and lightened, and has high performance are not impaired.

Figure 2:
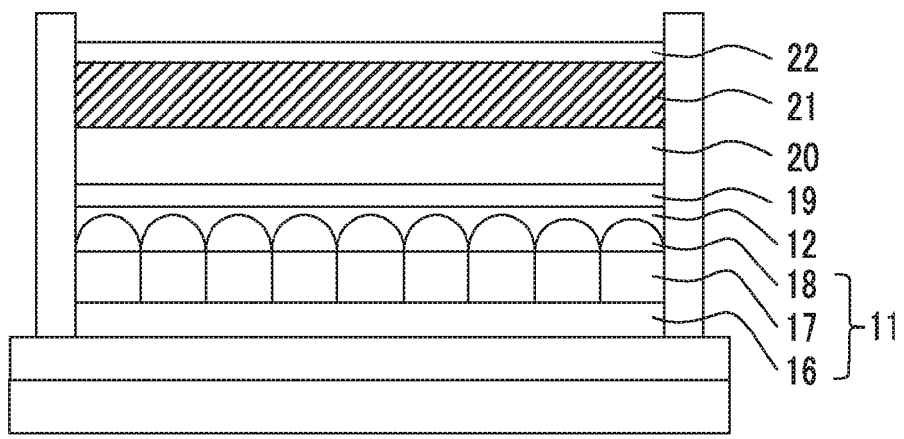
FIG. 2 is a schematic sectional view illustrating an example of a peripheral portion of the near infrared ray cut filter of the camera module.
Figure 3:
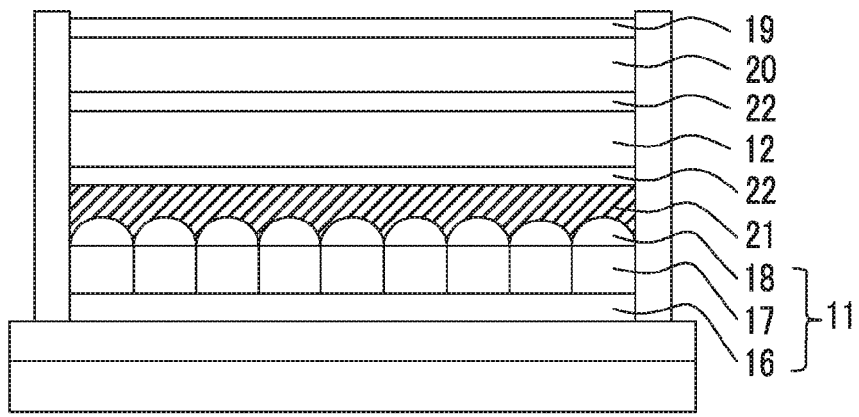
FIG. 3 is a schematic sectional view illustrating an example of the peripheral portion of the near infrared ray cut filter of the camera module.
Figure 4:
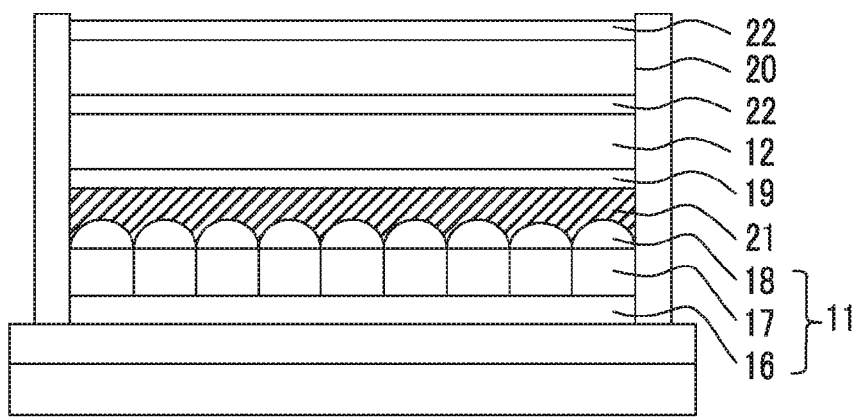
FIG. 4 is a schematic sectional view illustrating an example of the peripheral portion of the near infrared ray cut filter of the camera module.

FIGS. 2 to 4 are schematic sectional views illustrating examples of a near infrared ray cut filter peripheral portion of the camera module.

As illustrated in FIG. 2, the camera module may include the solid image pickup element 11, the planarizing layer 12, an ultraviolet and infrared light reflection film 19, a transparent substrate 20, a near infrared ray absorption layer (a near infrared ray cut filter) 21, and an antireflection layer 22 in this order.

The ultraviolet and infrared light reflection film 19 has an effect of applying or increasing a function of a near infrared ray cut filter, and for example, can be referred to paragraphs 0033 to 0039 of JP2013-68688A, and the contents thereof are incorporated herein.

The transparent substrate 20 transmits light at a wavelength in a visible range, and for example, can be referred to paragraphs 0026 to 0032 of JP2013-68688A, and the contents thereof are incorporated herein.

The near infrared ray absorption layer 21 can be formed by applying the near infrared ray absorbent composition of the present invention described above.

The antireflection layer 22 has a function of efficiently using an incidence ray by further improving a transmittance by preventing light incident on the near infrared ray cut filter from being reflected, and for example, can be referred to paragraph 0040 of JP2013-68688A, and the contents thereof are incorporated herein.

As illustrated in FIG. 3, the camera module includes the solid image pickup element 11, the near infrared ray absorption layer (the near infrared ray cut filter) 21, the antireflection layer 22, the planarizing layer 12, the antireflection layer 22, the transparent substrate 20, and the ultraviolet and infrared light reflection film 19, in this order.

As illustrated in FIG. 4, the camera module includes the solid image pickup element 11, the near infrared ray absorption layer (the near infrared ray cut filter) 21, the ultraviolet and infrared light reflection film 19, the planarizing layer 12, the antireflection layer 22, the transparent substrate 20, and the antireflection layer 22, in this order.

EXAMPLES

Hereinafter, the present invention will be described in detail with reference to examples. Materials, use amounts, ratios, treatment contents, treatment sequences, and the like of the following examples can be suitably changed unless the changes cause deviance from the gist of the present invention. Accordingly, the range of the present invention will not be restrictively interpreted by the following specific examples.

(Synthesis of Compound (Polymer) Represented by M-X)
<Synthesis of Polymers (P-1) to (P-15)>

1-methoxy-2-propanol (20 g) was added to a three-neck flask, and was heated to 85° C. under a nitrogen atmosphere. A solution in which methacrylic acid 2-ethyl hexyl (16.35 g), methacrylic acid 3-(trimethoxy silyl) propyl (13.65 g), and V-601 (manufactured by Wako Pure Chemical Industries, Ltd., an azo-based polymerization initiator, 1.27 g) were dissolved in 1-methoxy-2-propanol (50 g) was subjected to dropwise addition for 2 hours. After the dropwise addition ended, a reaction ended by performing stirring for 4 hours, and thus, a polymer (P-1) of the structural formula described above was obtained. The weight-average molecular weight of the polymer (P-1) was 20,000.

Polymers (P-2) to (P-15) of the structural formula described above were obtained by the same method as that of the polymer (P-1). The weight-average molecular weight of the polymers (P-2) to (P-5) and (P-8) to (P-15) was 20,000. In addition, the weight-average molecular weight of the polymer (P-6) was 5,000. In addition, the weight-average molecular weight of the polymer (P-7) was 10,000.

<Synthesis of Polymers (P-16) to (P-44)>
Polymers (P-16) to (P-44) of the structural formula described above were manufactured by the same method as that of the polymer (P-1).

Examples 1 to 50 and Comparative Example 1

[Preparation of Near Infrared Ray Absorbent Composition]

A compound 1 having a partial structure represented by M-X shown in Table 1, a compound 2 having a partial structure represented by M-X shown in Table 1, a near infrared ray absorbent compound shown in Table 1, water, and propylene glycol monomethyl ether (PGME) were mixed at a formulation amount shown in Table 1, respectively, and thus, a near infrared ray absorbent composition was prepared.

TABLE 1

| | Compound 1 Having Partial Structure Represented by M-X | | Compound 2 Having Partial Structure Represented by M-X | | Near Infrared Ray Absorbent Composition | | Water Mass Ratio [%] | PGME Mass Ratio [%] |
|---|---|---|---|---|---|---|---|---|
| | Type | Mass Ratio [%] | Type | Mass Ratio [%] | Type | Mass Ratio [%] | | |
| Example 1 | P-1 | 10 | — | 0 | Copper Complex A | 10 | 3 | 77 |
| Example 2 | P-2 | 10 | — | 0 | Copper Complex A | 10 | 3 | 77 |
| Example 3 | P-3 | 10 | — | 0 | Copper Complex A | 10 | 3 | 77 |
| Example 4 | P-4 | 10 | — | 0 | Copper Complex A | 10 | 3 | 77 |
| Example 5 | P-5 | 10 | — | 0 | Copper Complex A | 10 | 3 | 77 |
| Example 6 | P-6 | 10 | — | 0 | Copper Complex A | 10 | 3 | 77 |
| Example 7 | P-7 | 10 | — | 0 | Copper Complex A | 10 | 3 | 77 |
| Example 8 | P-8 | 10 | — | 0 | Copper Complex A | 10 | 3 | 77 |
| Example 9 | P-9 | 10 | — | 0 | Copper Complex A | 10 | 3 | 77 |
| Example 10 | P-10 | 10 | — | 0 | Copper Complex A | 10 | 3 | 77 |
| Example 11 | P-11 | 10 | — | 0 | Copper Complex A | 10 | 3 | 77 |
| Example 12 | P-12 | 10 | — | 0 | Copper Complex A | 10 | 3 | 77 |
| Example 13 | P-13 | 10 | — | 0 | Copper Complex A | 10 | 3 | 77 |
| Example 14 | P-14 | 10 | — | 0 | Copper Complex A | 10 | 3 | 77 |
| Example 15 | P-15 | 10 | — | 0 | Copper Complex A | 10 | 3 | 77 |
| Example 16 | P-5 | 8 | Phenyl Trimethoxy Silane | 2 | Copper Complex A | 10 | 3 | 77 |
| Example 17 | P-5 | 8 | Decyl Trimethoxy Silane | 2 | Copper Complex A | 10 | 3 | 77 |
| Example 18 | P-5 | 8 | KBM-503 | 2 | Copper Complex A | 10 | 3 | 77 |
| Example 19 | P-5 | 8 | KR-9218 | 2 | Copper Complex A | 10 | 3 | 77 |

TABLE 1-continued

| | Compound 1 Having Partial Structure Represented by M-X | | Compound 2 Having Partial Structure Represented by M-X | | Near Infrared Ray Absorbent Composition | | Water Mass Ratio [%] | PGME Mass Ratio [%] |
|---|---|---|---|---|---|---|---|---|
| | Type | Mass Ratio [%] | Type | Mass Ratio [%] | Type | Mass Ratio [%] | | |
| Example 20 | P-5 | 8 | TC-100 | 2 | Copper Complex A | 10 | 3 | 77 |
| Example 21 | P-5 | 8 | ZC-540 | 2 | Copper Complex A | 10 | 3 | 77 |
| Example 22 | P-1 | 10 | — | 0 | Copper Complex B | 10 | 3 | 77 |
| Example 23 | P-1 | 10 | — | 0 | Copper Complex C | 10 | 3 | 77 |
| Example 24 | P-1 | 10 | — | 0 | Copper Complex D | 10 | 3 | 77 |
| Example 25 | P-1 | 19.9 | — | 0 | IR Coloring Agent A | 0.1 | 3 | 77 |
| Example 26 | P-1 | 4 | — | 0 | Copper Complex A | 16 | 3 | 77 |
| Example 27 | P-16 | 10 | — | 0 | Copper Complex A | 10 | 3 | 77 |
| Example 28 | P-17 | 10 | — | 0 | Copper Complex A | 10 | 3 | 77 |
| Example 29 | P-18 | 0 | — | 0 | Copper Complex A | 10 | 3 | 77 |
| Example 30 | P-19 | 0 | — | 0 | Copper Complex A | 10 | 3 | 77 |
| Example 31 | P-20 | 0 | — | 0 | Copper Complex A | 10 | 3 | 77 |
| Example 32 | P-21 | 0 | — | 0 | Copper Complex A | 10 | 3 | 77 |
| Example 33 | P-23 | 0 | — | 0 | Copper Complex A | 10 | 3 | 77 |
| Example 34 | P-31 | 0 | — | 0 | Copper Complex A | 10 | 3 | 77 |
| Example 35 | P-32 | 0 | — | 0 | Copper Complex A | 10 | 3 | 77 |
| Example 36 | P-33 | 10 | — | 0 | Copper Complex A | 10 | 3 | 77 |
| Example 37 | P-34 | 0 | — | 0 | Copper Complex A | 10 | 3 | 77 |
| Example 38 | P-35 | 0 | — | 0 | Copper Complex A | 10 | 3 | 77 |
| Example 39 | P-36 | 10 | — | 0 | Copper Complex A | 10 | 3 | 77 |
| Example 40 | P-37 | 10 | — | 0 | Copper Complex A | 10 | 3 | 77 |
| Example 41 | P-40 | 10 | — | 0 | Copper Complex A | 10 | 3 | 77 |
| Example 42 | P-41 | 10 | — | 0 | Copper Complex A | 10 | 3 | 77 |
| Example 43 | P-42 | 10 | — | 0 | Copper Complex A | 10 | 3 | 77 |
| Example 44 | P-43 | 10 | — | 0 | Copper Complex A | 10 | 3 | 77 |
| Example 45 | P-44 | 10 | — | 0 | Copper Complex A | 10 | 3 | 77 |
| Example 46 | P-3 | 15 | — | 0 | Copper Complex E | 5 | 3 | 77 |
| Example 47 | P-16 | 15 | — | 0 | Copper Complex E | 5 | 3 | 77 |
| Example 48 | P-19 | 15 | — | 0 | Copper Complex E | 5 | 3 | 77 |
| Example 49 | P-33 | 15 | — | 0 | Copper Complex E | 5 | 3 | 77 |
| Example 50 | P-35 | 15 | — | 0 | Copper Complex E | 5 | 3 | 77 |
| Comparative Example 1 | P-1 | 2 | — | 0 | Copper Complex A | 18 | 3 | 77 |

The compounds shown in Table 1 are as follows.

<Compound 1 Having Partial Structure Represented by M-X>

P-1 to P-44: Polymers (P-1) to (P-44) of Structural Formula Described above

<Compound 2 Having Partial Structure Represented by M-X>

KBM-503: KBM-503 (Product Name, 3-methacryloxy propyl trimethoxy silane, manufactured by Shin-Etsu Chemical Co., Ltd.)

KR-9218: KR-9218 (Product Name, a methyl phenyl-based silicone alkoxy oligomer, manufactured by Shin-Etsu Chemical Co., Ltd.)

TC-100: ORGATIX TC-100 (Product Name, titanium diisopropoxy bis(acetyl acetonate), manufactured by Matsumoto Fine Chemical Co. Ltd.)

ZC-540: ORGATIX ZC-540 (Product Name, zirconium tributoxy monoacetyl acetonate, manufactured by Matsumoto Fine Chemical Co. Ltd.)

<Near Infrared Ray Absorbent Compound>

Copper Complex A: Copper Complex Having (M-1) Described below as Ligand. A synthesis method will be described below.

Copper Complex B: Copper Complex Having Compound (A1-21) Described below as Ligand. A synthesis method will be described below.

Copper Complex C: Phthalate Monobutyl Copper, manufactured by Tokyo Chemical Industry Co., Ltd.

Copper Complex D: Copper Complex Having Compound (A2-1) Described below as Ligand. A synthesis method will be described below.

Copper Complex E: Structure Described below. Copper Complex Having Compound (A2-14) Described below as Ligand. A synthesis method will be described below.

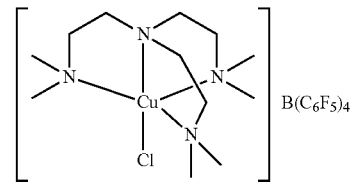

IR Coloring Agent A: Compound (A-154) Described below. A synthesis method will be described below.

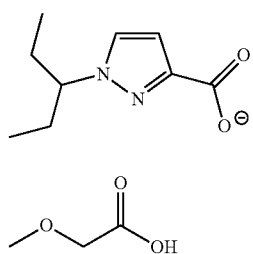

(M-1)

(A1-21)

-continued

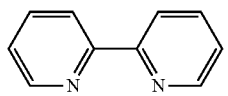
(A2-1)

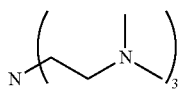
(A2-14)

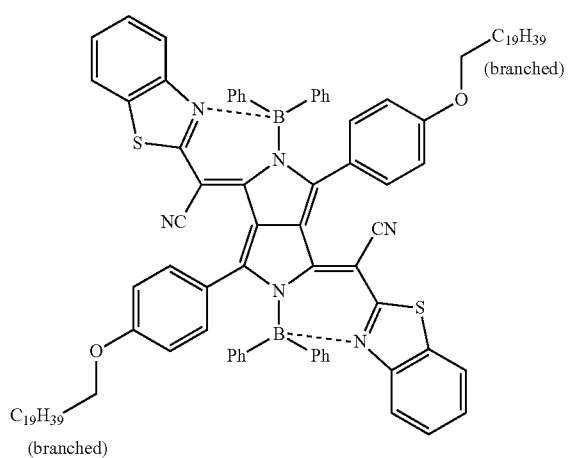
A-154

<Synthesis of Copper Complex A>

4.0 g of ethyl pyrazole-3-carboxylic acid, 11.16 g of cesium carbonate, 5.17 g of 3-bromopentanone, and 60 mL of 2,6-dimethyl-4-heptanone were added to a three-neck flask under a nitrogen atmosphere, and were heated at 150° C. for 1 hour. The mixture was cooled at a room temperature, and then, impurities were removed by filtration, and a crude product obtained by concentrating a filtrate was purified by a silica gel chromatography (Solvent: Hexane/Ethyl Acetate), and thus, 3.3 g of ethyl 1-(3-pentyl) pyrazole-3-carboxylic acid was obtained.

0.87 g of the product described above and 6 mL of ethanol were added to the flask, 0.1 g of water and 0.46 g of tert-butoxy potassium were added thereto while being stirred at a room temperature, and stirring was performed at 70° C. for 30 minutes. Cooling was performed at a room temperature, and then, a solution in which 0.52 g of a copper sulfate was dissolved in 5 mL of water was added, and was stirred at room temperature for 1 hour. The precipitated solid was filtered, and was dried under reduced pressure, and thus, 0.7 g of a copper complex A was obtained.

<Synthesis of Copper Complex B>

The compound A1-21 (886 mg, 9.84 mmol) was dissolved in 20 ml of methanol. The solution was heated to 50° C., and then, a methanol solution (160 ml) of copper hydroxide (449 mg, 4.60 mmol) was subjected to dropwise addition, and a reaction was performed at 50° C. for 2 hours. After the reaction ended, water and a solvent generated in an evaporator were distilled, and thus, a copper complex B (1.00 g) was obtained.

<Synthesis of Copper Complex D>

The compound A2-1 (0.2 g, 1.1 mmol) was dissolved in 5 ml of ethanol. The solution was heated to 70° C., and then, an ethanol solution (5 ml) of copper acetate (0.2 g, 1.1 mmol) was subjected to dropwise addition, and a reaction was performed at 70° C. for 2 hours. After the reaction ended, water and a solvent generated in an evaporator were distilled, and thus, a copper complex D (0.6 g) was obtained.

<Synthesis of Copper Complex E>

A reaction liquid which was obtained by mixing the compound (A2-14) and copper chloride (II) dihydrate (manufactured by Wako Pure Chemical Industries, Ltd.) at a molar ratio of 1:1 in methanol, and by stirring the mixture for 10 minutes was dried under reduced pressure, and thus, a solidified product was obtained. The obtained solidified product was dissolved in water, and an aqueous solution of an excessive amount of tetrakis(pentafluorophenyl) lithium borate (manufactured by Tokyo Chemical Industry Co., Ltd.) was added thereto while being stirred. The precipitated solid was collected by filtration, and thus, a copper complex E was obtained.

<Synthesis of IR Coloring Agent A>

A compound (A-154) was synthesized according to a scheme described below.

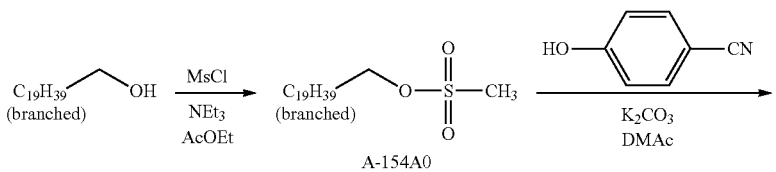

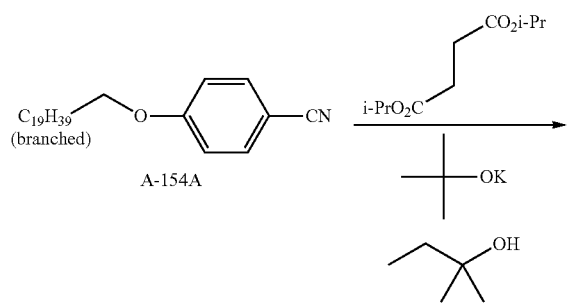

-continued

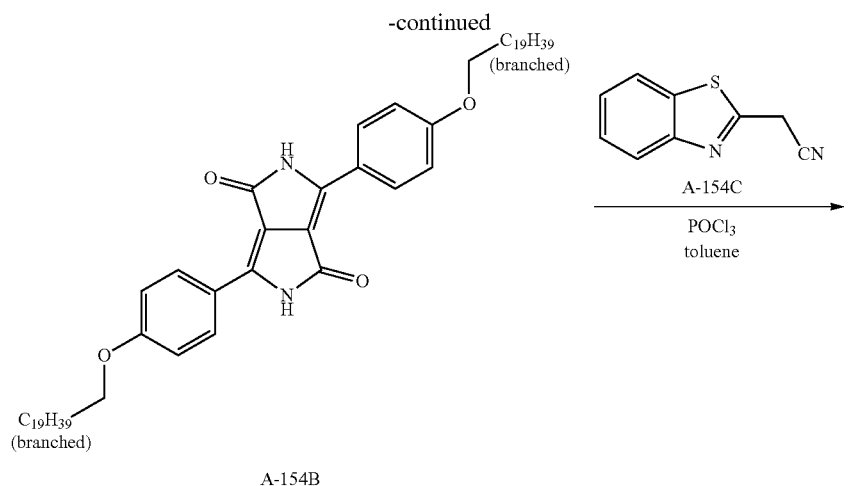

A-154B

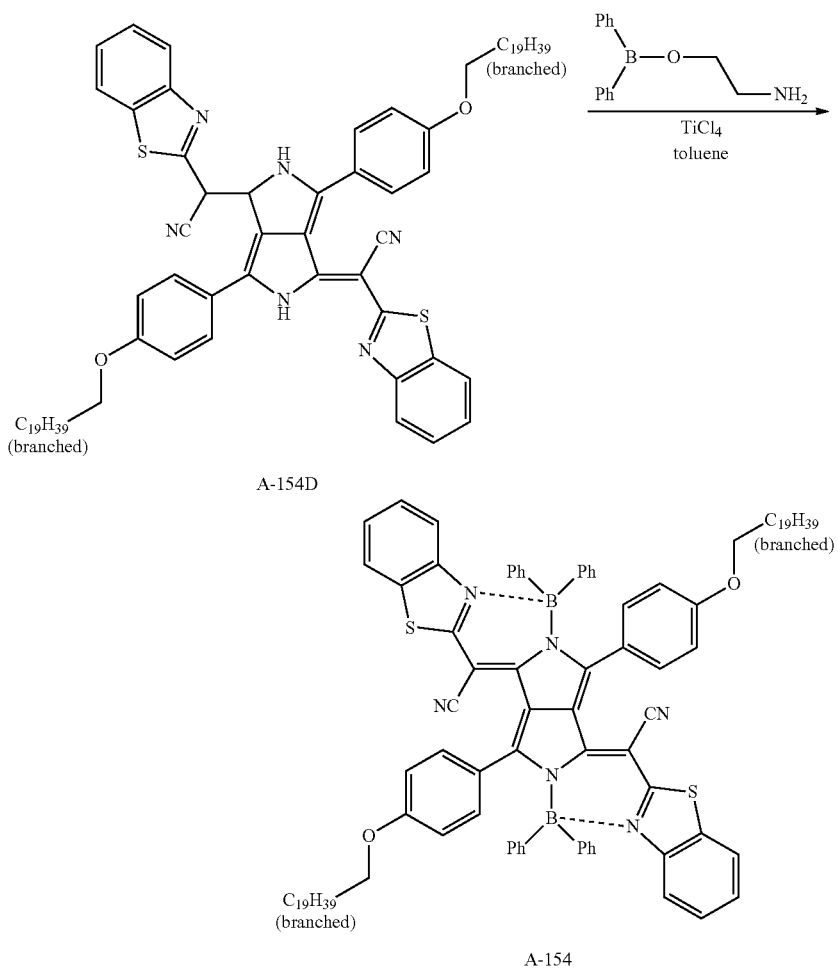

A-154D

A-154

20.0 parts by mass of isoeicosanol (FINEOXOCOL 2000, manufactured by Nissan Chemical Industries, Ltd.) and 8.13 parts by mass of triethyl amine were stirred in 40 parts by mass of ethyl acetate, and 8.44 parts by mass of methane sulfonyl chloride was subjected to dropwise addition under a temperature of −10° C. After the dropwise addition ended, a reaction was performed at 30° C. for 2 hours. An organic layer was extracted by a liquid separating operation, and a solvent was distilled under reduced pressure, and thus, 25.5 parts by mass of a pale yellow liquid (an object A-154A0) was obtained.

7.82 parts by mass of 4-cynophenol and 10.1 parts by mass of potassium carbonate were stirred in 25 parts by mass of dimethyl acetamide, 25.5 parts by mass of the synthesized object D-154A0 described above was added thereto, and a reaction was performed at 100° C. for 6 hours. An organic layer was extracted by a liquid separating operation, the organic layer was washed with an aqueous solution of sodium hydroxide, and then, a solvent was distilled under reduced pressure, and thus, 25.8 parts by mass of a pale yellow liquid (an object A-154A) was obtained.

$^1$H-NMR (CDCl3): δ 0.55-0.96 (m, 18H), 0.96-2.10 (m, 21H), 3.88 (m, 2H), 6.93 (d, 2H), 7.56 (d, 2H)

A diketopyrrolo pyrrole compound (an object A-154B) was synthesized according to a method described in the specification of U.S. Pat. No. 5,969,154A by using 13.1 parts by mass of the synthesized object A-154A described above as a raw material, and thus, 7.33 parts by mass of an orange-colored solid (the object A-154B) was obtained.

$^1$H-NMR (CDCl3): δ 0.55-0.96 (m, 36H), 0.96-2.10 (m, 42H), 3.95 (m, 4H), 7.06 (d, 4H), 8.30 (d, 4H), 8.99 (brs, 2H)

7.2 parts by mass of the object A-154B and 3.42 parts by mass of 2-(2-benzothiazolyl) acetonitrile were stirred in 30 parts by mass of toluene, 10.0 parts by mass of phosphorous oxychloride, and heating and refluxing were performed for 5 hours. An organic layer was extracted by a liquid separating operation, and was washed with an aqueous solution of sodium hydrogen carbonate, and then, a solvent was distilled under reduced pressure.

The obtained crude product was purified by a silica gel chromatography (Solvent: Chloroform), and was crystallized again by using a chloroform/acetonitrile solvent, and thus, 5.73 parts by mass of a green solid (an object A-154D) was obtained.

$^1$H-NMR (CDCl3): δ 0.55-1.00 (m, 36H), 1.00-2.10 (m, 42H), 3.97 (m, 4H), 7.11 (d, 4H), 7.28 (t, 2H), 7.43 (t, 2H), 7.67-7.75 (m, 6H), 7.80 (d, 2H), 13.16 (s, 2H)

2.53 parts by mass of diphenyl borinic acid 2-amino ethyl ester and 70 parts by mass of toluene were stirred at 40° C., 3.56 parts by mass of titanium chloride was added thereto, and a reaction was performed for 30 minutes. 5.60 parts by mass of the object A-154D was added, and heating and refluxing were performed at an external temperature of 130° C. for 1 hour. Cooling was performed to a room temperature, 80 parts by mass of methanol was added, and crystals were precipitated, and were filtered. The obtained crude crystals were purified by a silica gel chromatography (Solvent: Chloroform), and then, were crystallized again by using a toluene/methanol solvent, and thus, 3.87 parts by mass of green crystals (A-154), which are a target compound, were obtained.

λmax of A-154 was 780 nm in chloroform. A molar absorption coefficient was 2.21×105 dm$^3$/mol·cm in chloroform.

$^1$H-NMR (CDCl3): δ 0.55-1.01 (m, 36H), 1.01-2.10 (m, 42H), 3.82 (m, 4H), 6.46 (s, 8H), 6.90-7.05 (m, 6H), 7.07-7.19 (m, 12H), 7.21-7.29 (m, 8H), 7.32 (d, 2H)

<Preparation of Near Infrared Ray Cut Filter>

A near infrared ray cut filter was prepared by using the near infrared ray absorbent composition described above.

A photoresist was applied onto a glass substrate, and a partition wall of the photoresist was formed by patterning the photoresist using lithography, and thus, a dropwise addition region of the near infrared ray absorbent composition was formed. 3 ml of each near infrared ray absorbent composition was subjected to dropwise addition in the dropwise addition region on the glass substrate, and was dried by being left to stand at a room temperature for 24 hours. A film thickness of a coated film after being dried was evaluated, and the film thickness was 200 μm.

<<Evaluation of Near Infrared Ray Shielding Properties>>

The transmittance of the near infrared ray cut filter obtained as described above at a wavelength of 800 nm was measured by using a SPECTROPHOTOMETER U-4100 (manufactured by Hitachi High-Technologies Corporation). Near infrared ray shielding properties were evaluated on the basis of the following criteria. The results are shown in the following table.

A: Transmittance at 800 nm≤5%
B: 5%<Transmittance at 800 nm≤7%
C: 7%<Transmittance at 800 nm≤10%
D: 10%<Transmittance at 800 nm <<Evaluation of Visible Transmittance>>

The transmittance of the near infrared ray cut filter obtained as described above at a wavelength of 400 to 550 nm was measured by using a SPECTROPHOTOMETER U-4100 (manufactured by Hitachi High-Technologies Corporation). A visible transmittance was evaluated on the basis of the following criteria. The results are shown in the following table.

A: 95%≤Minimum Value of Transmittance at Wavelength of 400 to 550 nm
B: 90%≤Minimum Value of Transmittance at Wavelength of 400 to 550 nm<95%
C: 80%≤Minimum Value of Transmittance at Wavelength of 400 to 550 nm<90%
D: Minimum Value of Transmittance at Wavelength of 400 to 550 nm<80%

<<Evaluation of Heat Resistance>>

The near infrared ray cut filter obtained as described above was left to stand at 200° C. for 5 minutes. Each light absorbance of the near infrared ray cut filter at 800 nm before a heat resistance test and after a heat resistance test was measured, and a change rate of the light absorbances at 800 nm represented by ((Light Absorbance before Test–Light Absorbance after Test)/Light Absorbance before Test)×100(%) was obtained. Each light absorbance at 400 nm was also measured, and a change rate of the light absorbances at 400 nm represented by ((Light Absorbance after Test–Light Absorbance before Test)/Light Absorbance before Test)×100(%) was obtained. Heat resistance at each wavelength was evaluated on the basis of the following criteria. The light absorbance was measured by using a SPECTROPHOTOMETER U-4100 (manufactured by Hitachi High-Technologies Corporation).

A: Change Rate of Light Absorbances≤3%
B: 3%≤Change Rate of Light Absorbances≤6%
C: 6%≤Change Rate of Light Absorbances≤10%
D: 10%≤Change Rate of Light Absorbances <<Evaluation of Moisture Resistance>>

The near infrared ray cut filter obtained as described above was left to stand under high temperature and high humidity of 85° C./relative humidity 85% for 1 hour. The maximum light absorbance (Absλmax) of the near infrared ray cut filter at a wavelength of 700 to 1,400 nm and the minimum light absorbance (Absλmin) of the near infrared ray cut filter at a wavelength of 400 to 700 nm before a moisture resistance test and after a moisture resistance test were measured by using a SPECTROPHOTOMETER U-4100 (manufactured by Hitachi High-Technologies Corporation), and a light absorbance ratio represented by "Absλmax/Absλmin" was obtained. A change rate of the light absorbance ratio represented by |(Light Absorbance Ratio before Test–Light Absorbance Ratio after Test)/Light Absorbance Ratio before Test×100|(%) was evaluated on the basis of the following criteria.

A: Change Rate of Light Absorbance Ratio≤2%
B: 2%<Change Rate of Light Absorbance Ratio≤4%
C: 4%<Change Rate of Light Absorbance Ratio≤7%
D: 7%<Change Rate of Light Absorbance Ratio

TABLE 2

|  | Near Infrared Ray Shielding Properties | Visible Transmittance | Heat Resistance 400 nm | Heat Resistance 800 nm | Moisture Resistance |
|---|---|---|---|---|---|
| Example 1 | A | B | B | A | A |
| Example 2 | A | A | A | A | A |
| Example 3 | A | B | B | A | A |
| Example 4 | A | B | B | A | A |
| Example 5 | A | B | B | A | A |
| Example 6 | A | B | B | A | A |
| Example 7 | A | B | B | A | A |
| Example 8 | A | B | B | A | A |
| Example 9 | A | A | A | A | A |
| Example 10 | A | A | A | A | A |
| Example 11 | A | B | B | A | A |
| Example 12 | A | B | B | A | A |
| Example 13 | A | B | B | A | A |
| Example 14 | A | B | B | A | A |
| Example 15 | A | B | B | A | A |
| Example 16 | A | B | B | A | A |
| Example 17 | A | B | B | A | A |
| Example 18 | A | B | B | A | A |
| Example 19 | A | B | B | A | A |
| Example 20 | A | B | B | B | A |
| Example 21 | A | B | B | B | A |
| Example 22 | A | A | B | B | A |
| Example 23 | B | B | B | B | A |
| Example 24 | A | B | B | B | A |
| Example 25 | A | C | A | A | A |
| Example 26 | A | B | B | A | A |
| Example 27 | A | B | B | A | A |
| Example 28 | A | A | B | A | A |
| Example 29 | A | B | B | A | A |
| Example 30 | A | B | B | A | A |
| Example 31 | A | B | B | A | A |
| Example 32 | A | B | B | A | A |
| Example 33 | A | B | B | A | A |
| Example 34 | A | C | B | A | A |
| Example 35 | A | B | B | A | A |
| Example 36 | A | A | B | A | A |
| Example 37 | A | B | B | A | A |
| Example 38 | A | A | A | A | A |
| Example 39 | A | B | A | A | A |
| Example 40 | A | C | A | A | A |
| Example 41 | A | A | A | A | A |
| Example 42 | A | B | A | A | A |
| Example 43 | A | B | A | A | A |
| Example 44 | A | A | A | A | A |
| Example 45 | A | B | A | A | A |
| Example 46 | A | B | B | A | A |
| Example 47 | A | B | B | A | A |
| Example 48 | A | B | B | A | A |
| Example 49 | A | A | B | A | A |
| Example 50 | A | A | A | A | A |
| Comparative Example 1 | A | C | C | B | C |

As it is obvious from Table 2 described above, the near infrared ray absorbent composition of the present invention could form a cured film having excellent heat resistance while maintaining high near infrared ray shielding properties. In addition, the near infrared ray absorbent composition of the present invention could form a cured film having excellent moisture resistance.

In contrast, in Comparative Example 1, heat resistance and moisture resistance deteriorated.

In the near infrared ray absorbent compositions of Examples 1 to 50, even in a case where the content of the near infrared ray absorbent compound with respect to the total solid content of the composition is set to 15 mass %, 20 mass %, 30 mass %, or 40 mass %, excellent near infrared ray shielding properties can be similarly obtained.

In the near infrared ray absorbent compositions of Examples 1 to 50, even in a case where the content of water with respect to the total mass of the solvent is set to 1 mass %, 2 mass %, or 5 mass %, excellent coating properties can be obtained as with the near infrared ray absorbent compositions.

In addition, in the near infrared ray absorbent compositions of Examples 1 to 21 and 26 to 45, even in a case where the copper complex A was changed to the same amount of copper complex containing the compounds represented by (A1-1) to (A-10), (A1-12) to (A1-20), (A1-22) to (A1-36), (A2-2) to (A2-13), (A2-15), and (A3-1) to (A3-18) described above as a ligand, an excellent effect is similarly obtained.

EXPLANATION OF REFERENCES

10: camera module
11: solid image pickup element
12: planarizing layer
13: near infrared ray cut filter
14: imaging lens
15: lens holder
16: silicon substrate
17: color filter
18: micro lens
19: ultraviolet and infrared light reflection film
20: transparent substrate
21: near infrared ray absorption layer
22: antireflection layer

What is claimed is:

1. A near infrared ray absorbent composition, containing:
   a compound having a partial structure represented by M-X; and
   a near infrared ray absorbent compound,
   wherein a content of the compound having a partial structure represented by M-X is greater than or equal to 15 mass % with respect to a total solid content of the near infrared ray absorbent composition, and
   M is an atom selected from Si, Ti, Zr, and Al, X is one type selected from a hydroxy group, an alkoxy group, an acyloxy group, a phosphoryloxy group, a sulfonyloxy group, an amino group, an oxime group, and $O=C(R^a)(R^b)$, $R^a$ and $R^b$ each independently represent a monovalent organic group, and in a case in which X is $O=C(R^a)(R^b)$, X is bonded to M by an unshared electron pair of an oxygen atom of a carbonyl group.

2. The near infrared ray absorbent composition according to claim 1,
   wherein in the compound having a partial structure represented by M-X, M is Si.

3. The near infrared ray absorbent composition according to claim 1,
   wherein in the compound having a partial structure represented by M-X, X is an alkoxy group.

4. The near infrared ray absorbent composition according to claim 1,
   wherein the compound having a partial structure represented by M-X is an acrylic resin, an acrylamide resin, or a styrene resin.

5. The near infrared ray absorbent composition according to claim 1, wherein a weight-average molecular weight of the compound having a partial structure represented by M-X is 500 to 300,000.

6. The near infrared ray absorbent composition according to claim 1,
wherein the near infrared ray absorbent compound is a copper compound.

7. A near infrared ray cut filter obtained by using the near infrared ray absorbent composition according to claim 1.

8. A camera module, comprising:
a solid image pickup element; and
a near infrared ray cut filter disposed on the solid image pickup element on a light receiving side,
wherein the near infrared ray cut filter is the near infrared ray cut filter according to claim 7.

9. A manufacturing method of a near infrared ray cut filter, comprising:
applying the near infrared ray absorbent composition according to claim 1 on a solid image pickup element on a light receiving side.

10. A solid image pickup element, comprising:
a near infrared ray cut filter obtained by using the near infrared ray absorbent composition according to claim 1.

* * * * *